(12) United States Patent
Biggs et al.

(10) Patent No.: US 9,876,160 B2
(45) Date of Patent: Jan. 23, 2018

(54) ROLL-TO-ROLL MANUFACTURING PROCESSES FOR PRODUCING SELF-HEALING ELECTROACTIVE POLYMER DEVICES

(71) Applicant: Parker-Hannifin Corporation, Cleveland, OH (US)

(72) Inventors: Silmon J. Biggs, Los Gatos, CA (US); Jeremy Elsberry, Redwood City, CA (US); Andrew B. Campbell, San Jose, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 701 days.

(21) Appl. No.: 14/385,886

(22) PCT Filed: Mar. 20, 2013

(86) PCT No.: PCT/US2013/033061
§ 371 (c)(1),
(2) Date: Sep. 17, 2014

(87) PCT Pub. No.: WO2013/142552
PCT Pub. Date: Sep. 26, 2013

(65) Prior Publication Data
US 2015/0034237 A1 Feb. 5, 2015

Related U.S. Application Data

(60) Provisional application No. 61/613,530, filed on Mar. 21, 2012.

(51) Int. Cl.
*H01L 41/29* (2013.01)
*H01L 41/25* (2013.01)
(Continued)

(52) U.S. Cl.
CPC .............. *H01L 41/29* (2013.01); *B05D 1/04* (2013.01); *B05D 1/265* (2013.01); *B05D 1/28* (2013.01);
(Continued)

(58) Field of Classification Search
CPC ... H01L 41/047; H01L 41/0478; H01L 41/45; H01L 41/0536; H01L 41/0986;
(Continued)

(56) References Cited

U.S. PATENT DOCUMENTS 2,430,013 A  11/1947  Hansell
2,967,914 A   1/1961  Pye
(Continued)

FOREIGN PATENT DOCUMENTS

CA  2329804 A1  11/1999
CA  2330384 A1  11/1999
(Continued)

OTHER PUBLICATIONS

International Search Report for PCT/US2013/033061, dated Jun. 28, 2013 (5 pages).
(Continued)

*Primary Examiner* — Vishal I Patel
(74) *Attorney, Agent, or Firm* — K&L Gates LLP

(57) ABSTRACT

A process for producing a corrugated electrode for use in an electroactive polymer cartridge is disclosed. A laminated web comprising a support sheet laminated to a dielectric elastomer film is positioned. The support sheet defines areas exposing portions of the dielectric elastomer film. A force is applied to the positioned laminated web to stretch the laminated support sheet-dielectric elastomer film web in a direction that is orthogonal to a plane defined by the web. An electrically conductive material is applied to the laminated support sheet-dielectric elastomer film web while the lami- (Continued)

nated support sheet-dielectric elastomer film web is in a stretched state. The laminated support sheet-dielectric elastomer film web is relaxed to form the corrugated electrode on the dielectric elastomer film portion of the web.

23 Claims, 21 Drawing Sheets

(51) Int. Cl.
| | |
|---|---|
| H01L 41/253 | (2013.01) |
| B05D 1/04 | (2006.01) |
| B05D 1/26 | (2006.01) |
| B05D 1/28 | (2006.01) |
| B05D 1/30 | (2006.01) |
| B05D 1/32 | (2006.01) |
| B32B 37/24 | (2006.01) |
| B32B 38/00 | (2006.01) |
| B32B 43/00 | (2006.01) |
| C23C 14/34 | (2006.01) |
| C23C 16/44 | (2006.01) |
| H01L 41/047 | (2006.01) |
| H01L 41/193 | (2006.01) |
| H01L 41/45 | (2013.01) |
| H01L 41/053 | (2006.01) |
| H01L 41/09 | (2006.01) |

(52) U.S. Cl.
CPC .............. *B05D 1/305* (2013.01); *B05D 1/32* (2013.01); *B32B 37/24* (2013.01); *B32B 38/0012* (2013.01); *B32B 43/006* (2013.01); *C23C 14/34* (2013.01); *C23C 16/44* (2013.01); *H01L 41/047* (2013.01); *H01L 41/0478* (2013.01); *H01L 41/193* (2013.01); *H01L 41/25* (2013.01); *H01L 41/253* (2013.01); *B32B 2037/243* (2013.01); *B32B 2037/246* (2013.01); *B32B 2038/0028* (2013.01); *B32B 2307/204* (2013.01); *B32B 2457/00* (2013.01); *H01L 41/0536* (2013.01); *H01L 41/0986* (2013.01); *H01L 41/45* (2013.01); *Y10T 156/1195* (2015.01)

(58) Field of Classification Search
CPC ....... H01L 41/25; H01L 41/253; H01L 41/29; H01L 41/193; C23C 14/34; C23C 16/44; B32B 2457/00; B32B 2307/204; B32B 2038/0028; B32B 2037/246; B32B 2037/243; B32B 43/006; B32B 38/0012; B32B 37/24; B05D 1/32; B05D 1/305; B05D 1/28; B05D 1/265; B05D 1/04; Y10T 156/1195
See application file for complete search history.

(56) References Cited

U.S. PATENT DOCUMENTS

| | | | |
|---|---|---|---|
| 3,050,034 A | 8/1962 | Benton |
| 3,056,932 A | 10/1962 | Wood |
| 3,303,750 A | 2/1967 | Powell |
| 3,304,773 A | 2/1967 | Rogallo |
| 3,400,281 A | 9/1968 | Malik |
| 3,403,234 A | 9/1968 | Barnes, Jr. et al. |
| 3,463,942 A | 8/1969 | Mellon |
| 3,509,714 A | 5/1970 | Walton |
| 3,516,846 A | 6/1970 | Matson |
| 3,539,841 A | 11/1970 | Riff |
| 3,558,936 A | 1/1971 | Horan |
| 3,606,241 A | 9/1971 | Bornholdt |
| 3,699,963 A | 10/1972 | Zaffaroni |
| 3,783,480 A | 1/1974 | Booe |
| 3,798,473 A | 3/1974 | Murayama et al. |
| 3,801,839 A | 4/1974 | Yo |
| 3,816,774 A | 6/1974 | Ohnuki et al. |
| 3,821,967 A | 7/1974 | Sturman et al. |
| 3,832,580 A | 8/1974 | Yamamuro et al. |
| 3,851,363 A | 12/1974 | Booe |
| 3,903,733 A | 9/1975 | Murayama et al. |
| 3,935,485 A | 1/1976 | Yoshida et al. |
| 3,940,637 A | 2/1976 | Ohigashi et al. |
| 3,943,614 A | 3/1976 | Yoshikawa et al. |
| 3,947,644 A | 3/1976 | Uchikawa |
| 3,965,757 A | 6/1976 | Barrus |
| 4,011,474 A | 3/1977 | O'Neill |
| 4,028,566 A | 6/1977 | Franssen et al. |
| 4,051,395 A | 9/1977 | Taylor |
| 4,056,742 A | 11/1977 | Tibbetts |
| 4,088,915 A | 5/1978 | Kodama |
| 4,089,927 A | 5/1978 | Taylor |
| 4,127,749 A | 11/1978 | Atoji et al. |
| 4,140,936 A | 2/1979 | Bullock |
| 4,155,950 A | 5/1979 | Berezuk et al. |
| 4,158,787 A | 6/1979 | Forward |
| 4,170,742 A | 10/1979 | Itagaki et al. |
| 4,190,336 A | 2/1980 | Frank et al. |
| 4,216,403 A | 8/1980 | Krempl et al. |
| 4,227,347 A | 10/1980 | Tam |
| 4,234,813 A | 11/1980 | Iguchi et al. |
| 4,236,416 A | 12/1980 | Barcita |
| 4,240,535 A | 12/1980 | Pierce et al. |
| 4,245,815 A | 1/1981 | Willis |
| 4,257,594 A | 3/1981 | Conrey et al. |
| 4,266,339 A | 5/1981 | Kalt |
| 4,283,461 A | 8/1981 | Wooden et al. |
| 4,283,649 A | 8/1981 | Heinouchi |
| 4,284,921 A | 8/1981 | Lemonon et al. |
| 4,290,983 A | 9/1981 | Sasaki et al. |
| 4,297,394 A | 10/1981 | Wooden et al. |
| 4,315,433 A | 2/1982 | Edelman et al. |
| 4,322,877 A | 4/1982 | Taylor |
| 4,326,762 A | 4/1982 | Hockenbrock et al. |
| 4,330,730 A | 5/1982 | Kurz et al. |
| 4,342,936 A | 8/1982 | Marcus et al. |
| 4,344,743 A | 8/1982 | Bessman et al. |
| 4,346,505 A | 8/1982 | Lemonon et al. |
| 4,363,991 A | 12/1982 | Edelman |
| 4,373,525 A | 2/1983 | Kobayashi |
| 4,376,302 A | 3/1983 | Miller |
| 4,384,394 A | 5/1983 | Lemonon et al. |
| 4,387,318 A | 6/1983 | Kolm et al. |
| 4,400,634 A | 8/1983 | Micheron |
| 4,401,911 A | 8/1983 | Ravinet et al. |
| 4,404,490 A | 9/1983 | Taylor et al. |
| 4,413,202 A | 11/1983 | Krempl et al. |
| 4,433,359 A | 2/1984 | Hamabe et al. |
| 4,434,452 A | 2/1984 | Hamabe et al. |
| 4,435,667 A | 3/1984 | Kolm et al. |
| 4,442,372 A | 4/1984 | Roberts |
| 4,455,181 A | 6/1984 | Lifshin |
| 4,469,920 A | 9/1984 | Murphy |
| 4,469,978 A | 9/1984 | Hamada et al. |
| 4,472,255 A | 9/1984 | Millington et al. |
| 4,473,806 A | 9/1984 | Johnston |
| 4,500,377 A | 2/1985 | Broussoux et al. |
| 4,518,555 A | 5/1985 | Ravinet et al. |
| 4,561,830 A | 12/1985 | Bradley |
| 4,566,135 A | 1/1986 | Schmidt |
| 4,588,998 A | 5/1986 | Yamamuro et al. |
| 4,592,383 A | 6/1986 | Rikuta |
| 4,594,058 A | 6/1986 | Fischell |
| 4,595,338 A | 6/1986 | Kolm et al. |
| 4,598,338 A | 7/1986 | Van Devender et al. |
| 4,605,167 A | 8/1986 | Maehara |
| 4,626,730 A | 12/1986 | Hubbard, Jr. |
| 4,638,207 A | 1/1987 | Radice |
| 4,654,554 A | 3/1987 | Kishi |
| 4,668,449 A | 5/1987 | Soni et al. |
| 4,671,792 A | 6/1987 | Borsanyi |
| 4,678,955 A | 7/1987 | Toda |

(56) References Cited

U.S. PATENT DOCUMENTS

| | | |
|---|---|---|
| 4,686,440 A | 8/1987 | Hatamura et al. |
| 4,689,614 A | 8/1987 | Strachan |
| 4,704,369 A | 11/1987 | Nath et al. |
| 4,704,556 A | 11/1987 | Kay |
| 4,715,396 A | 12/1987 | Fox |
| 4,728,265 A | 3/1988 | Cannon |
| 4,733,121 A | 3/1988 | Hebert |
| 4,748,366 A | 5/1988 | Taylor |
| 4,762,733 A | 8/1988 | Thiel et al. |
| 4,783,888 A | 11/1988 | Fujii et al. |
| 4,784,479 A | 11/1988 | Ikemori |
| 4,785,837 A | 11/1988 | Hansen et al. |
| 4,786,837 A | 11/1988 | Kalnin et al. |
| 4,787,411 A | 11/1988 | Moldenhauer |
| 4,793,588 A | 12/1988 | Laverty, Jr. |
| 4,803,671 A | 2/1989 | Rochling et al. |
| 4,808,084 A | 2/1989 | Tsubouchi et al. |
| 4,814,661 A | 3/1989 | Ratzlaff et al. |
| 4,820,236 A | 4/1989 | Berliner et al. |
| 4,824,107 A | 4/1989 | French |
| 4,825,116 A | 4/1989 | Itoh et al. |
| 4,833,659 A | 5/1989 | Geil et al. |
| 4,835,747 A | 5/1989 | Billet |
| 4,839,872 A | 6/1989 | Gragnolati et al. |
| 4,843,275 A | 6/1989 | Radice |
| 4,849,668 A | 7/1989 | Crawley et al. |
| 4,868,447 A | 9/1989 | Lee et al. |
| 4,869,282 A | 9/1989 | Sittler et al. |
| 4,870,868 A | 10/1989 | Gastgeb et al. |
| 4,877,957 A | 10/1989 | Okada et al. |
| 4,877,988 A | 10/1989 | McGinniss et al. |
| 4,879,698 A | 11/1989 | Langberg |
| 4,885,783 A | 12/1989 | Whitehead et al. |
| 4,885,830 A | 12/1989 | Ohtaka |
| 4,904,222 A | 2/1990 | Gastgeb et al. |
| 4,906,886 A | 3/1990 | Breimesser et al. |
| 4,911,057 A | 3/1990 | Fishman |
| 4,911,995 A | 3/1990 | Belanger et al. |
| 4,958,100 A | 9/1990 | Crawley et al. |
| 4,961,956 A | 10/1990 | Simopoulos et al. |
| 4,969,197 A | 11/1990 | Takaya |
| 4,971,287 A | 11/1990 | Shaw |
| 4,980,597 A | 12/1990 | Iwao |
| 4,989,951 A | 2/1991 | Miyano et al. |
| 5,024,872 A | 6/1991 | Wilson et al. |
| RE33,651 E | 7/1991 | Blonder et al. |
| 5,030,874 A | 7/1991 | Saito et al. |
| 5,048,791 A | 9/1991 | Ellison et al. |
| 5,057,372 A | 10/1991 | Imfeld |
| 5,065,067 A | 11/1991 | Todd et al. |
| 5,076,538 A | 12/1991 | Mohr et al. |
| 5,085,401 A | 2/1992 | Botting et al. |
| 5,090,246 A | 2/1992 | Colla et al. |
| 5,090,794 A | 2/1992 | Hatano et al. |
| 5,100,100 A | 3/1992 | Benson et al. |
| 5,103,211 A | 4/1992 | Daoud et al. |
| 5,104,707 A | 4/1992 | Watanabe et al. |
| 5,119,840 A | 6/1992 | Shibata |
| 5,132,582 A | 7/1992 | Hayashi et al. |
| 5,142,510 A | 8/1992 | Rodda |
| 5,148,735 A | 9/1992 | Veletovac |
| 5,149,514 A | 9/1992 | Sanjurjo |
| 5,153,820 A | 10/1992 | MacFarlane et al. |
| 5,153,859 A | 10/1992 | Chatigny et al. |
| 5,156,885 A | 10/1992 | Budd |
| 5,170,089 A | 12/1992 | Fulton |
| 5,171,734 A | 12/1992 | Sanjurjo et al. |
| 5,172,024 A | 12/1992 | Broussoux et al. |
| 5,188,447 A | 2/1993 | Chiang et al. |
| 5,192,197 A | 3/1993 | Culp |
| 5,199,641 A | 4/1993 | Hohm et al. |
| 5,206,557 A | 4/1993 | Bobbio |
| 5,217,355 A | 6/1993 | Hyman et al. |
| 5,229,979 A | 7/1993 | Scheinbeim et al. |
| 5,232,196 A | 8/1993 | Hutchings et al. |
| 5,240,004 A | 8/1993 | Walinsky et al. |
| 5,244,707 A | 9/1993 | Shores |
| 5,250,784 A | 10/1993 | Muller et al. |
| 5,254,296 A | 10/1993 | Perlman |
| 5,256,474 A | 10/1993 | Johnston |
| 5,258,201 A | 11/1993 | Munn et al. |
| 5,281,885 A | 1/1994 | Watanabe et al. |
| 5,288,551 A | 2/1994 | Sato et al. |
| 5,291,335 A | 3/1994 | Ogino |
| 5,302,318 A | 4/1994 | Dutta et al. |
| 5,305,178 A | 4/1994 | Binder et al. |
| 5,321,332 A | 6/1994 | Toda |
| 5,322,975 A | 6/1994 | Nagy et al. |
| 5,350,966 A | 9/1994 | Culp |
| 5,352,574 A | 10/1994 | Guiseppi-Elie |
| 5,356,500 A | 10/1994 | Scheinbeim et al. |
| 5,361,240 A | 11/1994 | Pearce |
| 5,368,704 A | 11/1994 | Madou et al. |
| 5,369,995 A | 12/1994 | Scheinbeim |
| 5,377,258 A | 12/1994 | Bro |
| 5,380,396 A | 1/1995 | Shikida et al. |
| 5,410,210 A | 4/1995 | Sato et al. |
| 5,417,235 A | 5/1995 | Wise et al. |
| 5,424,596 A | 6/1995 | Mendenhall et al. |
| 5,428,523 A | 6/1995 | McDonnal |
| 5,430,565 A | 7/1995 | Yamanouchi et al. |
| 5,438,553 A | 8/1995 | Wilson et al. |
| 5,440,194 A | 8/1995 | Beurrier |
| 5,452,878 A | 9/1995 | Gravesen et al. |
| 5,481,152 A | 1/1996 | Buschulte |
| 5,488,872 A | 2/1996 | McCormick |
| 5,493,372 A | 2/1996 | Mashtare et al. |
| 5,495,137 A | 2/1996 | Park et al. |
| 5,499,127 A | 3/1996 | Tsubota et al. |
| 5,500,635 A | 3/1996 | Mott |
| 5,504,388 A | 4/1996 | Kimura et al. |
| 5,509,888 A | 4/1996 | Miller |
| 5,515,341 A | 5/1996 | Toda et al. |
| 5,548,177 A | 8/1996 | Carroll |
| 5,559,387 A | 9/1996 | Beurrier |
| 5,563,466 A | 10/1996 | Rennex et al. |
| 5,571,148 A | 11/1996 | Loeb et al. |
| 5,578,889 A | 11/1996 | Epstein |
| 5,589,725 A | 12/1996 | Haertling |
| 5,591,986 A | 1/1997 | Niigaki et al. |
| 5,593,462 A | 1/1997 | Gueguen et al. |
| 5,630,709 A | 5/1997 | Bar-Cohen |
| 5,632,841 A | 5/1997 | Hellbaum et al. |
| 5,636,072 A | 6/1997 | Shibata et al. |
| 5,636,100 A | 6/1997 | Zheng et al. |
| 5,637,421 A | 6/1997 | Poehler et al. |
| 5,642,015 A | 6/1997 | Whitehead et al. |
| 5,647,245 A | 7/1997 | Takei |
| 5,668,703 A | 9/1997 | Rossi et al. |
| 5,674,596 A | 10/1997 | Johnston |
| 5,678,571 A | 10/1997 | Brown |
| 5,682,075 A | 10/1997 | Bolleman et al. |
| 5,684,637 A | 11/1997 | Floyd |
| 5,696,663 A | 12/1997 | Unami et al. |
| 5,703,295 A | 12/1997 | Ishida et al. |
| 5,717,563 A | 2/1998 | MacDougall et al. |
| 5,722,418 A | 3/1998 | Bro |
| 5,744,908 A | 4/1998 | Kyushima |
| 5,751,090 A | 5/1998 | Henderson |
| 5,755,909 A | 5/1998 | Gailus |
| 5,761,782 A | 6/1998 | Sager |
| 5,766,934 A | 6/1998 | Guiseppi-Elie |
| 5,777,540 A | 7/1998 | Dedert et al. |
| 5,788,468 A | 8/1998 | Dewa et al. |
| 5,798,600 A | 8/1998 | Sager et al. |
| 5,800,421 A | 9/1998 | Lemelson |
| 5,801,475 A | 9/1998 | Kimura |
| 5,814,921 A | 9/1998 | Carroll |
| 5,828,157 A | 10/1998 | Miki et al. |
| 5,831,371 A | 11/1998 | Bishop |
| 5,835,453 A | 11/1998 | Wynne et al. |
| 5,847,690 A | 12/1998 | Boie et al. |
| 5,857,694 A | 1/1999 | Lazarus et al. |
| 5,876,675 A | 3/1999 | Kennedy |

(56) References Cited

U.S. PATENT DOCUMENTS

| | | |
|---|---|---|
| 5,883,466 A | 3/1999 | Suyama et al. |
| 5,889,354 A | 3/1999 | Sager |
| 5,892,314 A | 4/1999 | Sager et al. |
| 5,896,287 A | 4/1999 | Mihara et al. |
| 5,897,097 A | 4/1999 | Biegelsen et al. |
| 5,900,572 A | 5/1999 | Aeroe |
| 5,902,836 A | 5/1999 | Bennett et al. |
| 5,910,107 A | 6/1999 | Iliff |
| 5,912,499 A | 6/1999 | Diem et al. |
| 5,913,310 A | 6/1999 | Brown |
| 5,914,901 A | 6/1999 | Pascucci |
| 5,915,377 A | 6/1999 | Coffee |
| 5,918,502 A | 7/1999 | Bishop |
| 5,928,262 A | 7/1999 | Harber |
| 5,928,547 A | 7/1999 | Shea et al. |
| 5,933,170 A | 8/1999 | Takeuchi et al. |
| 5,961,298 A | 10/1999 | Bar-Cohen et al. |
| 5,964,583 A | 10/1999 | Danby |
| 5,971,355 A | 10/1999 | Biegelsen et al. |
| 5,977,685 A | 11/1999 | Kurita et al. |
| 5,984,760 A | 11/1999 | Marine |
| 5,988,902 A | 11/1999 | Holehan |
| 6,012,961 A | 1/2000 | Sharpe, III et al. |
| 6,037,707 A | 3/2000 | Gailus et al. |
| 6,040,356 A | 3/2000 | Kanki et al. |
| 6,048,276 A | 4/2000 | Vandergrift |
| 6,048,622 A | 4/2000 | Hagood, IV et al. |
| 6,055,859 A | 5/2000 | Kozuka et al. |
| 6,059,546 A | 5/2000 | Brenan et al. |
| 6,060,811 A | 5/2000 | Fox et al. |
| 6,069,420 A | 5/2000 | Mizzi et al. |
| 6,074,178 A | 6/2000 | Bishop et al. |
| 6,074,179 A | 6/2000 | Jokela et al. |
| 6,075,504 A | 6/2000 | Stoller |
| 6,078,126 A | 6/2000 | Rollins et al. |
| 6,084,321 A | 7/2000 | Hunter et al. |
| 6,089,701 A | 7/2000 | Hashizume et al. |
| 6,093,078 A | 7/2000 | Cook |
| 6,093,995 A | 7/2000 | Lazarus et al. |
| 6,094,988 A | 8/2000 | Aindow |
| 6,097,821 A | 8/2000 | Yokoyama et al. |
| 6,108,275 A | 8/2000 | Hughes et al. |
| 6,111,743 A | 8/2000 | Lavene |
| 6,117,396 A | 9/2000 | Demers |
| 6,130,510 A | 10/2000 | Kurihara et al. |
| 6,133,398 A | 10/2000 | Bhat et al. |
| 6,140,131 A | 10/2000 | Sunakawa et al. |
| 6,140,740 A | 10/2000 | Porat et al. |
| 6,140,746 A | 10/2000 | Miyashita et al. |
| 6,148,842 A | 11/2000 | Kappel et al. |
| 6,156,842 A | 12/2000 | Hoenig et al. |
| 6,157,528 A | 12/2000 | Anthony |
| 6,161,966 A | 12/2000 | Chang et al. |
| 6,165,126 A | 12/2000 | Merzenich et al. |
| 6,168,133 B1 | 1/2001 | Heinz et al. |
| 6,181,351 B1 | 1/2001 | Merrill et al. |
| 6,184,044 B1 | 2/2001 | Sone et al. |
| 6,184,608 B1 | 2/2001 | Cabuz et al. |
| 6,184,609 B1 | 2/2001 | Johansson et al. |
| 6,184,844 B1 | 2/2001 | Filipovic et al. |
| 6,190,805 B1 | 2/2001 | Takeuchi et al. |
| 6,194,815 B1 | 2/2001 | Carroll |
| 6,196,935 B1 | 3/2001 | Spangler et al. |
| 6,198,203 B1 | 3/2001 | Hotomi |
| 6,198,204 B1 | 3/2001 | Pottenger |
| 6,201,398 B1 | 3/2001 | Takada |
| 6,210,827 B1 | 4/2001 | Dopp et al. |
| 6,228,533 B1 | 5/2001 | Ohashi et al. |
| 6,232,702 B1 | 5/2001 | Newnham et al. |
| 6,239,535 B1 | 5/2001 | Toda et al. |
| 6,239,536 B1 | 5/2001 | Lakin |
| 6,240,814 B1 | 6/2001 | Boyd et al. |
| 6,248,262 B1 | 6/2001 | Kubotera et al. |
| 6,249,076 B1 | 6/2001 | Madden et al. |
| 6,252,221 B1 | 6/2001 | Kaneko et al. |
| 6,252,334 B1 | 6/2001 | Nye et al. |
| 6,252,336 B1 | 6/2001 | Hall |
| 6,255,758 B1 | 7/2001 | Cabuz et al. |
| 6,262,516 B1 | 7/2001 | Fukuda et al. |
| 6,268,219 B1 | 7/2001 | McBride et al. |
| 6,282,074 B1 | 8/2001 | Anthony |
| 6,284,396 B1 | 9/2001 | Kaule |
| 6,284,435 B1 | 9/2001 | Cao |
| 6,286,961 B1 | 9/2001 | Ogawa |
| 6,291,155 B1 | 9/2001 | Raguse et al. |
| 6,291,928 B1 | 9/2001 | Lazarus et al. |
| 6,294,859 B1 | 9/2001 | Jaenker |
| 6,297,579 B1 | 10/2001 | Martin et al. |
| 6,311,950 B1 | 11/2001 | Kappel et al. |
| 6,316,084 B1 | 11/2001 | Claus et al. |
| 6,321,428 B1 | 11/2001 | Toda et al. |
| 6,330,463 B1 | 12/2001 | Hedrich |
| 6,333,595 B1 | 12/2001 | Horikawa et al. |
| 6,334,673 B1 | 1/2002 | Kitahara et al. |
| 6,336,367 B1 | 1/2002 | Raeisaenen |
| 6,336,880 B1 | 1/2002 | Agner |
| 6,339,527 B1 | 1/2002 | Farooq et al. |
| 6,343,129 B1 | 1/2002 | Pelrine et al. |
| 6,345,840 B1 | 2/2002 | Meyer et al. |
| 6,349,141 B1 | 2/2002 | Corsaro |
| 6,355,185 B1 | 3/2002 | Kubota |
| 6,358,021 B1 | 3/2002 | Cabuz |
| 6,359,370 B1 | 3/2002 | Chang |
| 6,366,193 B2 | 4/2002 | Duggal et al. |
| 6,369,954 B1 | 4/2002 | Berge et al. |
| 6,375,857 B1 | 4/2002 | Ng et al. |
| 6,376,971 B1 | 4/2002 | Pelrine et al. |
| 6,377,383 B1 | 4/2002 | Whitehead et al. |
| 6,379,393 B1 | 4/2002 | Marvroidis et al. |
| 6,379,809 B1 | 4/2002 | Simpson et al. |
| 6,385,021 B1 | 5/2002 | Takeda et al. |
| 6,385,429 B1 | 5/2002 | Weber et al. |
| 6,388,043 B1 | 5/2002 | Langer et al. |
| 6,388,553 B1 | 5/2002 | Shea et al. |
| 6,388,856 B1 | 5/2002 | Anthony |
| 6,400,065 B1 | 6/2002 | Toda et al. |
| 6,404,107 B1 | 6/2002 | Lazarus et al. |
| 6,411,009 B2 | 6/2002 | Jaenker |
| 6,411,013 B1 | 6/2002 | Horning |
| 6,424,079 B1 | 7/2002 | Carroll |
| 6,429,573 B2 | 8/2002 | Koopmann et al. |
| 6,429,576 B1 | 8/2002 | Simes |
| 6,433,689 B1 | 8/2002 | Hovind et al. |
| 6,434,245 B1 | 8/2002 | Zimmermann |
| 6,435,840 B1 | 8/2002 | Sharma et al. |
| 6,436,531 B1 | 8/2002 | Kollaja et al. |
| 6,437,489 B1 | 8/2002 | Shinke et al. |
| 6,457,697 B1 | 10/2002 | Kolze |
| 6,459,088 B1 | 10/2002 | Yasuda et al. |
| 6,471,185 B2 | 10/2002 | Lewin et al. |
| 6,475,931 B2 | 11/2002 | Bower et al. |
| 6,486,589 B1 | 11/2002 | Dujari et al. |
| 6,492,762 B1 | 12/2002 | Pant et al. |
| 6,495,945 B2 | 12/2002 | Yamaguchi et al. |
| 6,499,509 B2 | 12/2002 | Berger et al. |
| 6,502,803 B1 | 1/2003 | Mattes |
| 6,504,286 B1 | 1/2003 | Porat et al. |
| 6,509,802 B2 | 1/2003 | Kasperkovitz |
| 6,514,237 B1 | 2/2003 | Maseda |
| 6,522,516 B2 | 2/2003 | Anthony |
| 6,523,560 B1 | 2/2003 | Williams et al. |
| 6,524,675 B1 | 2/2003 | Mikami et al. |
| 6,528,925 B1 | 3/2003 | Takeuchi et al. |
| 6,528,928 B1 | 3/2003 | Burns et al. |
| 6,530,266 B1 | 3/2003 | Adderton et al. |
| 6,532,145 B1 | 3/2003 | Carlen et al. |
| 6,540,893 B1 | 4/2003 | Wakida et al. |
| 6,543,110 B1 | 4/2003 | Pelrine et al. |
| 6,544,664 B1 | 4/2003 | Takahashi |
| 6,545,384 B1 | 4/2003 | Pelrine et al. |
| 6,562,513 B1 | 5/2003 | Takeuchi et al. |
| 6,583,533 B2 | 6/2003 | Pelrine et al. |
| 6,586,859 B2 | 7/2003 | Kornbluh et al. |
| 6,590,267 B1 | 7/2003 | Goodwin-Johansson et al. |

(56) References Cited

U.S. PATENT DOCUMENTS

| | | |
|---|---|---|
| 6,593,155 B2 | 7/2003 | Mohler et al. |
| 6,617,759 B1 | 9/2003 | Zumeris et al. |
| 6,617,765 B1 | 9/2003 | Lagier et al. |
| 6,619,799 B1 | 9/2003 | Blum et al. |
| 6,628,040 B2 | 9/2003 | Pelrine et al. |
| 6,631,068 B1 | 10/2003 | Lobo |
| 6,637,276 B2 | 10/2003 | Adderton et al. |
| 6,640,402 B1 | 11/2003 | Vooren et al. |
| 6,644,027 B1 | 11/2003 | Kelly |
| 6,646,077 B1 | 11/2003 | Lyons |
| 6,650,455 B2 | 11/2003 | Miles |
| 6,652,938 B1 | 11/2003 | Nishikawa et al. |
| 6,654,004 B2 | 11/2003 | Hoggarth |
| 6,664,718 B2 | 12/2003 | Pelrine et al. |
| 6,668,109 B2 | 12/2003 | Nahum et al. |
| 6,673,533 B1 | 1/2004 | Wohlstadter et al. |
| 6,680,825 B1 | 1/2004 | Murphy et al. |
| 6,682,500 B2 | 1/2004 | Soltanpour et al. |
| 6,685,442 B2 | 2/2004 | Chinn et al. |
| 6,690,101 B2 | 2/2004 | Magnussen et al. |
| 6,700,314 B2 | 3/2004 | Cuhat et al. |
| 6,701,296 B1 | 3/2004 | Kramer et al. |
| 6,702,916 B2 | 3/2004 | Smith |
| 6,707,236 B2 | 3/2004 | Pelrine et al. |
| 6,720,710 B1 | 4/2004 | Wenzel et al. |
| 6,733,130 B2 | 5/2004 | Blum et al. |
| 6,743,273 B2 | 6/2004 | Chung et al. |
| 6,762,050 B2 | 7/2004 | Fukushima et al. |
| 6,768,246 B2 | 7/2004 | Pelrine et al. |
| 6,781,284 B1 | 8/2004 | Pelrine et al. |
| 6,784,227 B2 | 8/2004 | Simon et al. |
| 6,791,205 B2 | 9/2004 | Woodbridge |
| 6,796,639 B2 | 9/2004 | Sugahara |
| 6,800,155 B2 | 10/2004 | Senecal et al. |
| 6,804,068 B2 | 10/2004 | Sasaki et al. |
| 6,806,621 B2 | 10/2004 | Heim et al. |
| 6,806,806 B2 | 10/2004 | Anthony |
| 6,806,808 B1 | 10/2004 | Watters et al. |
| 6,807,729 B2 | 10/2004 | Kawashima et al. |
| 6,809,462 B2 | 10/2004 | Pelrine et al. |
| 6,809,928 B2 | 10/2004 | Gwin et al. |
| 6,812,624 B1 | 11/2004 | Pei et al. |
| 6,824,689 B2 | 11/2004 | Wang et al. |
| 6,847,153 B1 | 1/2005 | Balizer |
| 6,847,155 B2 | 1/2005 | Schwartz et al. |
| 6,856,305 B2 | 2/2005 | Nagano |
| 6,864,592 B1 | 3/2005 | Kelly |
| 6,866,242 B2 | 3/2005 | Hirota |
| 6,867,533 B1 | 3/2005 | Su et al. |
| 6,869,275 B2 | 3/2005 | Dante et al. |
| 6,876,125 B2 | 4/2005 | Basheer et al. |
| 6,876,135 B2 | 4/2005 | Pelrine et al. |
| 6,879,318 B1 | 4/2005 | Chan et al. |
| 6,882,086 B2 | 4/2005 | Kornbluh et al. |
| 6,891,317 B2 | 5/2005 | Pei et al. |
| 6,902,048 B1 | 6/2005 | Chung |
| 6,911,764 B2 | 6/2005 | Pelrine et al. |
| 6,935,287 B2 | 8/2005 | Shinogle |
| 6,938,945 B2 | 9/2005 | Wald et al. |
| 6,940,211 B2 | 9/2005 | Pelrine et al. |
| 6,940,212 B2 | 9/2005 | Mueller |
| 6,940,221 B2 | 9/2005 | Matsukiyo et al. |
| 6,944,931 B2 | 9/2005 | Shcheglov et al. |
| 6,952,313 B2 | 10/2005 | Schrader |
| 6,967,430 B2 | 11/2005 | Johansson |
| 6,994,314 B2 | 2/2006 | Garnier et al. |
| 6,997,870 B2 | 2/2006 | Couvillon, Jr. |
| 7,008,838 B1 | 3/2006 | Hosking et al. |
| 7,011,378 B2 | 3/2006 | Maluf et al. |
| 7,011,760 B2 | 3/2006 | Wang et al. |
| 7,029,056 B2 | 4/2006 | Browne et al. |
| 7,034,432 B1 | 4/2006 | Pelrine et al. |
| 7,037,270 B2 | 5/2006 | Seward |
| 7,038,357 B2 | 5/2006 | Goldenberg et al. |
| 7,049,732 B2 | 5/2006 | Pei et al. |
| 7,052,594 B2 | 5/2006 | Pelrine et al. |
| 7,062,055 B2 | 6/2006 | Pelrine et al. |
| 7,063,268 B2 | 6/2006 | Chrysler et al. |
| 7,063,377 B2 | 6/2006 | Brei et al. |
| 7,064,472 B2 | 6/2006 | Pelrine et al. |
| 7,071,596 B2 | 7/2006 | Krill |
| 7,075,162 B2 | 7/2006 | Unger |
| 7,075,213 B2 | 7/2006 | Krill |
| 7,092,238 B2 | 8/2006 | Saito et al. |
| 7,099,141 B1 | 8/2006 | Kaufman et al. |
| 7,104,146 B2 | 9/2006 | Benslimane et al. |
| 7,109,643 B2 | 9/2006 | Hirai et al. |
| 7,113,318 B2 | 9/2006 | Onuki et al. |
| 7,113,848 B2 | 9/2006 | Hanson |
| 7,115,092 B2 | 10/2006 | Park et al. |
| 7,140,180 B2 | 11/2006 | Gerber et al. |
| 7,141,888 B2 | 11/2006 | Sabol et al. |
| 7,142,368 B2 | 11/2006 | Kim et al. |
| 7,142,369 B2 | 11/2006 | Wu et al. |
| 7,144,616 B1 | 12/2006 | Unger et al. |
| 7,148,789 B2 | 12/2006 | Sadler et al. |
| 7,164,212 B2 | 1/2007 | Leijon et al. |
| 7,166,952 B2 | 1/2007 | Topliss et al. |
| 7,166,953 B2 | 1/2007 | Heim et al. |
| 7,170,665 B2 | 1/2007 | Kaneko et al. |
| 7,190,016 B2 | 3/2007 | Cahalen et al. |
| 7,193,350 B1 | 3/2007 | Blackburn et al. |
| 7,195,393 B2 | 3/2007 | Potter |
| 7,195,950 B2 | 3/2007 | Taussig |
| 7,196,688 B2 | 3/2007 | Schena |
| 7,199,302 B2 | 4/2007 | Raisanen |
| 7,199,501 B2 | 4/2007 | Pei et al. |
| 7,205,704 B2 | 4/2007 | Audren et al. |
| 7,205,978 B2 | 4/2007 | Poupyrev et al. |
| 7,209,280 B2 | 4/2007 | Goossens |
| 7,211,937 B2 | 5/2007 | Kornbluh et al. |
| 7,224,106 B2 | 5/2007 | Pei et al. |
| 7,233,097 B2 | 6/2007 | Rosenthal et al. |
| 7,237,524 B2 | 7/2007 | Pelrine et al. |
| 7,242,106 B2 | 7/2007 | Kelly |
| 7,245,440 B2 | 7/2007 | Peseux |
| 7,256,943 B1 | 8/2007 | Kobrin et al. |
| 7,259,495 B2 | 8/2007 | Asai et al. |
| 7,259,503 B2 | 8/2007 | Pei et al. |
| 7,276,090 B2 | 10/2007 | Shahinpoor et al. |
| 7,291,512 B2 | 11/2007 | Unger |
| 7,298,054 B2 | 11/2007 | Hirsch |
| 7,298,559 B2 | 11/2007 | Kato |
| 7,298,603 B2 | 11/2007 | Mizuno et al. |
| 7,301,261 B2 | 11/2007 | Ifuku et al. |
| 7,310,874 B2 | 12/2007 | Higuchi et al. |
| 7,312,917 B2 | 12/2007 | Jacob |
| 7,316,794 B2 | 1/2008 | O'Brien |
| 7,320,457 B2 | 1/2008 | Heim et al. |
| 7,321,185 B2 | 1/2008 | Schultz |
| 7,323,790 B2 | 1/2008 | Taylor et al. |
| 7,332,688 B2 | 2/2008 | Browne et al. |
| 7,339,285 B2 | 3/2008 | Negron Crespo |
| 7,339,572 B2 | 3/2008 | Schena |
| 7,342,573 B2 | 3/2008 | Ryynanen |
| 7,344,763 B2 | 3/2008 | Kokeguchi et al. |
| 7,353,747 B2 | 4/2008 | Swayze et al. |
| 7,355,293 B2 | 4/2008 | Bernhoff et al. |
| 7,359,124 B1 | 4/2008 | Fang et al. |
| 7,362,031 B2 | 4/2008 | Maita et al. |
| 7,362,032 B2 | 4/2008 | Pelrine et al. |
| 7,362,889 B2 | 4/2008 | Dubowsky et al. |
| 7,368,862 B2 | 5/2008 | Pelrine et al. |
| 7,371,596 B2 | 5/2008 | Warner, Jr. et al. |
| 7,373,454 B1 | 5/2008 | Noe |
| 7,378,783 B2 | 5/2008 | Pelrine et al. |
| 7,392,876 B2 | 7/2008 | Browne et al. |
| 7,394,182 B2 | 7/2008 | Pelrine et al. |
| 7,394,282 B2 | 7/2008 | Sinha et al. |
| 7,394,641 B2 | 7/2008 | Won et al. |
| 7,397,166 B1 | 7/2008 | Morgan et al. |
| 7,401,846 B2 | 7/2008 | Browne et al. |
| 7,411,332 B2 | 8/2008 | Kornbluh et al. |
| 7,426,340 B2 | 9/2008 | Seo |

(56) References Cited

U.S. PATENT DOCUMENTS

| | | |
|---|---|---|
| 7,429,074 B2 | 9/2008 | McKnight et al. |
| 7,429,495 B2 | 9/2008 | Wan |
| 7,436,099 B2 | 10/2008 | Pei et al. |
| 7,436,646 B2 | 10/2008 | Delince et al. |
| 7,442,421 B2 | 10/2008 | Li et al. |
| 7,442,760 B2 | 10/2008 | Roberts et al. |
| 7,444,072 B2 | 10/2008 | Seo |
| 7,446,926 B2 | 11/2008 | Sampsell |
| 7,449,821 B2 | 11/2008 | Dausch |
| 7,454,820 B2 | 11/2008 | Nakamura |
| 7,456,549 B2 | 11/2008 | Heim et al. |
| 7,468,575 B2 | 12/2008 | Pelrine et al. |
| 7,481,120 B2 | 1/2009 | Gravesen et al. |
| 7,482,745 B2 | 1/2009 | Shirogane et al. |
| 7,492,076 B2 | 2/2009 | Heim et al. |
| 7,498,729 B2 | 3/2009 | Ogino |
| 7,499,223 B2 | 3/2009 | Berge et al. |
| 7,511,706 B2 | 3/2009 | Schena |
| 7,513,624 B2 | 4/2009 | Yavid et al. |
| 7,515,350 B2 | 4/2009 | Berge et al. |
| 7,518,284 B2 | 4/2009 | Benslimane et al. |
| 7,521,840 B2 | 4/2009 | Heim |
| 7,521,847 B2 | 4/2009 | Heim |
| 7,537,197 B2 | 5/2009 | Heim et al. |
| 7,548,015 B2 | 6/2009 | Benslimane et al. |
| 7,548,232 B2 | 6/2009 | Shahoian et al. |
| 7,567,681 B2 | 7/2009 | Pelrine et al. |
| 7,573,064 B2 | 8/2009 | Benslimane et al. |
| 7,585,122 B2 | 9/2009 | Eromaki et al. |
| 7,586,242 B2 | 9/2009 | Yokoyama et al. |
| 7,595,580 B2 | 9/2009 | Heim |
| 7,608,989 B2 | 10/2009 | Heydt et al. |
| 7,618,680 B2 | 11/2009 | Gleason et al. |
| 7,626,319 B2 | 12/2009 | Heim |
| 7,646,544 B2 | 1/2010 | Batchko et al. |
| 7,648,118 B2 | 1/2010 | Ukpai et al. |
| 7,659,918 B2 | 2/2010 | Turner |
| 7,679,267 B2 | 3/2010 | Heim |
| 7,679,839 B2 | 3/2010 | Polyakov et al. |
| 7,690,622 B2 | 4/2010 | Ito et al. |
| 7,702,227 B2 | 4/2010 | Ito et al. |
| 7,703,740 B1 | 4/2010 | Franklin |
| 7,703,742 B2 | 4/2010 | Heim et al. |
| 7,703,839 B2 | 4/2010 | McKnight et al. |
| 7,705,521 B2 | 4/2010 | Pelrine et al. |
| 7,714,701 B2 | 5/2010 | Altan et al. |
| 7,732,999 B2 | 6/2010 | Clausen et al. |
| 7,733,575 B2 | 6/2010 | Heim et al. |
| 7,745,374 B2 | 6/2010 | Tanaka et al. |
| 7,750,532 B2 | 7/2010 | Heim |
| 7,750,617 B2 | 7/2010 | Omi |
| 7,754,520 B2 | 7/2010 | Lee |
| 7,761,981 B2 | 7/2010 | Rosenthal et al. |
| 7,772,745 B2 | 8/2010 | Kawakubo et al. |
| 7,785,656 B2 | 8/2010 | Pei et al. |
| 7,787,646 B2 | 8/2010 | Pelrine et al. |
| 7,813,047 B2 | 10/2010 | Wang et al. |
| 7,824,580 B2 | 11/2010 | Boll et al. |
| 7,883,783 B2 | 2/2011 | Nagatani |
| 7,886,993 B2 | 2/2011 | Bachmaier et al. |
| 7,893,965 B2 | 2/2011 | Heim et al. |
| 7,898,159 B2 | 3/2011 | Heydt et al. |
| 7,911,115 B2 | 3/2011 | Pelrine et al. |
| 7,911,761 B2 | 3/2011 | Biggs et al. |
| 7,915,789 B2 | 3/2011 | Smith |
| 7,915,790 B2 | 3/2011 | Heim et al. |
| 7,921,541 B2 | 4/2011 | Pei et al. |
| 7,923,064 B2 | 4/2011 | Pelrine et al. |
| 7,923,902 B2 | 4/2011 | Heim |
| 7,923,982 B2 | 4/2011 | Sumita |
| 7,930,815 B2 | 4/2011 | Coleman et al. |
| 7,940,476 B2 | 5/2011 | Polyakov et al. |
| 7,952,261 B2 | 5/2011 | Lipton et al. |
| 7,958,789 B2 | 6/2011 | Hayakawa et al. |
| 7,971,850 B2 | 7/2011 | Heim et al. |
| 7,980,671 B2 | 7/2011 | Nystrom et al. |
| 7,986,466 B2 | 7/2011 | Lee et al. |
| 7,990,022 B2 | 8/2011 | Heim |
| 7,997,260 B2 | 8/2011 | Kaakkola et al. |
| 7,999,447 B2 | 8/2011 | Micallef |
| 8,004,339 B2 | 8/2011 | Barrow |
| 8,007,986 B2 | 8/2011 | Zhang et al. |
| 8,026,023 B2 | 9/2011 | Hamada |
| 8,033,324 B2 | 10/2011 | Mukasa et al. |
| 8,042,264 B2 | 10/2011 | Rosenthal et al. |
| 8,049,333 B2 | 11/2011 | Alden et al. |
| 8,050,601 B2 | 11/2011 | Lin et al. |
| 8,054,566 B2 | 11/2011 | Heim et al. |
| 8,056,618 B2 | 11/2011 | Wagner et al. |
| 8,058,861 B2 | 11/2011 | Pelrine et al. |
| 8,072,121 B2 | 12/2011 | Heim et al. |
| 8,074,939 B2 | 12/2011 | Hyde et al. |
| 8,093,783 B2 | 1/2012 | Rosenthal et al. |
| 8,127,437 B2 | 3/2012 | Lipton et al. |
| 8,133,932 B2 | 3/2012 | Kijlstra et al. |
| 8,164,835 B2 | 4/2012 | Heim et al. |
| 8,172,998 B2 | 5/2012 | Bennett et al. |
| 8,183,739 B2 | 5/2012 | Heim |
| 8,211,054 B2 | 7/2012 | Dewey |
| 8,221,944 B2 | 7/2012 | Shirasaki et al. |
| 8,222,799 B2 | 7/2012 | Polyakov et al. |
| 8,237,324 B2 | 8/2012 | Pei et al. |
| 8,248,750 B2 | 8/2012 | Biggs et al. |
| 8,258,238 B2 | 9/2012 | Boersma et al. |
| 8,283,839 B2 | 10/2012 | Heim |
| 8,294,600 B2 | 10/2012 | Peterson et al. |
| 8,310,444 B2 | 11/2012 | Peterson et al. |
| 8,316,526 B2 | 11/2012 | Pei et al. |
| 8,319,403 B2 | 11/2012 | Lipton et al. |
| 8,419,822 B2 | 4/2013 | Li |
| 8,421,316 B2 | 4/2013 | Tryson et al. |
| 8,508,109 B2 | 8/2013 | Kurihara et al. |
| 8,545,987 B2 | 10/2013 | Strader et al. |
| 8,585,007 B2 | 11/2013 | Schapeler et al. |
| 8,594,839 B2 | 11/2013 | Hanson |
| 8,667,849 B2 | 3/2014 | Sato et al. |
| 8,679,575 B2 | 3/2014 | Biggs et al. |
| 8,773,373 B2 | 7/2014 | Sato et al. |
| 8,779,650 B2 | 7/2014 | Jenninger et al. |
| 8,842,355 B2 | 9/2014 | Lipton et al. |
| 8,975,888 B2 | 3/2015 | Pelrine et al. |
| 8,981,621 B2 | 3/2015 | Pelrine et al. |
| RE45,464 E | 4/2015 | Kornbluh et al. |
| 9,164,202 B2 | 10/2015 | Batchko et al. |
| 2001/0007449 A1 | 7/2001 | Kobachi et al. |
| 2002/0083858 A1 | 7/2002 | MacDiarmid et al. |
| 2003/0168936 A1 | 9/2003 | Everingham et al. |
| 2004/0014860 A1 | 1/2004 | Meier et al. |
| 2004/0035472 A1 | 2/2004 | Teltscher et al. |
| 2004/0046739 A1 | 3/2004 | Gettemy |
| 2004/0124738 A1 | 7/2004 | Pelrine et al. |
| 2004/0234401 A1 | 11/2004 | Banister |
| 2004/0242956 A1 | 12/2004 | Scorvo |
| 2005/0002113 A1 | 1/2005 | Berge |
| 2005/0046312 A1 | 3/2005 | Tetsu |
| 2005/0085693 A1 | 4/2005 | Belson et al. |
| 2005/0113892 A1 | 5/2005 | Sproul |
| 2005/0140922 A1 | 6/2005 | Bekerman et al. |
| 2005/0200984 A1 | 9/2005 | Browne et al. |
| 2005/0238506 A1 | 10/2005 | Mescher et al. |
| 2006/0079619 A1 | 4/2006 | Wang et al. |
| 2006/0057377 A1 | 6/2006 | Harrison et al. |
| 2006/0122954 A1 | 6/2006 | Podlasek et al. |
| 2006/0138371 A1 | 6/2006 | Garnier |
| 2006/0197741 A1 | 9/2006 | Biggadike |
| 2006/0238069 A1 | 10/2006 | Maruyama et al. |
| 2006/0258912 A1 | 11/2006 | Belson et al. |
| 2007/0080435 A1 | 4/2007 | Lin |
| 2007/0122132 A1 | 5/2007 | Misawa et al. |
| 2007/0152982 A1 | 7/2007 | Kim et al. |
| 2007/0170910 A1 | 7/2007 | Chang et al. |
| 2007/0173602 A1 | 7/2007 | Brinkman et al. |
| 2007/0189667 A1 | 8/2007 | Wakita |
| 2007/0200457 A1 | 8/2007 | Heim et al. |

(56) References Cited

U.S. PATENT DOCUMENTS

| | | |
|---|---|---|
| 2007/0219285 A1 | 9/2007 | Kropp et al. |
| 2007/0230222 A1 | 10/2007 | Drabing et al. |
| 2008/0043318 A1 | 2/2008 | Whitesides et al. |
| 2008/0062589 A1 | 3/2008 | Drabing |
| 2008/0143696 A1 | 6/2008 | Goulthorpe |
| 2008/0152921 A1 | 6/2008 | Kropp |
| 2008/0248231 A1 | 10/2008 | Daigaku et al. |
| 2008/0264441 A1 | 10/2008 | Takagi |
| 2008/0265709 A1* | 10/2008 | Clausen ............... H01L 41/083 310/300 |
| 2008/0303782 A1 | 12/2008 | Grant et al. |
| 2009/0028491 A1 | 1/2009 | Fillion et al. |
| 2009/0050829 A1 | 2/2009 | Haynes et al. |
| 2009/0104448 A1 | 4/2009 | Thompson et al. |
| 2009/0184606 A1 | 7/2009 | Rosenthal et al. |
| 2009/0250021 A1 | 10/2009 | Zarrabi et al. |
| 2009/0297829 A1 | 12/2009 | Pyles et al. |
| 2010/0006827 A1 | 1/2010 | Buckley |
| 2010/0172011 A1 | 7/2010 | Piroux et al. |
| 2010/0236843 A1 | 9/2010 | Englund |
| 2010/0273063 A1 | 10/2010 | Wallace et al. |
| 2011/0021917 A1 | 1/2011 | Morita |
| 2011/0128239 A1 | 6/2011 | Polyakov et al. |
| 2011/0155307 A1 | 6/2011 | Pelrine et al. |
| 2011/0216389 A1 | 9/2011 | Piroux et al. |
| 2011/0222138 A1 | 9/2011 | Piroux et al. |
| 2011/0256383 A1 | 10/2011 | Cochet et al. |
| 2011/0285247 A1 | 11/2011 | Lipton et al. |
| 2012/0126959 A1 | 5/2012 | Zarrabi et al. |
| 2012/0128960 A1 | 5/2012 | Büsgen |
| 2012/0307338 A1 | 12/2012 | Solarkski et al. |
| 2014/0014715 A1 | 1/2014 | Moran et al. |
| 2014/0176753 A1 | 6/2014 | Hillis et al. |
| 2014/0290834 A1 | 10/2014 | Egron et al. |
| 2014/0319971 A1 | 10/2014 | Yoo et al. |
| 2014/0322522 A1 | 10/2014 | Yoo |
| 2014/0352879 A1 | 12/2014 | Yoo et al. |
| 2015/0009009 A1 | 1/2015 | Zarrabi et al. |
| 2015/0043095 A1 | 2/2015 | Lipton et al. |
| 2015/0070740 A1 | 3/2015 | Zarrabi et al. |
| 2015/0084483 A1 | 3/2015 | Yoo et al. |
| 2015/0096666 A1 | 4/2015 | Yoo et al. |
| 2015/0119529 A1 | 4/2015 | Laurino |
| 2015/0221851 A1 | 8/2015 | Biggs et al. |
| 2015/0221861 A1 | 8/2015 | Biggs et al. |
| 2016/0025429 A1 | 1/2016 | Muir et al. |
| 2016/0204338 A1 | 7/2016 | Schmeer et al. |
| 2016/0208944 A1 | 7/2016 | Muir et al. |
| 2016/0230904 A1 | 8/2016 | Zarrabi et al. |

FOREIGN PATENT DOCUMENTS

| | | |
|---|---|---|
| CA | 2769441 A1 | 2/2011 |
| CN | 1447365 A | 10/2003 |
| DE | 2535833 A1 | 2/1977 |
| DE | 4408618 A1 | 9/1995 |
| DE | 19636909 C1 | 3/1998 |
| DE | 19952062 A1 | 5/2000 |
| DE | 10058096 A1 | 6/2002 |
| DE | 10161349 A1 | 7/2003 |
| DE | 10335019 A1 | 2/2005 |
| EP | 0196839 A2 | 10/1986 |
| EP | 0295907 A1 | 12/1988 |
| EP | 0154473 B1 | 5/1992 |
| EP | 0522882 A2 | 1/1993 |
| EP | 0833182 A2 | 4/1998 |
| EP | 0980103 A2 | 2/2000 |
| EP | 1050955 A1 | 11/2000 |
| EP | 1090835 A1 | 4/2001 |
| EP | 1323925 A2 | 7/2004 |
| EP | 1528609 A2 | 5/2005 |
| EP | 1698876 A2 | 9/2006 |
| EP | 1751843 A2 | 2/2007 |
| EP | 1843406 A1 | 10/2007 |
| EP | 1976036 A2 | 10/2008 |
| EP | 2119747 B1 | 11/2009 |
| EP | 2511314 A1 | 10/2012 |
| FR | 2208461 A5 | 6/1974 |
| FR | 2745476 A1 | 9/1997 |
| GB | 2338513 A | 12/1999 |
| GB | 2470006 A | 11/2010 |
| JP | S 5181120 A | 7/1976 |
| JP | S 52120840 A | 10/1977 |
| JP | S 5445593 A | 4/1979 |
| JP | S 5542474 A | 3/1980 |
| JP | S 5565569 A | 5/1980 |
| JP | S 5661679 A | 5/1981 |
| JP | S 56101788 A | 8/1981 |
| JP | S 59126689 A | 7/1984 |
| JP | S 6199499 A | 5/1986 |
| JP | S 61239799 A | 10/1986 |
| JP | S 6397100 A | 4/1988 |
| JP | H 02162214 A | 6/1990 |
| JP | 02222019 A | 9/1990 |
| JP | 03173022 A | 7/1991 |
| JP | H 05244782 A | 9/1993 |
| JP | H 07111785 A | 4/1995 |
| JP | H 07240544 A | 9/1995 |
| JP | H 09275688 A | 10/1997 |
| JP | H 10137655 A | 5/1998 |
| JP | H 10207616 A | 8/1998 |
| JP | H 10321482 A | 12/1998 |
| JP | H 112764 A | 1/1999 |
| JP | 11134109 A | 5/1999 |
| JP | H 11133210 A | 5/1999 |
| JP | 2000-081504 A | 3/2000 |
| JP | 2000-331874 A | 11/2000 |
| JP | 2001-130774 A | 5/2001 |
| JP | 2001-136598 A | 5/2001 |
| JP | 2001-286162 A | 10/2001 |
| JP | 2001-291906 A | 10/2001 |
| JP | 2002-503008 A | 1/2002 |
| JP | 2003-040041 A | 2/2003 |
| JP | 3501216 B2 | 3/2004 |
| JP | 2004-516966 A | 6/2004 |
| JP | 2004-205827 A | 7/2004 |
| JP | 2004-221742 A | 8/2004 |
| JP | 2004-296154 A | 10/2004 |
| JP | 2004-353279 A | 12/2004 |
| JP | 2005-001885 A | 1/2005 |
| JP | 2005-202707 A | 7/2005 |
| JP | 3709723 B2 | 8/2005 |
| JP | 2005-260236 A | 9/2005 |
| JP | 2006-048302 A | 2/2006 |
| JP | 2006-509052 A | 3/2006 |
| JP | 2006-178434 A | 7/2006 |
| JP | 2006-244490 A | 9/2006 |
| JP | 2007-206362 A | 8/2007 |
| JP | 2007-287670 A | 11/2007 |
| JP | 2008-262955 A | 10/2008 |
| JP | 2008-277729 A | 11/2008 |
| JP | 2009-077618 A | 4/2009 |
| JP | 2009-249313 A | 10/2009 |
| JP | 2010-273524 A | 12/2010 |
| JP | 5415442 B2 | 2/2014 |
| KR | 2004-0097921 A | 12/2004 |
| KR | 10-0607839 B1 | 8/2006 |
| KR | 10-0650190 B1 | 11/2006 |
| KR | 2008-0100757 A | 11/2008 |
| KR | 2010-0121801 A | 11/2010 |
| KR | 20110122244 A | 11/2011 |
| TV | I272194 B | 2/2007 |
| TW | I1269615 B | 12/2006 |
| WO | WO 87/07218 A1 | 12/1987 |
| WO | WO 89/02658 A1 | 3/1989 |
| WO | WO 94/18433 A1 | 8/1994 |
| WO | WO 95/08905 A1 | 3/1995 |
| WO | WO 96/26364 A2 | 8/1996 |
| WO | WO 97/15876 A1 | 5/1997 |
| WO | WO 98/19208 A2 | 5/1998 |
| WO | WO 98/35529 A2 | 8/1998 |
| WO | WO 98/45677 A2 | 10/1998 |
| WO | WO 99/17929 A1 | 4/1999 |

(56) References Cited

FOREIGN PATENT DOCUMENTS

| | | |
|---|---|---|
| WO | WO 99/23749 A1 | 5/1999 |
| WO | WO 99/37921 A1 | 7/1999 |
| WO | WO 01/01025 A2 | 1/2001 |
| WO | WO 01/06575 A1 | 1/2001 |
| WO | WO 01/06579 A2 | 1/2001 |
| WO | WO 01/58973 A2 | 8/2001 |
| WO | WO 01/59852 A2 | 8/2001 |
| WO | WO 01/91100 A1 | 11/2001 |
| WO | WO 02/37660 A1 | 5/2002 |
| WO | WO 02/37892 A2 | 5/2002 |
| WO | WO 02/071505 A1 | 9/2002 |
| WO | WO 03/056274 A1 | 7/2003 |
| WO | WO 03/056287 A1 | 7/2003 |
| WO | WO 03/081762 A1 | 10/2003 |
| WO | WO 03/107523 A1 | 12/2003 |
| WO | WO 2004/009363 A1 | 1/2004 |
| WO | WO 2004/027970 A1 | 4/2004 |
| WO | WO 2004/053782 A1 | 6/2004 |
| WO | WO 2004/074797 A1 | 9/2004 |
| WO | WO 2004/079832 A2 | 9/2004 |
| WO | WO 2004/086289 A2 | 10/2004 |
| WO | WO 2004/093763 A1 | 11/2004 |
| WO | WO 2005/027161 A2 | 3/2005 |
| WO | WO 2005/053002 A2 | 6/2005 |
| WO | WO 2005/079187 A2 | 9/2005 |
| WO | WO 2005/079353 A2 | 9/2005 |
| WO | WO 2005/081676 A2 | 9/2005 |
| WO | WO 2005/086249 A1 | 9/2005 |
| WO | WO 2006/040532 A1 | 4/2006 |
| WO | WO 2006/071419 A2 | 7/2006 |
| WO | WO 2006/102273 A2 | 9/2006 |
| WO | WO 2006/121818 A2 | 11/2006 |
| WO | WO 2006/123317 A2 | 11/2006 |
| WO | WO 2007/018877 A2 | 2/2007 |
| WO | WO 2007/029275 A1 | 3/2007 |
| WO | WO 2007/072411 A1 | 6/2007 |
| WO | WO 2008/039658 A2 | 4/2008 |
| WO | WO 2008/052559 A2 | 5/2008 |
| WO | WO 2008/105861 A2 | 9/2008 |
| WO | WO 2008/150817 A1 | 12/2008 |
| WO | WO 2009/006318 A1 | 1/2009 |
| WO | WO 2009/056497 A1 | 5/2009 |
| WO | WO 2009/076477 A1 | 6/2009 |
| WO | WO 2009/112988 A1 | 9/2009 |
| WO | WO 2010/054014 A1 | 5/2010 |
| WO | WO 2010/104953 A1 | 9/2010 |
| WO | WO 2010/115549 A1 | 10/2010 |
| WO | WO 2011/097020 A2 | 8/2011 |
| WO | WO 2011/118315 A1 | 9/2011 |
| WO | WO 2012/032437 A1 | 3/2012 |
| WO | WO 2012/044419 A1 | 4/2012 |
| WO | WO 2012/099854 A1 | 7/2012 |
| WO | WO 2012/118916 A2 | 9/2012 |
| WO | WO 2012/129357 A2 | 9/2012 |
| WO | WO 2012/148644 A2 | 11/2012 |
| WO | WO 2013/044195 A2 | 3/2013 |
| WO | WO 2013/055733 A1 | 4/2013 |
| WO | WO 2013/103470 A1 | 7/2013 |
| WO | WO 2013/155377 A1 | 10/2013 |
| WO | WO 2013/192143 A1 | 12/2013 |
| WO | WO 2014/028819 A1 | 2/2014 |
| WO | WO 2014/028822 A1 | 2/2014 |
| WO | WO 2014/028825 A1 | 2/2014 |
| WO | WO 2014/062776 A1 | 4/2014 |
| WO | WO 2014/066576 A1 | 5/2014 |
| WO | WO 2014/074554 A2 | 5/2014 |
| WO | WO 2014/089388 A2 | 6/2014 |
| WO | WO 2014/187976 A1 | 11/2014 |
| WO | WO 2015/020698 A2 | 2/2015 |
| WO | WO 2015/051291 A1 | 4/2015 |
| WO | WO 2015/126928 A1 | 8/2015 |
| WO | WO 2015/126928 A4 | 12/2015 |

OTHER PUBLICATIONS

Ajluni, Cheryl, "Pressure Sensors Strive to Stay on Top, New Silicon Micromachining Techniques and Designs Promise Higher Performance," Electronic Design—Advanced Technology Series, Oct. 3, 1994, pp. 67-74.

Akle, Barbar J., et al., "Ionic Electroactive Hybrid Transducers," Smart Structures and Materials 2005: Electroactive Polymer Actuators and Devices (EAPAD), Proceedings of SPIE, Bellingham, WA, vol. 5759, 2005, pp. 153-164.

Anderson, R.A., "Mechanical Stress in a Delectric Solid From a Uniform Electric Field," The American Physical Society, 1986, pp. 1302-1307.

Aramaki, S., S. Kaneko, K. Arai, Y. Takahashi, H. Adachi, and K. Yanagisawa. 1995. "Tube Type Micro Manipulator Using Shape Memory Alloy (SMA)," Proceedings of the IEEE Sixth International Symposium on Micro Machine and Human Science, Nagoya, Japan, pp. 115-120.

Ashley, S., "Artificial Muscles", Scientific American 2003, pp. 53-59.

Ashley, S., "Smart Skis and Other Adaptive Structures," Mechanical Engineering, Nov. 1995, pp. 77-81.

Bar-Cohen, Yoseph, JPL, WorldWide ElectroActive Polymers, EAP (Artifical Muscles) Newsletter, vol. 1, No. 1, Jun. 1999.

Bar-Cohen, Yoseph, JPL, WorldWide ElectroActive Polymers, EAP (Artifical Muscles) Newsletter, vol. 1, No. 2, Dec. 1999.

Bar-Cohen, Yoseph, JPL, WorldWide ElectroActive Polymers, EAP (Artifical Muscles) Newsletter, vol. 2, No. 1, Jul. 2000.

Bar-Cohen, Yoseph, JPL, WorldWide ElectroActive Polymers, EAP (Artifical Muscles) Newsletter, vol. 2, No. 2, Dec. 2000.

Bar-Cohen, Yoseph, JPL, WorldWide ElectroActive Polymers, EAP (Artifical Muscles) Newsletter, vol. 3, No. 1, Jun. 2001.

Bar-Cohen, Yoseph, JPL, WorldWide ElectroActive Polymer Actuators Webhub webpages 1-7, http://ndeaa.jpl.nasa.gov/nasa-nde/lommas/eap/EAP-web.htm, downloaded Jul. 23, 2001 (7 pages).

Baughman, R., L. Shacklette, R. Elsenbaumer, E. Plichta, and C. Becht "Conducting Polymer Electromechanical Actuators," Conjugated Polymeric Materials: Opportunities in Electronics, Optoelectronics and Molecular Electronics, eds. J.L. Bredas and R.R. Chance, Kluwer Academic Publishers, The Netherlands, pp. 559-582, 1990.

Baughman, R.H., L.W. Shacklette, R.L. Elsenbaumer, E.J. Plichta, and C. Becht "Micro electromechanical actuators based on conducting polymers," in Molecular Electronics, Materials and Methods, P.I. Lazarev (ed.), Kluwer Academic Publishers, pp. 267-289 (1991).

Beckett, J., "New Robotics Tap the Mind, Help the Heart, SRI shows of latest technologies," San Francisco Chronicle, Aug. 27, 1998.

Begley, M. et al., "The Electro-Mechanical Response to Highly Compliant Substrates and Thin Stiff Films with Periodic Cracks," International Journal of Solids and Structures, 42:5259-5273, 2005.

Benslimane, M and P. Gravesen, "Mechanical Properties of Dielectric Elastomer Actuators with Smart Metallic Compliant Electrodes," Proceedings of SPIE, International Society for Optical Engineering, vol. 4695, Jan. 1, 2002, pp. 150-157.

Bharti, V., Y. Ye, T.-B. Xu and Q.M. Zhang, "Correlation Between Large Electrostrictive Strain and Relaxor Behavior with Structural Changes Induced in P(VDF-TrFE) Copolymer by Electron Irradiation," Mat. Res. Soc. Symp. Proc. vol. 541, pp. 653-659 (1999).

Bharti, V., Z.-Y.Cheng S. Gross, T.-B. Xu and Q.M. Zhang, "High Electrostrictive Strain Under High Mechanical Stress in Electron-Irradiated Poly(vinylidene fluoride-trifluoroethylene) Copolymer," Applied Physics Letters, vol. 75, No. 17, pp. 2653-2655 (Oct. 25, 1999).

Bharti, V., H.S. Xu, G. Shanthi and Q.M. Zhang, "Polarization and Structural Properties of High Energy Electron Irradiated Poly(vinylidene fluoride-trifluoroethylene) Copolymer Films," to be published in J. Appl. Phys. (2000).

Bharti, V.,X.-Z. Zhao, Q.M. Zhang, T. Romotowski, F. Tito, and R. Ting, "Ultrahigh Field Induced Strain and Polarization Response in Electron Irradiated Poly(Vinylidene Fluoride-Trifluoroethylene) Copolymer,"Mat. Res. Innovat. vol. 2, pp. 57-63 (1998).

(56) References Cited

OTHER PUBLICATIONS

Bobbio, S., M. Kellam, B. Dudley, S. Goodwin Johansson, S. Jones, J. Jacobson, F. Tranjan, and T. DuBois, "Integrated Force Arrays," in Proc. IEEE Micro Electro Mechanical Systems Workshop, Fort Lauderdale, Florida, Feb. 7-10, 1993, pp. 146-154.

Bohon, K. and S. Krause, "An Electrorheological Fluid and Siloxane Gel Based Electromechanical Actuator: Working Toward an Artificial Muscle," to be published in J. Polymer Sci., Part B. Polymer Phys. (2000).

Boyle, W. et al., "Departure from Paschen's Law of Breakdown in Gases," The Physical Review, Second Series, 97(2): 255-259, Jan. 15, 1955.

Brock, D.L., "Review of Artifical Muscle based on Contractile Polymers," MIT Artificial Intelligence Laboratory, A.I. Memo No. 1330, Nov. 1991.

Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).

Calvert, P. and Z. Liu, "Electrically Stimulated Bilayer Hydrogels as Muscles," Proceedings of the SPIE International Symposium on Smart Structures and Materials: Electro-Active Plymer Actuators and Devices, Mar. 1-2, 1999, Newport Beach, California, USA, pp. 236-241.

Chen et al., "Active control of low-frequency sound radiation from vibrating panel using planar sound sources," Journal of Vibration and Acoustics, vol. 124, pp. 2-9, Jan. 2002.

Chen, Zheng et al., "Quasi-Static Positioning of Ionic Polymer-Metal Composite (IPMC) Actuators," Proceedings of the 2005 IEEE/ASME International Conference on Advanced Intelligent Mechatronics, Monterey, California, Jul. 24-28, 2005, pp. 60-65.

Cheng, Z.-Y., H.S. Xu, J. Su, Q. M. Zhjang, P.-C. Wang and A.G. MacDiarmid, "High Performance of All-Polymer Electrostrictive Systems," Proceedings of the SPIE Ineternational Symposium on Smart Structures and Materials: Electro-Active Polymer Actuators and Devices, Mar. 1-2, 1999, Newport Beach, California, USA, pp. 140-148.

Cheng, Z.-Y., T.-B. Xu, V. Bharti, S. Wang, and Q.M. Zhang, "Transverse Strain Responses in the Electrostrictive Poly(Vinylidene Fluoride-Trifluorethylene) Copolymer," Appl. Phs. Lett. vol. 74, No. 13, pp. 1901-1903, Mar. 29, 1999.

Chiarelli, P., A. Della Santa, D. DeRossi, and A. Mazzoldi, "Actuation Properties of Electrochemically Driven Polypyrrole Free-Standing Films," Journal of Intelligent Material Systems and Structures, vol. 6, pp. 32-37, Jan. 1995.

Delille, R. et al., "Novel Compliant Electrodes Based on Platinum Salt Reduction," Smart Structures and Materials 2006: Electroactive Polymer Actuators and Devices (EAPAD), edited by Yoseph Bar-Cohen, Proceedings of SPIE, 6168 (6168Q), 2006.

De Rossi, D., and P. Chiarelli, "Biomimetic Macromolecular Actuators," Macro-Ion Characterization, American Chemical Society Symposium Series, vol. 548, Ch. 40, pp. 517-530 (1994).

Dowling, K., Beyond Faraday-NonTraditional Actuation, available on the World Wide Web at http://www.frc.ri.cmu.edu/~nivek/OTH/beyond-faraday/beyondfaraday.html, 9 pages, 1994.

Egawa, S. and T. Higuchi, "Multi-Layered Electrostatic Film Actuator," Proc. IEEE Micro Electra Mechanical Systems, Napa Valley, California, pp. 166-171 (Feb. 11-14, 1990).

Elhami, K. B. Gauthier-Manuel, "Electrostriction of the Copolymer of Vinylidene-Fluoride and Trifluoroethylene," J. Appl. Phys. vol. 77 (8), 3987-3990, Apr. 15, 1995.

Flynn, Anita M., L.S. Tavrow, S.F. Bart, R.A. Brooks, D.J. Ehrlich, Kr.R. Udayakumar, and L.E. Cross. 1992. "Piezoelectric Micromotors for Microrobots," IEEE Journal of Microelectromechanical Systems, vol. 1, No. 1, pp. 44-51 (Mar. 1992); also published as MIT AI Laboratory Memo 1269, Massachusetts Institute of Technology (Feb. 1991).

Ford, V. and J. Kievet, "Technical Support Package on Traveling-Wave Rotary Actuators", NASA Tech Brief, vol. 21, No. 10, Item #145, from JPL New Technology Report NPO-19261, Oct. 1997.

Full, R.J. and K. Meijer, "Artificial Muscles Versus Natural Actuators from Frogs to Flies," Proceedings of the 7th SPIE Symposium on Smart Structures and Materials-Electroactive Polymers and Devices (EAPAD) Conference, Mar. 6-8, 2000, Newport Beach, California, USA, pp. 2-9.

Furuhata, T., T. Hirano, and H. Fujita, "Array-Driven Ultrasonic Microactuators," Solid State Sensors and Actuators, 1991, Digest of Tech. Papers, Transducers, pp. 1056-1059.

Furukawa, T. and N. Seo, "Electrostriction as the Origin of Piezoelectricity in Ferroelectric Polymers," Japanese J. Applied Physics, vol. 29, No. 4, pp. 675-680 (Apr. 1990).

Ghaffarian, S.R., et al., "Electrode Structures in High Strain Actuator Technology," Journal of Optoelectronics and Advanced Materials, Nov. 2007, 9(11), pp. 3585-3591.

Gilbertson, R.G. and J.D. Busch. "Survey of MicroActuator Technologies for Future Spacecraft Missions," presented a the conference entitled "Practical Robotic Interstellar Flight: Are We Ready?" New York University and The United Nations, New York. (Aug. 29 and Sep. 1, 1994); also published on the World Wide Web at http://nonothinc.com/nanosci/microtech/mems/ten-actuators/gilbertson.html.

Goldberg, Lee, "Adaptive-Filtering Developments Extend Noise-Cancellation Applications," Electronic Design, Feb. 6, 1995, pp. 34 and 36.

Greene, M. J.A. Willett, and R. Kornbluh, "Robotic Systems," in ONR Report 32198-2, Ocean Engineering and Marine Systems 1997 Program (Dec. 1997).

Greenland, P. Allegro Microsystems Inc., and B. Carsten, Bruce Carsten Associates, "Stacked Flyback Converters Allow Lower Voltage MOSFETs for High AC Line Voltage Operation," Feature PCIM Article, PCIM, Mar. 2000.

Hansen, G., "High Aspect Ratio Sub-Micron and Nano-Scale Metal Filaments," SAMPE Journal, 41(2): 24-33, 2005.

Heydt, R., R. Pelrine, J. Joseph, J. Eckerle, and R. Kornbluh, "Acoustical Performance of an Electrostrictive Polymer Film Loudspeaker," Journal of the Acoustical Society of America, vol. 107(2), pp. 833-839 (Feb. 2000).

Heydt, R., R. Kornbluh, R. Pelrine, and B. Mason, "Design and Performance of an Electrostrictive Polymer Film Acoustic Actuator," Journal of Sound and Vibration (1998) 215(2), 297-311.

Hirano, M., K. Yanagisawa, H. Kuwano, and S. Nakano, "Microvalve with Ultra-Low Leakage," Tenth Annual International Workshop on Micro Electromechanical Systems, Nagoya, Japan, IEEE Proceedings (Jan. 26-30, 1997), pp. 323-326.

Hirose, S., Biologically Inspired Robots: Snake-like Locomotors and Manipulators, "Development of the ACM as a Manipulator," Oxford University Press, New York, 1993, pp. 170-172.

http://www.neurosupplies.com/pdf_files/transducers.pdf, printed from web Jul. 25, 2001.

Huang, Cheng et al., "Colossal Dielectric and Electromechanical Responses in Self-Assembled Polymeric Nanocomposites", Applied Physics Letters 87, 182901 (2005), pp. 182901-1 through 182901-3.

Hunter, I.W. and S. Lafontaine, "A Comparison of Muscle with Artificial Actuators," Technical Digest of the IEEE Solid-State Sensor and Actuator Workshop, Hilton Head, South Carolina, Jun. 22-25, 1992, pp. 178-185.

Hunter, I., S. Lafontaine, J. Hollerbach, and P. Hunter, "Fast Reversible NiTi Fibers for Use in MicroRobotics," Proc. 1991 IEEE Micro Electro Mechanical Systems—MEMS '91, Nara, Japan, pp. 166-170.

Jacobsen, S., R. Price, J. Wood, T. Rytting and M. Rafaelof, "A Design Overview of an Eccentric-Motion Electrostatic Microactuator (the Wobble Motor)", Sensors and Actuators, 20 (1989) pp. 1-16.

Joseph, J., R. Pelrine, J. Eckerle, J. Bashkin, and P. Mulgaonkar, "Micro Electrical Composite Sensor", SRI International, printed from web Jul. 25, 2001.

Kaneto, K., M. Kaneko, Y. Min, and A.G. MacDiarmid, "Artifical Muscle: Electromechanical Actuators Using Polyaniline Films," Synthetic Metals 71, pp. 2211-2212, 1995.

Kawamura, S., K. Minani, and M. Esashi, "Fundamental Research of Distributed Electrostatic Micro Actuator," Technical Digest of the 11th Sensor Symposium, pp. 27-30 (1992).

(56) References Cited

OTHER PUBLICATIONS

Khuri-Yakub et al., "Silicon micromachined ultrasonic transducers," Japan Journal of Applied Physics, vol. 39 (2000), pp. 2883-2887, Par 1, No. 5B, May 2000.

Kinsler et al., Fundamentals of Acoustics, Third Edition, John Wiley and Sons, 1982.

Kondoh, Y., and T. Ono. 1991. "Bimorph Type Actuators using Lead Zinc Niobate-based Ceramics," Japanese Journal of Applied Physics, vol. 30, No. 9B, pp. 2260-2263, Sep. 1991.

Kornbluh, R., R. Pelrine, R. Heydt, and Q. Pei, "Acoustic Actuators Based on the Field-Activated Deformation of Dielectric Elastomers," (2000).

Kornbluh, R., G. Andeen, and J. Eckerle, "Artificial Muscle: The Next Generation of Robotic Actuators," presented at the Fourth World Conference on Robotics Research, SME Paper M591-331, Pittsburgh, PA, Sep. 17-19, 1991.

Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for Office of Naval Research, Nov. 1996.

Kornbluh, R., R. Pelrine, J. Joseph, "Elastomeric Dielectric Artificial Muscle Actuators for Small Robots," Proceedings of the Third IASTED International Conference on Robotics and Manufacturing, Jun. 14-16, 1995, Cancun, Mexico.

Kornbluh, R. et al., "Electroactive polymers: An emerging technology for MEMS," (invited) in MEMS/MOEMS Components and Their Applications, eds. S. Janson, W. Siegfried, and A. Henning, Proc. SPIE, 5344:13-27, 2004.

Kornbluh, R. et al., "Electroelastomers: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.

Kornbluh, R., Pelrine, R., Eckerie, J., Joseph, J., "Electrostrictive Polymer Artificial Muscle Actuators," IEEE International Conference on Robotic and Automation, Leuven, Belgium, 1998.

Kornbluh, R., R. Pelrine, Jose Joseph, Richard Heydt, Qibing Pei, Seiki Chiba, 1999. "High-Field Electrostriction of Elastomeric Polymer Dielectrics for Actuation", Proceedings of the SPIE International Symposium on Smart Structures and Materials: Electro-Active Polymer Actuators and Devices, Mar. 1-2, 1999, Newport Beach, California, USA. pp. 149-161.

Kornbluh et al., "Medical Applications of New Electroactive Polymer Artificial Muscles," SRI International, Menlo Park, CA, JSPP, v. 16, 2004.

Kornbluh, Roy D., Robotic Systems, Ocean Engineering and Marine Systems, 2000 Program, Jan. 2001, Office of Naval Research Public Release, ONR-32100-1.

Kornbluh, Roy D., Robotic Systems, Ocean Engineering and Marine Systems, 1999 Program, Feb. 2000, Office of Naval Research Public Release, ONR-32100-2.

Kornbluh, Roy D., Robotic Systems, Ocean Engineering and Marine Systems, 1997 Program, Dec. 1997, Office of Naval Research Public Release, ONR-32198-2.

Kornbluh, Roy D., Robotic Systems, Ocean Engineering and Marine Systems, 1998 Program, Feb. 1999, Office of Naval Research Public Release, ONR-32199-4.

Kornbluh, R., "Presentation to Colin Corporation", Jan. 1997.

Kornbluh, R. "Presentation to Medtronic", Jan. 2000.

Kornbluh, R. et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Kornbluh, R., Pelrine, R. Joseph, J., Pei, Q. and Chiba., "Ultra-High Strain Response of Elastomeric Polymer Dielectrics", Proc. Materials Res. Soc., Fall meeting, Boston, MA, pp. 1-12, Dec. 1999.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.

Kornbluh, R., "Use of Artificial Muscle Butterfly for Chronicle Newpaper Photograph," Aug. 1998.

Ktech's PVDF Sensors, http://www.ktech.com/pvdf.htm, Jun. 6, 2001, pp. 1-5.

Kymissis et al., "Parasitic Power Harvesting in Shoes," XP-010312825—Abstract, Physics and Media Group, MIT Media Laboratory E15-410, Cambridge, MA, Oct. 19, 1998, pp. 132-139.

Lacour, S. et al., "Mechanisms of Reversible Stretchability of Thin Metal Films on Elastomeric Substrates, " Applied Physics Letters 88, 204103, 2006.

Lacour, S. et al., "Stretchable Interconnects for Elastic Electronic Surfaces," Proceedings of the IEEE on Flexible Electronics Technology, 93(8): 1459-1467, 2005.

Lakes, R.S., "Extreme damping in compliant composites with a negative stiffness phase" or "Extreme Damping in Composite Materials with Negative Stiffness Inclusions", Nature, 410, 565-567, Mar. 2001.

Lakes, R.S., "Extreme damping in compliant composites with a negative stiffness phase", Philosophical Magazine Letters, 81, 95-100 (2001).

Lakes, R.S., "Extreme damping in compliant composites with a negative stiffness phase" or "Extreme Damping in Composite Materials with a Negative Stiffness Phase", Physical Review Letters, 86, 2897-2900, Mar. 26, 2001.

Lang, J, M. Schlect, and R. Howe, "Electric Micromotors: Electromechanical Characteristics," Proc. IEEE Micro Robots and Teleoperators Workshop, Hyannis, Massachusetts (Nov. 9-11, 1987).

Lawless, W. and R. Arenz, "Miniature Solid-state Gas Compressor," Rev. Sci Instrum., 58(8), pp. 1487-1493, Aug. 1987.

Liu, C., Y. Bar-Cohen, and S. Leary, "Electro-statically stricted polymers (ESSP)," Proceedings of the SPIE International Symposium on Smart Structures and Materials: Electro-Active Polymer Actuators and Devices, Mar. 1-2, 1999, Newport Beach, California, USA., pp. 186-190.

Liu, C. & Y. Bar-Cohen, "Scaling Laws of Microactuators and Potential Aplications of Elecroactive Polymers in MEMS", SPIE, Conference on Electroactive Polymer Actuators and Devices, Newport Beach, CA Mar. 1999.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

Madden et al., "Conducting polymer actuators as engineering materials," SPIE: Smart Materials and Structures, ed. Yoseph Bar-Cohen, Bellingham, WA, pp. 176-190, Pub 2002.

Madden, J.D. et al., "Fast contracting polypyrrole actuators", Jan. 6, 2000, Elsevier Science S.A., pp. 185-192.

Martin, J. and R. Anderson, 1999. "Electrostriction in Field-Structured Composites: Basis for a Fast Artificial Muscle?", The Journal of Chemical Physics, vol. 111, No. 9, pp. 4273-4280, Sep. 1, 1999.

Measurements Specialties, Inc.—Piezo Home, http://www.msiusa.com/piezo/index.htm, Jun. 6, 2001.

Möller, S. et al., A Polymer/semiconductor write-once read-many-times memory, Nature, vol. 26, Nov. 13, 2003, pp. 166-169, Nature Publishing Group.

Nguyen, T.B., C.K. DeBolt, S.V. Shastri and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Nihon Kohden Corporation, Operators Manual, available Oct. 1, 2001.

NXT plc, Huntingdon, UK (www.nxtsound.com) Sep. 17, 2008.

(56) References Cited

OTHER PUBLICATIONS

Ohara, K., M. Hennecke, and J. Fuhrmann, "Electrostriction of polymethylmethacrylates," Colloid & Polymer Sci. vol. 280, 164-168 (1982).

Olsson, A., G. Stemme, and E. Stemme, "The First Valve-less Diffuser Gas Pump," Tenth Annual International Workshop on Micro Electromechanical Systems, Nagoya, Japan, IEEE Proceedings (Jan. 26-30, 1997), pp. 108-113.

Olsson, A., O. Larsson, J. Holm, L. Lundbladh, O. Ohinan, and G. Stemme. 1997. "Valve-less Diffuser Micropumps Fabricated using Thermoplastic Replication," Proc. IEEE Micro Electro Mechanical Systems, Nagoya, Japan, pp. 305-310 (Jan. 26-30, 1997).

Osterbacka, R. et al., "Two-Dimensional Electronic Excitations in Self-Assembled Conjugated Polymer Nanocrystals," Science, vol. 287:839-842, Feb. 4, 2000.

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333-338, 1994.

Otero, T.F., J. Rodriguez, E. Angulo and C. Santamaria, "Artificial Muscles from Bilayer Structures," Synthetic Metals, vol. 55-57, pp. 3713-3717 (1993).

Park, S.E., and T. Shrout., "Ultrahigh Strain and Piezoelectric Behavior in Relaxor Based Ferroelectric Single Crystals," J. Appl. Phys., vol. 82, No. 4, pp. 1804-1811, Aug. 15, 1997.

Pei, Q., O. Inganäs, and I. Lundström, "Bending Bilayer Strips Built From Polyaniline for Artificial Electrochemical Muscles," Smart Materials and Structures, vol. 2, pp. 1-6., Jan. 22, 1993.

Pei, Qibing "Description of Conference Demonstration" Mar. 2001.

Pei et al., "Electrochemical Applications of the Bending Beam Method. 1. Mass Transport and Volume Changes in Polypyrrole During Redox," J. Phys. Chem., 1992, 96, pp. 10507-10514.

Pei, Q. et al., "Multifunctional Electroelastomer Roll Actuators and Their Application for Biomimetic Walking Robots," Smart Structures and Materials 2003. Electroactive Polymer Actuators and Devices, San Diego, CA, USA, Mar. 3-6, 2003, vol. 5051, 2003, pp. 281-290, XP002291729, Proceedings of the SPIE, ISSN: 0277-786X, the whole document.

Pei, Q. et al., "Multifunctional Electroelastomer Rolls," Mat. Res. Soc. Symp. Proc., vol. 698, Nov. 26-30, 2001, Boston, MA, pp. 165-170.

Pei, Q., Pelrine, R., Kornbluh, R., Jonasdottir, S., Shastri, V., Full, R., "Multifunctional Electroelastomers: Electroactive Polymers Combining Structural, Actuating, and Sensing Functions," ITAD-433-PA-00-123, University of California at Berkeley, Berkeley, CA, available at www.sri.com-publications, Jan. 17, 2001.

Pei, Q. et al., "Recent Progress on Electroelastomer Artificial Muscles and Their Application for Biomimetic Robots", SPIE, Pub. Jun. 2004, 11 pages.

Pelrine, R. et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.

Pelrine, R. and Kornbluh, R., and. 1995. "Dexterous Multiarticulated Manipulator with Electrostrictive Polymer Artificial Muscle Actuator," EMU 95-023, SRI International, Menlo Park, California, Apr. 28, 1995.

Pelrine, R., R. Kornbluh, and J. Joseph, "Electrostriction of Polymer Dielectrics with Compliant Electrodes as a Means of Actuation," Sensors and Actuators A: Physical, vol. 64, No. 1, 1998, pp. 77-85.

Pelrine, R., R. Kornbluh, J. Joseph and S. Chiba, "Electrostriction of Polymer Films for Microactuators," Proc. IEEE Tenth Annual International Workshop on Micro Electro Mechanical Systems, Nagoya, Japan, Jan. 26-30, 1997, pp. 238-243.

Pelrine, R., R. Kornbluh, and J. Joseph, FY 1992 Final Report on Artifical Muscle for Small Robots, ITAD-3393-FR-93-063, SRI International, Menlo Park, California, Mar. 1993.

Pelrine, R., R. Kornbluh, and J. Joseph, FY 1993 Final Report on Artifical Muscle for Small Robots, ITAD-4570-FR-94-076, SRI International, Menlo Park, California, 1994.

Pelrine, R., R. Kornbluh, and J. Joseph, FY 1994 Final Report on Artifical Muscle for Small Robots, ITAD-5782-FR-95-050, SRI International, Menlo Park, California, 1995.

Pelrine, R., R. Kornbluh, and J. Joseph, FY 1995 Final Report on Artifical Muscle for Small Robots, ITAD-7071-FR-96-047, SRI International, Menlo Park, California, 1996.

Pelrine, R., R. Kornbluh, and J. Joseph, FY 1996 Final Report on Artifical Muscle for Small Robots, ITAD-7228-FR-97-058, SRI International, Menlo Park, California, 1997.

Pelrine, R., R. Kornbluh, and J. Joseph, FY 1997 Final Report on Artifical Muscle for Small Robots, ITAD-1612-FR-98-041, SRI International, Menlo Park, California, 1998.

Pelrine, R., R. Kornbluh, and J. Joseph, FY 1998 Final Report on Artifical Muscle for Small Robots, ITAD-3482-FR-99-36, SRI International, Menlo Park, California, 1999.

Pelrine, R., R. Kornbluh, and J. Joseph, FY 1999 Final Report on Artifical Muscle for Small Robots, ITAD-10162-FR-00-27, SRI International, Menlo Park, California, 2000.

Pelrine, R., R. Kornbluh, Q. Pei, and J. Joseph, "High Speed Electrically Actuated Elastomers with Over 100% Strain," Science, vol. 287, No. 5454, pp. 1-21, 2000.

Pelrine, R., R. Kornbluh, Q. Pei, and J. Joseph. "High Speed Electrically Actuated Elastomers with Strain Greater Than 100%", Science, Reprint Series, Feb. 4, 2000, vol. 287, pp. 836-839.

Pelrine, R., R. Kornbluh, and G. Kofod, "High Strain Actuator Materials Based on Dielectric Elastomers," submitted to Advanced Materials (May 2000).

Pelrine, R., Roy Kornbluh, Jose Joseph, Qibing Pei, Seiki Chiba "Recent Progress in Artificial Muscle Micro Actuators," SRI Interational, Tokyo, 1999 MITI/NEEDOIMNIC, 1999.

Pelrine, R., R. Kornbluh, J. Joseph and S. Chiba, "Review of Artificial Muscle Approaches," invited paper, in Proc. Third International Symposium on Micro Machine and Human Science, Nagoya, Japan, Oct. 14-16, 1992.

Piezoflex(TM) PVDF Polymer Sensors, http://www.airmar.com/piezo/pvdf.htm. Jun. 6, 2001.

PowerLab ADInstruments, MLT001 High-Sensitivity Force Transducers, AD Instruments Transducers Series, printed from web Jul. 25, 2001.

Puers et al, "A Capacitive Pressure Sensor with Low Impedance Output and Active Suppression of Parasitic Effects," Sensors and Actuators, A21-A23 (1990) 108-114.

Puers, Robert, "Capacitive sensors: when and how to use them," Sensors and Actuators A, 37-38 (1993) 93-105.

Reed, C. et al., "The Fundamentals of Aging HV Polymer-Film Capacitors, " IEEE Transactions on Dielectrics and Electrical Insulation, 1(5): 904-922, 1994.

Sakarya, S., "Micromachining Techniques for Fabrication of Integrated Light Modulting Devices", Netherlands 2003, pp. 1-133.

Scheinbeim, J., B. Newman, Z. MA, and J. Lee, "Electrostrictive Response of Elastomeric Polymers," ACS Polymer Preprints, 33(2), pp. 385-386, 1992.

Schlaberg, H. I., and J. S. Duffy, "Piezoelectric Polymer Composite Arrays for Ultrasonic Medical Imaging Applications," Sensors and Actuators, A 44, pp. 111-117, Feb. 22, 1994.

Shahinpoor, M., "Micro-electro-mechanics of Ionic Polymer Gels as Electrically Controllable Artificial Muscles," J. Intelligent Material Systems and Structures, vol. 6, pp. 307-314, May 1995.

Shkel, Y. and D. Klingenberg, "Material Parameters for Electrostriction," J. Applied Physics, vol. 80(8), pp. 4566-4572, Oct. 15, 1996.

Smela, E., O. Inganas, and I. Lundstrom, "Controlled Folding of Micrometer-size Structures," Science, vol. 268, pp. 1735-1738 (Jun. 23, 1995).

Smela, E., O. Inganas, Q. Pei and I. Lundstrom, "Electrochemical Muscles: Micromachining Fingers and Corkscrews," Advanced Materials, vol. 5, No. 9, pp. 630-632, Sep. 1993.

Smith, S. et al., A low switching voltage organic-on-inorganic heterojunction memory element utilizing a conductive polymer fuse on a doped silicon substrate, Applied Physics Letters, vol. 84, No. 24, May 28, 2004, pp. 5019-5021.

Sokolova, M. et al., "Influence of a Bias Voltage on the Characteristics of Surface Discharges in Dry Air," Plasma Processes and Polymers, 2: 162-169, 2005.

(56) References Cited

OTHER PUBLICATIONS

Sommer-Larsen, P. and A. Ladegaard Larsen, "Materials for Dielectric Elastomer Actuators," SPIE, vol. 5385, Mar. 1, 2004, pp. 68-77.
Standard Test Methods for Rubber Deterioration—Cracking in an Ozone Controlled Environment, ASTM International, D 1149-07.
Su, J., Q.M. Zhang, C.H. Kim, R.Y. Ting and R. Capps, "Effects of Transitional Phenomena on the Electric Field induced Strain-electrostrictive Response of a Segmented Polyurethane elastomer," pp. 1363-1370, Jan. 20, 1997.
Su, J, Z. Ounaies, J.S. Harrison, Y. Bara-Cohen and S. Leary, "Electromechanically Active Polymer Blends for Actuation," Proceedings of 7th SPIE Symposium on Smart Structures and Materials-Electroactive Polymers and Devices (EAPAD) Conference, Mar. 6-8, 2000, Newport Beach, CA, USA, pp. 65-72.
Suzuki et al., "Sound radiation from convex and concave domes in infinite baffle," Journal of the Acoustical Society of America, vol. 69(2), Jan. 1981.
Technology, http://www.micromuscle.com/html/technology.html, Jun. 6, 2001.
"The Rubbery Ruler", http://www.ph.unimelb.edu.au, printed from web Jul. 25, 2001.
Tobushi, H., S. Hayashi, and S. Kojima, "Mechanical Properties of Shape Memory Polymer of Polyurethane Series," in JSME International Journal, Series I, vol. 35, No. 3, 1992.
Todorov et al, "WWWeb Application for Ferropiezoelectric Ceramic Parameters Calculation", Proceedings 24th International Conference on Microelectronics, vol. 1, May 2004, pp. 507-510.
Treloar, L.R.G., "Mechanics of Rubber Elasticity," J Polymer Science, Polymer Symposium, No. 48, pp. 107-123, 1974.
Uchino, K. 1986. "Electrostrictive Actuators: Materials and Applicaions," Ceramic Bulletin, 65(4), pp. 647-652, 1986.
Unger et al. (2000), "Monolithic Microfabricated Valves and Pumps by Multilayer Soft Lithography," Science 288:113-116, no month.
Wade, Jr., W.L., R.J. Mannone and M. Binder, "Increased Dielectric Breakdown Strengths of Melt-Extruded Polyporphlene Films," Polymer vol. 34, No. 5, pp. 1093-1094 (1993).
Wax, S.G. and R.R. Sands, "Electroactive Polymer Actuators and Devices," Proceedings of the SPIE International Symposium on Smart Structures and Materials: Electro-Active Polymer Actuators and Devices, Mar. 1-2, 1999, Newport Beach, CA, USA, pp. 2-10.
Whitesides et al. (2001), "Flexible Methods for Microfluidics," Physics Today 52(6):42-47, no month.
Winters, J., "Muscle as an Actuator for Intelligent Robots," Robotics Research: Trans. Robotics International of SME, Scottsdale, AZ (Aug. 18-21, 1986).
Woodard, Improvements of ModalMax High-Fidelity Peizoelectric Audio Device (LAR-16321-1), NASA Tech Briefs, May 2005, p. 36.
Xia, Younan et al., "Triangular Nanoplates of Silver: Synthesis, Characterization, and Use as Sacrificial Templates for Generating Triangular Nanorings of Gold," Adv. Mater., 2003, 15, No. 9, pp. 695-699.
Yam, P., "Plastics Get Wired," Scientific American, vol. 273, pp. 82-87, Jul. 1995.
Yoshio, O., "Ablation Characteristics of Silicone Insulation," Journal of Polymer Science: Part A: Polymer Chemistry, 36: 233-239, 1998.

Yuan, W. et al. "New Electrode Materials for Dielectric Elastomer Actuators," Proc. SPIE, 6524 (6524ON), 2007.
Zhang, Q.M., V. Bharti, Z.Y. Cheng, T.B. Xu, S. Wang, T.S. Ramotowski, F. Tito, and R. Ting, "Electromechanical Behavior of Electroactive P(VDF-TrFE) Copolymers," Proceedings of the SPIE International Symposium on Smart Structures and Materials: Electro-Active Polymer Actuators and Devices, Mar. 1-2, 1999, Newport Beach, CA, USA, pp. 134-139.
Zhang, Q., V. Bharti and X. Zhao, "Giant Electrostriction and Relaxor Ferroelectric Behavior in Electron-irradiated Poly(vinylidene fluoride-trifluoroethylene) Copolymer," Science, vol. 280, pp. 2101-2104 (Jun. 26, 1998).
Zhang, Q.M., Z.Y. Cheng, V. Bharti, T.B. Xu, H. Xu, T. Mai and S.J. Gross, "Piezoelectric and Electrostrictive Polymeric Actuator Materials," Proceedings of the 7th SPIE Symposium on Smart Structures and Materials: Electroactive Polymers and Devices (EAPAD) Conference, Mar. 6-8, 2000, Newport Beach, CA, USA, pp. 34-50.
Zhenyi, M., J.I. Scheinbeim, J.W. Lee, and B.A. Newman. 1994. "High Field Electrostrictive Response of Polymers," Journal of Polymer Sciences, Part B—Polymer Physics, vol. 32, pp. 2721-2731, 1994.
U.S. Appl. No. 14/440,991, filed May 6, 2015.
U.S. Appl. No. 14/437,741, filed Apr. 22, 2015.
U.S. Appl. No. 14/421,450, filed Feb. 13, 2015.
U.S. Appl. No. 14/435,761, filed Apr. 15, 2015.
U.S. Appl. No. 14/649,743, filed Jun. 4, 2015.
Biomimetic Products, Inc., hhtp://www.biomimetic.com, Jun. 6, 2001.
Campolo, D., et al., "Efficient Charge Recovery Method for Driving Piezoelectric Actuators with Quasi-Square Waves," IEEE Transaction on Ultrasonics, Ferroelectrics and Frequency Control, IEE, US, vol. 50, No. 3, Mar. 1, 2003, pp. 237-244.
Gardner, J.W., "Microsensors: Principles and Applications," John Wiley, 1994. (Book—not attached).
Handbook of adhesion technology, vol. 2, 2011, pp. 128, Print and electronic bundle ISBN 978-3-642-01170-2, DOI 10.1007/978-3-642-01169-6.
Kornbluh, R., "Description of Children's Tour," Aug. 20, 2000.
Kornbluh, R., R. Pelrine, Q. Pei, and V. Shastri "Electroactive Polymer (EAP) Actuators as Artificial Muscles—Reality, Potential and Challenges", Chapter 16, Application of Dielectric EAP Actuators, SPIE Press, May 2001.
Nguyen, T., Green, M., and Kornbluh, R., "Robotic Systems," in ONR Ocean, Atmosphere, and Space Fiscal Year 2000 Annual Reports (Jan. 2001). (Cited in U.S. Pat. No. 7,211,937 however, unable to locate).
Pelrine et al., "Electrostrictive Polymer Artificial Muscle Actuators," May 1998, Proc. of the 1998 IEEE Conf. on Robotics & Automation, pp. 2147-2154.
Polyoxymethylene urea NPL document, retrieved Nov. 11, 2015.
Prahlad, H. et al., "Programmable Surface Deformation: Thickness-Mode Electroactive Polymer Actuators and their Applications," Proc. SPIE, vol. 5759, 102, 2005, 12 pages.
Seoul et al., "Electrospinning of Poly(vinylidene fluoride) Dimethylformamide Solutions with Carbon Nanotubes," Department of Textile Engineering, Inha University, Mar. 31, 2003.

\* cited by examiner

ROLL-TO-ROLL MANUFACTURING PROCESSES FOR PRODUCING SELF-HEALING ELECTROACTIVE POLYMER DEVICES

RELATED APPLICATIONS

This application is a U.S. national phase application filed under 35 U.S.C. §371 of International Patent Application No. PCT/US2013/033061, filed Mar. 20, 2013 entitled ROLL-TO-ROLL MANUFACTURING PROCESSES FOR PRODUCING SELF-HEALING ELECTROACTIVE POLYMER DEVICES, which application claims the benefit, under 35 USC §119(e), of U.S. Provisional Application No. 61/613,530 filed Mar. 21, 2012 entitled "ROLL-TO-ROLL MANUFACTURING PROCESS FOR SELF-HEALING DIELECTRIC ELASTOMER TRANSDUCERS" the entire disclosures of which are incorporated herein by reference.

FIELD OF THE INVENTION

The present invention is directed in general to manufacturing and more specifically, to high volume manufacturing processes for producing electroactive polymer cartridges and actuators.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of device may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers", for the fabrication of transducers. These considerations include potential force, power density, power conversion/consumption, size, weight, cost, response time, duty cycle, service requirements, environmental impact, etc. As such, in many applications, electroactive polymer technology offers an ideal replacement for piezoelectric, shape-memory alloy and electromagnetic devices such as motors and solenoids.

An electroactive polymer transducer comprises two electrodes having deformable characteristics and separated by a thin elastomeric dielectric material. When a voltage difference is applied to the electrodes, the oppositely charged electrodes attract each other thereby compressing the polymer dielectric layer therebetween. As the electrodes are pulled closer together, the dielectric polymer film becomes thinner (the Z-axis component contracts) as it expands in the planar directions (along the X- and Y-axes), i.e., the displacement of the film is in-plane. The electroactive polymer film may also be configured to produce movement in a direction orthogonal to the film structure (along the Z-axis), i.e., the displacement of the film is out-of-plane, U.S. Pat. No. 7,567,681 discloses electroactive polymer film constructs which provide such out-of-plane displacement—also referred to as surface deformation or as thickness mode deflection.

The material and physical properties of the electroactive polymer film may be varied and controlled to customize the deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), the tension or pre-strain placed on the electroactive polymer film as a whole, and the amount of voltage applied to or capacitance induced upon the film may be controlled and varied to customize the features of the film when in an active mode.

Numerous applications exist that benefit from the advantages provided by such electroactive polymer films whether using the film alone or using it in an electroactive polymer actuator. One of the many applications involves the use of electroactive polymer transducers as actuators to produce haptic feedback (the communication of information to a user through forces applied to the user's body) in user interface devices.

Over time and continued operation, electroactive polymer cartridges may undergo significant stresses due to flexing of the electrode diaphragm causing stress cracks or fractures in the electrode, leading to premature failure. Accordingly, an electrode of an electroactive polymer cartridge should be able to undergo flexure while maintaining suitable operation over extended continued operations. The present disclosure provides various apparatuses and processing techniques for producing electroactive polymer cartridges comprising electrodes capable of withstanding extended continued operation without failure. The present disclosure also provides high-volume roll-to-roll manufacturing processes for producing dielectric elastomer material based electrodes for electroactive polymer cartridges.

SUMMARY OF THE INVENTION

Electroactive polymer devices that can be used with these designs include, but are not limited to planar, diaphragm, thickness mode, roll, and passive coupled devices (hybrids) as well as any type of electroactive polymer device described in the commonly assigned patents and applications cited herein.

In one embodiment, a process for producing a corrugated electrode for use in an electroactive polymer cartridge is provided. The process comprises positioning a laminated web comprising a support sheet laminated to a dielectric elastomer film, the support sheet defining areas exposing portions of the dielectric elastomer film; applying a three to stretch the positioned laminated support sheet-dielectric elastomer film web in a direction that is orthogonal to a plane defined by the web; applying an electrically conductive material to the laminated support sheet-dielectric elastomer film web while the laminated support sheet-dielectric elastomer film web is in a stretched state; and relaxing the laminated support sheet-dielectric elastomer film web to form the corrugated electrode on the dielectric elastomer film portion of the web. In some embodiments the support sheet may be material that is printed or deposited rather than laminated onto the dielectric elastomer film. It may require drying or curing as a subsequent process step. In other embodiments, a non-conductive material that is optionally rigid may be deposited onto the stretched surface before or after an electrode material.

In some variations, the electroactive polymer actuator comprises at least one electroactive polymer cartridge, where the electroactive polymer cartridge includes an electroactive polymer film comprising a dielectric elastomer layer, wherein a portion of the dielectric elastomer layer is provided between first and second electrodes wherein the overlapping portions of the electrodes define an active area comprising the active portion, whereupon application of a triggering signal to the electrodes causes movement of the active area to produce the haptic effect, and wherein the first and second electrodes comprise an electrically conductive material in a corrugated configuration.

The electroactive polymer actuator can include a plurality of discrete electroactive polymer cartridges coupled together, where the electroactive polymer actuator includes an increased active portion comprising each active area of each electroactive polymer cartridge.

As noted above, there remains a need to mass produce such electroactive polymer devices while maintaining the performance characteristics obtained through batch production or lower volume manufacturing processes.

The present disclosure provides a roll-to-roll manufacturing process for producing electroactive polymer cartridges with self-healing electrodes. These electrodes can undergo ablation around the dielectric failures in the electroactive polymer film, which would prevent current from flowing through the ablated failure points and forestall a catastrophic failure of the electroactive polymer device. In one variation, the process comprises continuously advancing a film of an elastomeric material from a supply of elastomeric material, optionally mechanically straining the film to create a first pre-strained film section that remains continuous with the supply of elastomeric material, supporting the film section such that the first film section comprises a supported portion and an unsupported portion, mechanically straining the film out of plane (e.g., applying a force orthogonal to a plane defined by the film), depositing an electrically conductive material on a first side of the unsupported portion of the first film section while the film section is under strain, relaxing the film to create at least a first corrugated electrode, and optionally mechanically straining the film in a direction orthogonal to a plane defined by the film, depositing the electrically conductive material on a second side of the unsupported portion of the first film section opposing the first electrode while the section in under strain, and relaxing the film to create at least a second corrugated electrode.

The strain of the film during the application of the electrically conductive material may be orthogonal to the plane defined by the film.

Another variation disclosed herein the present invention includes an electroactive polymer film for use in an electroactive polymer device prepared by a process comprising the steps of straining (deforming) a section of elastomeric film in a direction orthogonal to a plane defined by the film, applying an electrically conductive material to the strained section of the film, and relaxing the film to form a corrugated electrode. Two such films may be laminated together along the surfaces opposite the electrode surfaces.

Another variation disclosed herein the present invention includes affixing one or more frames, output bars, or flexures to the film surface.

These and other features, objects and advantages of the invention will become apparent to those persons skilled in the art upon reading the details of the invention as more fully described below. In addition, variations of the processes and devices described herein include combinations of the embodiments or of aspects of the embodiments where possible are within the scope of this disclosure even if those combinations are not explicitly shown or discussed.

BRIEF DESCRIPTION OF THE DRAWINGS

The invention is best understood from the following detailed description when read in conjunction with the accompanying drawings. To facilitate understanding, the same reference numerals have been used (where practical) to designate similar elements are common to the drawings. Included in the drawings are the following:

FIG. 8A illustrates a rigid polymer support for producing frames for electroactive polymer cartridges in accordance with one embodiment of the present invention;

FIG. 8B illustrates the rigid polymer support shown in FIG. 8A with frames, disks, and sprocket holes cut into the rigid polymer support in accordance with one embodiment of the present invention;

FIG. 8C illustrates the pre-cut rigid polymer support shown in FIG. 8B with a release layer applied on top of the rigid polymer support in accordance with one embodiment of the present invention;

FIG. 8D illustrates the pre-cut coated rigid polymer support shown in FIG. 8C with adhesive tape laminated to the pre-cut frames to hold the disks in place with respect to the frames in accordance with one embodiment of the present invention;

FIG. 8E illustrates the pre-cut coated rigid polymer support shown in FIG. 8D with ring shaped slugs ejected from the pre-cut frames and disks that would overlie the active area of the electroactive polymer cartridge in accordance with one embodiment of the present invention;

FIG. 8F illustrates a partial sectional view of a pre-strained dielectric elastomer film laminated between two sheets of rigid polymer supports processed in accordance with FIGS. 8A-8E in accordance with one embodiment of the present invention;

FIG. 11A is a cross-sectional view of an electroactive polymer cartridge in a relaxed state prior to the stretched deposition process in accordance with one embodiment of the present invention;

FIG. 11B is a cross-sectional view of the cartridge in a stretched state during the stretched deposition process in accordance with one embodiment of the present invention;

FIG. 11C is a cross-sectional view of the cartridge in a relaxed state after the stretched deposition process in accordance with one embodiment of the present invention;

FIG. 11D is an optional phase of the manufacturing process where the cartridge is turned over to apply an electrically conductive material to an active area of the cartridge in accordance with one embodiment of the present invention;

FIG. 11E is a cross-sectional view of the cartridge in a stretched state during the stretched deposition process in accordance with one embodiment of the present invention;

FIG. 11F is a cross-sectional view of the cartridge in a relaxed state after the stretched deposition process in accordance with one embodiment of the present invention;

FIG. 18 illustrates one aspect of a roll-to-roll manufacturing process for producing a rigid polymer support for an electroactive polymer cartridge in accordance with one embodiment of the present invention;

FIG. 19 illustrates one aspect of a roll-to-roll manufacturing process for laminating a pre-strained dielectric elastomer film between two rigid polymer supports in accordance with one embodiment of the present invention;

FIG. 20 is a continuous high-volume manufacturing process for producing electroactive polymer cartridges with self-healing corrugated electrodes in accordance with one embodiment of the present invention;

FIG. 22 illustrates a fatigue-resistant conductive bus to be applied on one side of an electroactive polymer cartridge in accordance with one embodiment of the present invention;

FIG. 23 illustrates a fatigue-resistant conductive bus to be applied on an opposite side of the electroactive polymer cartridge in accordance with one embodiment of the present invention;

FIG. 24 illustrates the fatigue-resistant conductive buses shown in FIGS. 22, 23 applied to both sides of the electroactive polymer cartridge in accordance with one embodiment of the present invention;

Figure 1A:
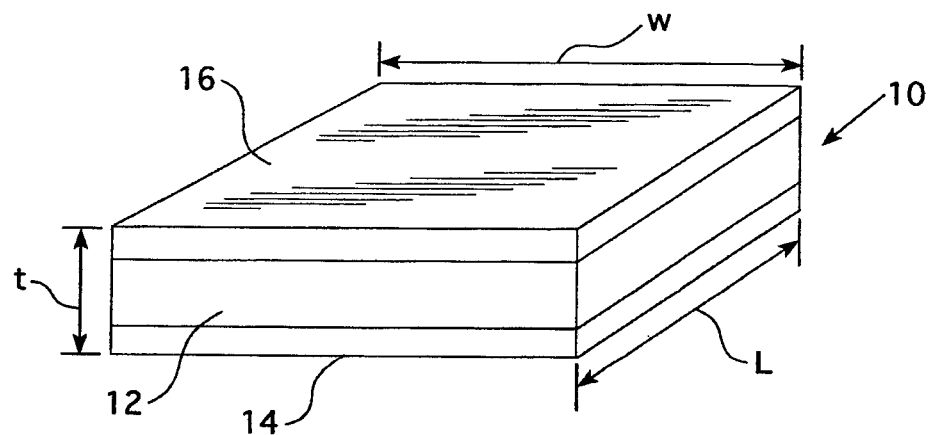
FIGS. 1A and 1B illustrate a top perspective view of a transducer before and after application of a voltage in accordance with one embodiment of the present invention.

Variation of the invention from that shown in the figures is contemplated.

DETAILED DESCRIPTION OF THE INVENTION

Examples of electroactive polymer devices and their applications are described, for example, in U.S. Pat. Nos. 7,394,282; 7,378,783; 7,368,862; 7,362,032; 7,320,457; 7,259,503; 7,233,097; 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971; 6,343,129; 7,952,261; 7,911,761; 7,492,076; 7,761,981; 7,521,847; 7,608,989; 7,626,319; 7,915,789; 7,750,532; 7,436,099; 7,199,501; 7,521,840; 7,595,580; and 7,567,681, and in U.S. Patent Application Publication Nos. 2009/0154053; 2008/0116764; 2007/0230222; 2007/0200457; 2010/0109486; and 2011/128239, and PCT Publication No. WO2010/054014, the entireties of which are incorporated herein by reference.

In various embodiments, the present invention provides a process for producing a patterned deformable polymer film for use in a deformable polymer device, the process including stretching an intermediary of a deformable film and applying a conductive material to the film while under the stretched state to form at least one electrode on a first surface of the deformable film, wherein the electrode obtains a corrugated configuration when the polymer film is returned to a relaxed state.

Films useful in embodiments of the present invention include, but are not limited to those made from polymers such as silicone, polyurethane, acrylate, hydrocarbon rubber, olefin copolymer, polyvinylidene fluoride copolymer, fluoroelastomer, styrenic copolymer, and adhesive elastomer.

Self-healing corrugated electrodes give dielectric elastomer transducers high reliability. Roll-to-roll metal deposition is the most viable means of producing these electrodes in volume. Thus, the roll-to-roll metal electrode manufacturing process outlined here provides a solution to the reliability problem that has hindered the commercial success of dielectric elastomer transducers for the last several years.

In various aspects, the manufacturing processes described herein employ a "button belt" for retrofitting a roll-to-roll sputtering chamber. In addition the process employs a temporary support (tape) to suspend an island (the disk) during lamination, then removing the temporary support after lamination. The process also employs a single pair of sprockets to precisely laminate a rigid/soft/rigid composite. The sprocket teeth align with sprocket holes in the lower/rigid polyethylene terephthalate (PET) layer, distend the soft polydimethylsiloxane (PDMS) intermediary layer like a cone pushing on the center of a drum head, and align the incoming/top/rigid PET layer.

It is noted that the figures discussed herein schematically illustrate exemplary configurations of devices and processes that employ electroactive polymer films or transducers having such electroactive polymer films. Many variations are within the scope of this disclosure, for example, in variations of the device, the electroactive polymer transducers can be implemented to move a mass to produce an inertial haptic sensation. Alternatively, the electroactive polymer transducer can produce movement in the electronic media device when coupled to the assembly described herein. Electroactive transducers manufactured with the processes disclosed here can be used as actuators, generators, or sensors in many other applications including, without limitation, fluid handling systems, motion control, adaptive optical devices, vibration control systems, and energy harvesting systems.

In any application, the displacement created by the electroactive polymer transducer can be exclusively in-plane which is sensed as lateral movement, or can be out-of-plane (which is sensed as vertical displacement). Alternatively, the electroactive polymer transducer material may be segmented to provide independently addressable/movable sections so as to provide angular displacement of the housing or electronic media device or combinations of other types of displacement. In addition, any number of electroactive polymer transducers or films (as disclosed in the applications and patent listed herein) can be incorporated in the user interface devices described herein.

The electroactive polymer transducer may be configured to displace to an applied voltage, which facilitates programming of a control system used with the subject tactile feedback devices. Electroactive polymer transducers are ideal for such applications for a number of reasons. For example, because of their light weight and minimal components, electroactive polymer transducers offer a very low profile and, as such, are ideal for use in sensory/haptic feedback applications.

Some embodiments of the present invention may be categorized into at least three processes. A first process comprises producing a web of electroactive polymer diaphragms. The first process comprises laser cutting or die cutting a rigid polymer sheet (e.g., a (0.005" PET) to define frames and disks; coating the PET with a water soluble release material (PVP); laminating adhesive tape to the polymer sheet, so that the disk is held fixed with respect to the frame; ejecting ring-shaped slugs formed between the ring and frame elements which would overly constrain the active area of the transducer if they were not removed; laminating this frame/disk film to both sides of a pre-strained dielectric; and removing the tape that held the disks in place. A surface of the rigid polymer sheet may be treated to modify its surface energy to prevent the formation of a conductive film in subsequent process steps. In a variation of this process the frames and disks are defined by printing or patterning coating material onto one or both surfaces of the electroactive polymer film. The coating material can be made rigid through thermal or photo-exposure.

Once the web of electroactive polymer diaphragms is produced, a second process is employed to apply an electrode formed of an electrically conductive material (e.g., a metal) onto the surface of the electroactive polymer diaphragms on the web. This process comprises stretching an individual electroactive polymer diaphragm in a direction orthogonal to a plane defined by the cartridge (e.g., out of plane force) and applying (e.g., sputtering) an electrically conductive material onto the surface of the electroactive polymer diaphragms in a roll-to-roll process.

After the metallization step, a third process may comprise stripping the metal from the surface of the rigid polymer sheet defining the electroactive polymer diaphragms; printing a fatigue-resistant carbon bus; printing an encapsulation layer; forming vias; and singulating the completed electroactive polymer transducers or cartridges from the web.

These and other processes are described in detail hereinbelow. Prior to describing such processes, however, FIGS.

1-4 provide a brief description of general electroactive polymer structures and processes for producing such structures.

Figure 1B:
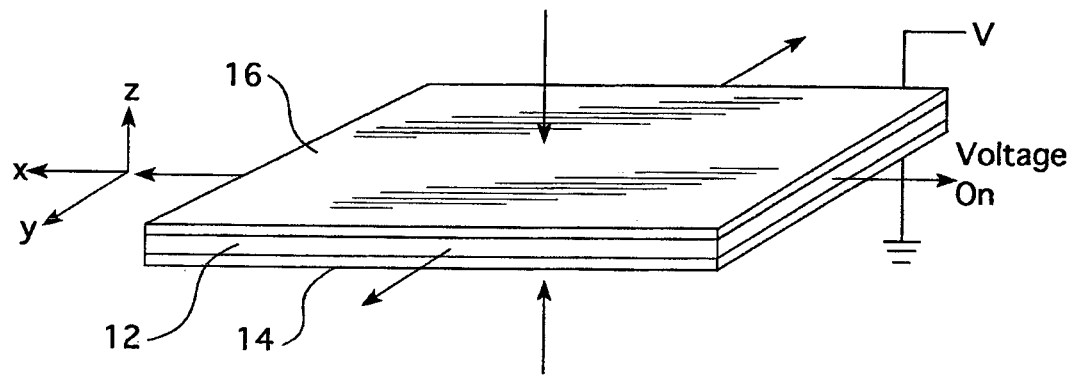

Accordingly, the description now turns to FIGS. 1A and 1B, which illustrate an example of an electroactive polymer film or membrane 10 structure. A thin elastomeric dielectric film or layer 12 is sandwiched between compliant or stretchable electrode plates or layers 14 and 16, thereby forming a capacitive structure or film. The length "l" and width "w" of the dielectric layer, as well as that of the composite structure, are much greater than its thickness "t". Preferably, the dielectric layer has a thickness in the range from about 10 μm to about 100 μm, with the total thickness of the structure in the range from about 15 μm to about 10 cm. Additionally, it is desirable to select the elastic modulus, thickness, and/or the geometry of electrodes 14, 16 such that the additional stiffness they contribute to the actuator is generally less than the stiffness of the dielectric layer 12, which has a relatively low modulus of elasticity, i.e., less than about 100 MPa and more preferably less than about 10 MPa, but is likely thicker than each of the electrodes. Electrodes suitable for use with these compliant capacitive structures are those capable of withstanding cyclic strains greater than about 1% without failure due to mechanical fatigue.

As seen in FIG. 1B, when a voltage is applied across the electrodes, the unlike charges in the two electrodes 14, 16 are attracted to each other and these electrostatic attractive forces compress the dielectric film 12 (along the Z-axis). The dielectric film 12 is thereby caused to deflect with a change in electric field. As electrodes 14, 16 are compliant, they change shape with dielectric layer 12. In the context of the present disclosure, "deflection" refers to any displacement, expansion, contraction, torsion, linear or area strain, or any other deformation of a portion of dielectric film 12. Depending on the architecture, e.g., a frame, in which capacitive structure 10 is employed (collectively referred to as a "transducer"), this deflection may be used to produce mechanical work. Various different transducer architectures are disclosed and described in the above-identified patent references.

With a voltage applied, the transducer film 10 continues to deflect until mechanical forces balance the electrostatic threes driving the deflection. The mechanical forces include elastic restoring forces of the dielectric layer 12, the compliance or stretching of the electrodes 14, 16 and any external resistance provided by a device and/or load coupled to transducer 10. The resultant deflection of the transducer 10 as a result of the applied voltage may also depend on a number of other factors such as the dielectric constant of the elastomeric material and its size and stiffness. Removal of the voltage and the induced charge causes the reverse effects.

In some cases, the electrodes 14 and 16 may cover a limited portion of dielectric film 12 relative to the total area of the film. This may be done to prevent electrical breakdown around the edge of the dielectric or achieve customized deflections in certain portions thereof. Dielectric material outside an active area (the latter being a portion of the dielectric material having sufficient electrostatic force to enable deflection of that portion) may be caused to act as an external spring force on the active area during deflection. More specifically, material outside the active area may resist or enhance active area deflection by its contraction or expansion.

The dielectric film 12 may be pre-strained. The pre-strain improves conversion between electrical and mechanical energy, i.e., the pre-strain allows the dielectric film 12 to deflect more and provide greater mechanical work. Pre-strain of a film may be described as the change in dimension in a direction after pre-straining relative to the dimension in that direction before pre-straining. The pre-strain may include elastic deformation of the dielectric film and be formed, for example, by stretching the film in tension and fixing one or more of the edges while stretched. The pre-strain may be imposed at the boundaries of the film or for only a portion of the film and may be implemented by using a rigid frame or by stiffening a portion of the film.

The transducer structure of FIGS. 1A and 1B and other similar compliant structures and the details of their constructs are more fully described in many of the referenced patents and publications disclosed herein.

Figure 2A:
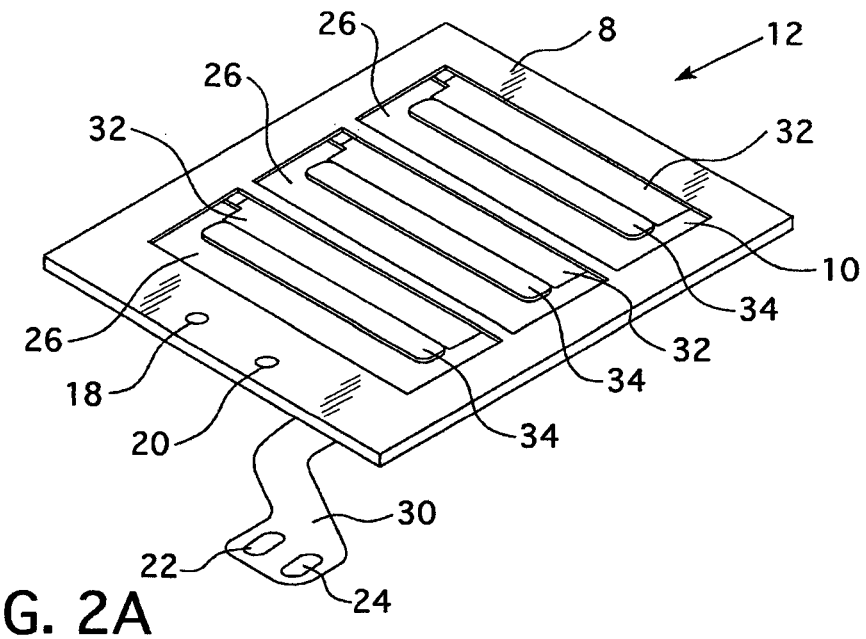
FIG. 2A illustrates an exemplary electroactive polymer cartridge in accordance with one embodiment of the present invention.

FIG. 2A illustrates an exemplary electroactive polymer cartridge 12 having an electroactive polymer transducer film 26 placed between rigid frame 8 where the electroactive polymer film 26 is exposed in openings of the frame 8. The exposed portion of the film 26 includes two working pairs of thin elastic electrodes 32 on either side of the cartridge 12 where the electrodes 32 sandwich or surround the exposed portion of the film 26. The electroactive polymer film 26 can have any number of configurations. However, in one example, the electroactive polymer film 26 comprises a thin layer of elastomeric dielectric polymer (e.g., made of acrylate, silicone, urethane, thermoplastic elastomer, hydrocarbon rubber, fluoroelastomer, copolymer elastomer, or the like). When a voltage difference is applied across the oppositely-charged electrodes 32 of each working pair (i.e., across paired electrodes that are on either side of the film 26), the opposed electrodes attract each other thereby compressing the dielectric polymer layer 26 therebetween. The area between opposed electrodes is considered the active area. As the electrodes are pulled closer together, the dielectric polymer 26 becomes thinner (i.e., the Z-axis component contracts) as it expands in the planar directions (i.e., the X- and Y-axes components expand) (See FIG. 1B for axis references). Furthermore, like charges distributed across each electrode may repel one another, thereby contributing to the expansion of the elastic electrodes and dielectric films. The dielectric layer 26 is thereby caused to deflect with a change in electric field. As the electrode material is also compliant, the electrode layers change shape along with dielectric layer 26. As stated hereinabove, deflection refers to any displacement, expansion, contraction, torsion, linear or area strain, or any other deformation of a portion of dielectric layer 26. This deflection may be used to produce mechanical work. As shown, the dielectric layer 26 can also include one or more mechanical output bars 34. The bars 34 can optionally provide attachment points for either an inertial mass (as described below) or for direct coupling to a substrate in the electronic media device.

In fabricating a transducer, an elastic film 26 can be stretched and held in a pre-strained condition usually by a rigid frame 8. In those variations employing a four-sided frame, the film can be stretched bi-axially. It has been observed that pre-strain improves the dielectric strength of the polymer layer 26, thereby enabling the use of higher electric fields and improving conversion between electrical and mechanical energy, i.e., the pre-strain allows the film to deflect more and provide greater mechanical work. Preferably, the electrode material is applied after pre-straining the polymer layer, but may be applied beforehand. The two electrodes provided on the same side of layer 26, referred to herein as same-side electrode pairs, i.e., electrodes on the top side of dielectric layer 26 and electrodes on a bottom side of dielectric layer 26, can be electrically isolated from each other. The opposed electrodes on the opposite sides of the polymer layer form two sets of working electrode pairs, i.e., electrodes spaced by the electroactive polymer film 26 form one working electrode pair and electrodes surrounding the adjacent exposed electroactive polymer film 26 form another working electrode pair. Each same-side electrode pair can have the same polarity, whereas the polarity of the electrodes of each working electrode pair is opposite each other. Each electrode has an electrical contact portion configured for electrical connection to a voltage source.

In this variation, the electrodes 32 are connected to a voltage source via a flex connector 30 having leads 22, 24 that can be connected to the opposing poles of the voltage source. The cartridge 12 also includes conductive vias 18, 20. The conductive vias 18, 20 can provide a means to electrically couple the electrodes 8 with a respective lead 22 or 24 depending upon the polarity of the electrodes.

An electroactive polymer actuator for use in the processes and devices described herein can then be formed in a number of different ways. For example, the electroactive polymer can be formed by stacking a number of cartridges 12 together, having a single cartridge with multiple layers, or having multiple cartridges with multiple layers. Manufacturing and yield considerations may favor stacking single cartridges together to form the electroactive polymer actuator. In doing so, electrical connectivity between cartridges can be maintained by electrically coupling the vias 18, 20 together so that adjacent cartridges are coupled to the same voltage source or power supply.

Figure 2B:
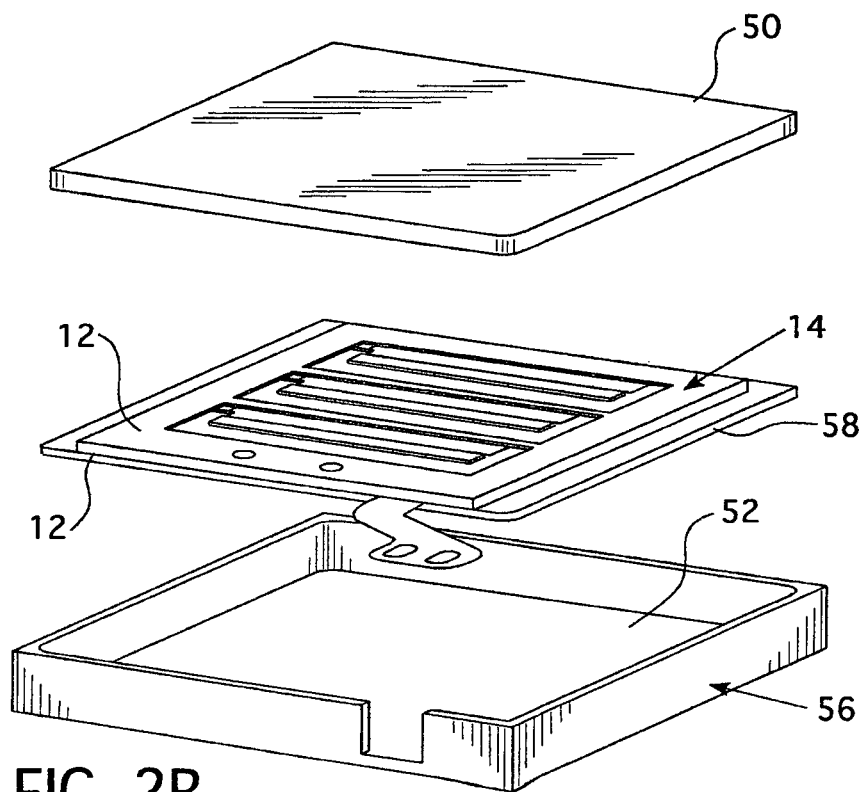
FIG. 2B illustrates an exploded view of an electroactive polymer actuator, inertial mass and actuator housing in accordance with one embodiment of the present invention.

The cartridge 12 shown in FIG. 2A includes three pairs of electrodes 32 separated by a single dielectric layer 26. In one variation, as shown in FIG. 2B, two or more cartridges 12 are stacked together to form an electroactive actuator 14 that is coupled to an inertial mass 50. Alternatively, the electroactive actuator 14 can be coupled directly to the electronic media device through a temporary attachment plate or frame. As discussed below, the electroactive actuator 14 can be placed within a cavity 52 that allows for movement of the actuator as desired. The pocket 52 can be directly formed in a housing of a haptic case. Alternatively, pocket 52 can be formed in a separate case 56 positioned within the housing of the device. If the latter, the material properties of the separate case 56 can be selected based upon the needs of the actuator 14. For example, if the main body of the haptic housing assembly is flexible, the separate case 56 can be made rigid to provide protection to the electroactive actuator and/or the mass 50. In any event, variations of the device and processes described herein include size of the cavity 52 with sufficient clearance to allow movement of the actuator 14 and/or mass 50 but a close enough tolerance so that the cavity 52 barrier (e.g., the haptic housing or separate case 56) serves as a limit to prevent excessive movement of the electroactive actuator 14. Such a feature prevents the active areas of the actuator 14 from excessive displacement that can shorten the life of the actuator or otherwise damage the actuator.

Additional examples of electroactive polymer films can be found in the commonly assigned patents and patent applications disclosed and incorporated by reference herein. Roll-to-roll manufacturing is a desirable way to produce high volumes of electroactive polymer devices. Roll-to-roll manufacturing comprises providing the unprocessed stock film material in a roll form, processing the material as the stock material unrolls and ultimately singulating the finished electroactive polymer devices at the conclusion of the assembly process. One can also have a roll-to-sheet process where the film is advanced by sections in a step-and-repeat fashion. The line is organized as a series of processing stations, and a film section is advanced from station to station along the web.

The final configuration of the electroactive polymer films presents challenges when trying to produce these films in high volume. For example, the materials are preferably pre-strained to a specific, well-controlled degree prior to assembly. Maintenance of a consistent web speed and tension and registration of multiple printing or patterning steps are especially difficult on a deformable substrate. Also, elastomeric materials are often prone to damage during the manufacturing process and this damage can limit performance and reliability of the finished devices.

To address these concerns and limitations, a novel process for producing electroactive polymer devices addresses the issues discussed above. In one variation the process includes separating the stock film material 300, typically a silicone, from a release liner (i.e., a liner of material that prevents the film from sticking together). The stock film material 300 may comprise any material used for fabrication of electroactive polymer devices such as disclosed in the references incorporated by reference herein. The roll-to-roll process can include rollers treated to release the stock film material 300 as it passes through the various manufacturing processes. For example, such treatment can include TEFLON coatings or other release (or non-stick) coatings that prevents the film from adhering to the roller. The rollers may also be covered with an intermediary layer such as an engineered surface, a removable liner, a compliant layer, or a deformable layer. Examples of engineered surfaces include, but are not limited to, parchment paper, textured surfaces, screen mesh, non-stick surfaces, and polymer sheets. Examples of deformable layers include, but are not limited to, foams and soft network materials such those made from ethylene vinyl acetate, silicone, olefins and polyurethanes. In an alternate variation, the process can include replacing the roll of the stock film material 300 with a feed direct from a coating or other manufacturing process that directly produces the film material 96.

As the film material 96 unwinds from the stock roll 300, a release liner 330 that separates layers of the film material 96 can be rewound 301. As noted herein, the film material 96 may be pre-strained. In the illustrated variation the film material 96 is stretched in a machine direction (direction parallel to the travel of the material 96) using, for example rollers 302 traveling at different speeds. The material 96 is then stretched in a transverse direction using a separate mechanism 304. Variations include simultaneously stretching the material 96 in a machine and transverse direction (i.e., biaxial stretchers). The desired stretch will depend upon the application as well as the desired performance of the electroactive polymer device. For example, the material can be stretched 30% in either or both the machine and transverse direction.

In some cases, it may be desirable to provide a layer of support to the film 96 after stretching. If so, a lamination layer 308 can be added to the film 96 to provide additional support for processing of the film. As discussed below, the lamination 308 also serves to reduce the occurrence of breaks in the film 96 as well as limit the breakage areas to non-critical sections of the film 96. This lamination layer 308 is sometimes referred to as a "rip-stop" layer or film. The rip-stop lamination layer may also include any number of openings that allow for further processing of the film 96. Though not shown, any number of cutouts can be included in the rip-stop layer 308 as long as the ability to provide support is not lost and the film 96 does not buckle during processing. The rip-stop layer 308 may comprise any number of polymeric materials, including polyethylene terephthalate, polyester and polycarbonate. The rip-stop layer 308 may have a surface treatment to optimize its interaction with the film 96. To provide sufficient support and tear resistance, the rip-stop layer 308 should have good surface blocking or bond to the film 96. Accordingly, the rip-stop layer 308 can be laminated to the film 96 using an adhesive layer, coatings, or tape. Preferably, the rip-stop layer 308 may include openings that allow for further processing of the film 96 into the electroactive polymer device. These openings may be created by any conventional process such as stamping, cutting, etching, etc. Although the laminated film 96 with rip-stop 308 can proceed through the manufacturing process, as illustrated in FIG. 3A, alternate variations of the process can include re-winding the film 96 after lamination with the rip-stop layer 308.

A printed layer can be used as an alternative to a laminated rip-stop layer. The printed material can be any material that can be applied to the film and cured or dried in place that is tougher and more tear resistant than the film. Examples of suitable materials include, but are not limited to, polyurethanes, silicones, acrylates, and epoxy systems.

Next, the film 96 with rip-stop 308 is fed through one or more electrode printing assemblies 310. The electrode printing assembly 310 may also optionally print the bus bar connection for the electrodes on both sides of the film 96. Any number of web-printing processes can produce the electrodes necessary for the electroactive polymer device, including flexographic printing, gravure (also called rotogravure or roto printing), screen printing, rotary screen printing, ink jet printing, aerosol jet printing, etc. The printing process may be adjusted for the offset caused by the openings in the rip-stop layer (for example, the print rollers can have raised bosses that are timed to print on the unlaminated portion of the film 96). Furthermore, registration of the film 96 web positions may be necessary to ensure electrodes are printed within the openings of the rip-stop lamination as well as on the web of film 96. Any such registration commonly used in printing or similar applications may be applied to the process disclosed herein.

Figure 3A:
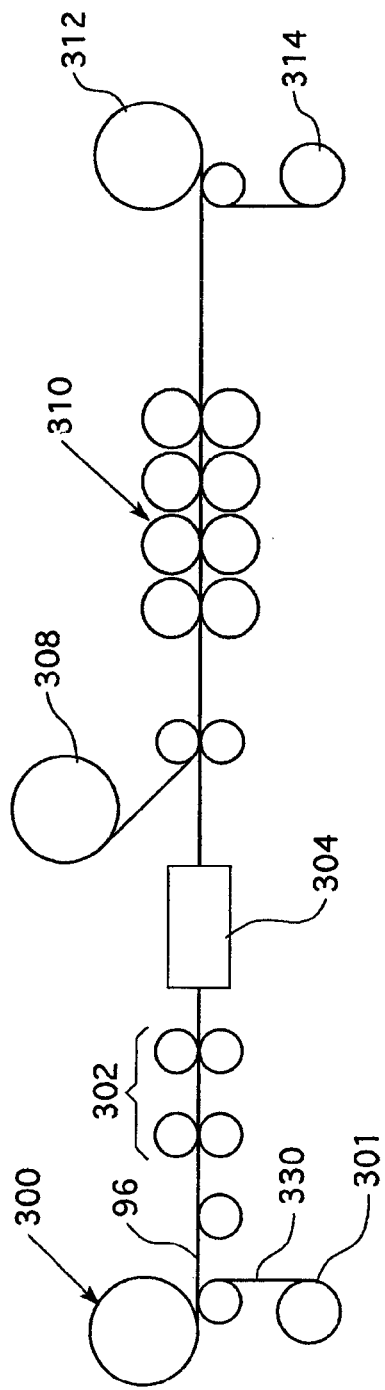
FIG. 3A illustrates a schematic roll-to-roll process for preparing an elastomeric film into an electroactive polymer film in accordance with one embodiment of the present invention.

FIG. 3A also illustrates printing occurring on both surfaces of the film 96. As noted above, electrode placement is required on each side of the film 96. In alternate variations of the process, printing can occur on a single side of the film 96, which is then rewound and reprocessed with printing occurring on the opposite side in a subsequent process. Alternatively, the single-sided printed film may be stacked or laminated where the single electrode can be used to service two adjacent films in a multilayer stack. In any case, registration may be necessary to ensure that printing of electrodes on opposing sides of the film material and on different sections of the film is within manufacturing tolerances.

In one embodiment, the electrodes can be printed on one side or both sides of the film 96 by first stretching the film 96 in a direction orthogonal to a plane defined by the film 96 and then printing the electrode material onto the pre-stretched film 96. When the film 96 is subsequently relaxed, the printed electrode forms a corrugated electrode. Specific processes and materials used in forming corrugated electrodes on a film are described in detail in connection with FIGS. 5-29 and are generally referred to throughout this description as stretched deposition processes.

Once the electrodes are placed on the film 96, the film 96 can be re-wound 312 with an interleaf or separation layer 314 positioned between layers of the film 96. Alternatively, the film 96 can continue for additional processing to assemble the electroactive polymer frame and support structures as described herein.

Figure 3B:
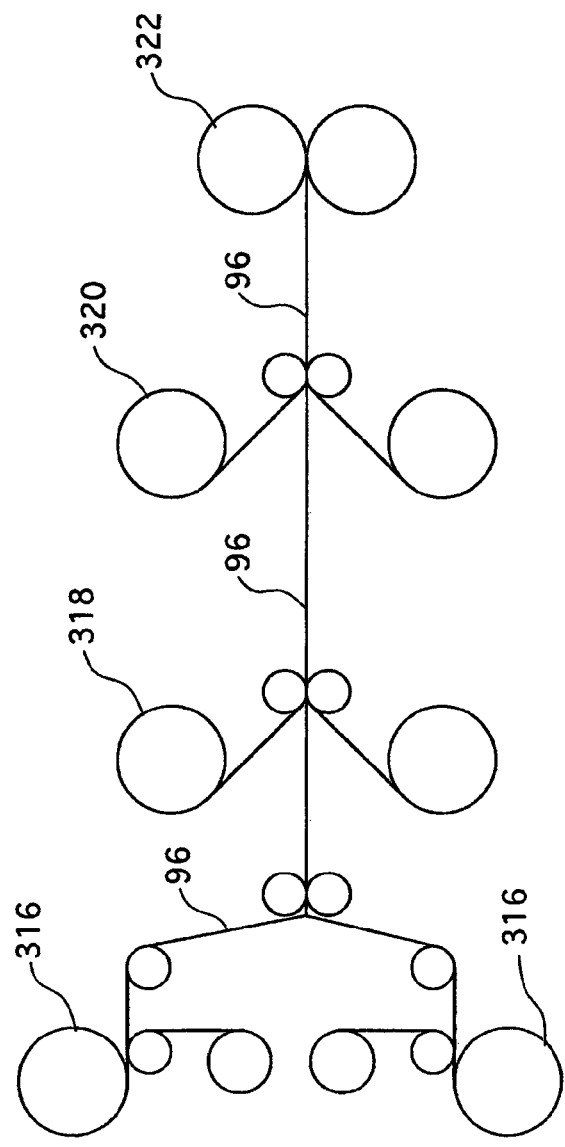
FIG. 3B illustrates two rolls of electroactive polymer films being combined to produce an electroactive polymer device in accordance with one embodiment of the present invention.

FIG. 3B illustrates an example of further processing of the printed elastomeric film 96 material in a process that produces a double layered electroactive polymer device. As shown, two sources of the printed film 96 can be fed 316 or unwound and joined to form a double layer of electroactive polymer film 96. The film may optionally be bonded or laminated depending upon the desired application. Next, one or more cartridge frames 318 may be added or bonded to the film 96 on both sides of the double layered electroactive polymer film 96. In addition to placement of the frames, one or more output bars or center discs 320 may be positioned by each electrode on the opposing sides of the double layer electroactive polymer film 96. Structural elements such as flexures may also be placed onto the film. Additional printing stations may be used to print adhesives or structural materials for the frames, flexures, and output bars. Finally, the finished electroactive polymer devices can be removed from the web (e.g., die cut, punched, laser cut, etc.). Clearly, variations of the process may include removal of the materials after any stage of processing so the device can be completed in a batch process rather than on the conveyor assembly system. Moreover, variations of the process include re-winding of the finished electroactive polymer device for subsequent removal.

In an alternate variation, a process for fabricating an electroactive polymer device may include UV, thermal, or surface treatment of the elastomeric polymer. The present inventors have found that UV treatment of the film prior to depositing electrodes on the film results in improved stroke performance of the finished actuator. Although not wishing to be bound to any particular theory, the present inventors believe UV exposure, silicone, polyurethane, acrylate, hydrocarbon rubber, olefin copolymer, polyvinylidene fluoride copolymer, fluoroelastomer, styrenic copolymer, and adhesive elastomer may change the surface energy of the film to improve uniformity of the electrode deposition. Further, the inventors speculate that UV treatment may change the bulk modulus or other properties of the elastomer making it more compliant and UV treatment may modify residual functional groups in the polymer film that cross-link during thermal loading in the manufacturing process.

Regardless of the actual mechanism, the present inventors have found UV treatment is an effective way to improve the stroke performance of actuators. In one example, UV treatment improved a pulse response of an actuator by 20% and characterized the actuators with lower resonant frequency as compared to a non-UV treated elastomer. The parameters for UV treatment will vary depending on a number of factors and the desired application of the end electroactive polymer device. In one example, it was found that UV curing of 6.5-7.0 1/cm$^2$ was an optimum point of UV treatment that improved stroke performance for actuators. Another unexpected benefit of UV treatment (prior to deposition of electrodes) is that the queue time between UV treatment and electrode printing was not a sensitive factor. In the study conducted by the present inventors, the queue time could last as long as 25 days. This finding may potentially allow for UV treatment during or immediately after pre-straining the film. In some cases, it may be possible to treat the elastomer during film manufacture so that the benefits are retained from when the elastomeric film is made to when the film is processed as described herein.

One of the problems with attempting to use roll-to-roll manufacturing for elastomeric films (such as silicone) is that the film is relatively thin (e.g., 23 μm) while having a very low modulus. The compliant film cannot remain flat without applying pre-strain but at the same time, the film can tear or break easily. Furthermore, to ensure that the device is manufactured to meet high actuator performance, the film requires a high level of applied strain during printing and lamination. Without a frame to hold and maintain the pre-strain, the electrode pattern printed on the film has a high chance of deforming and registration of the printed patterns is likely to be poor. If the film deforms during the printing operations, the film may be rendered non-functional for use in the electroactive polymer actuators.

To address this issue, a variation of the inventive manufacturing process includes applying a uni-axial pre-strain to the electroactive polymer film. Experiments have shown that uni-axial strain can match the stroke performance of regular bi-axial pre-strained films under certain conditions.

Uni-axial pre-strain magnitude can be defined by an index of thickness, the same as biaxial pre-strain after stretching. For example, uni-axial strain (67% thickness direction and 0% strain in XY direction) and biaxial strain (30% in two directions) can have similar film thickness ranges. The longer output bar direction is parallel to the uni-axial pre-strain direction.

Figure 4A:
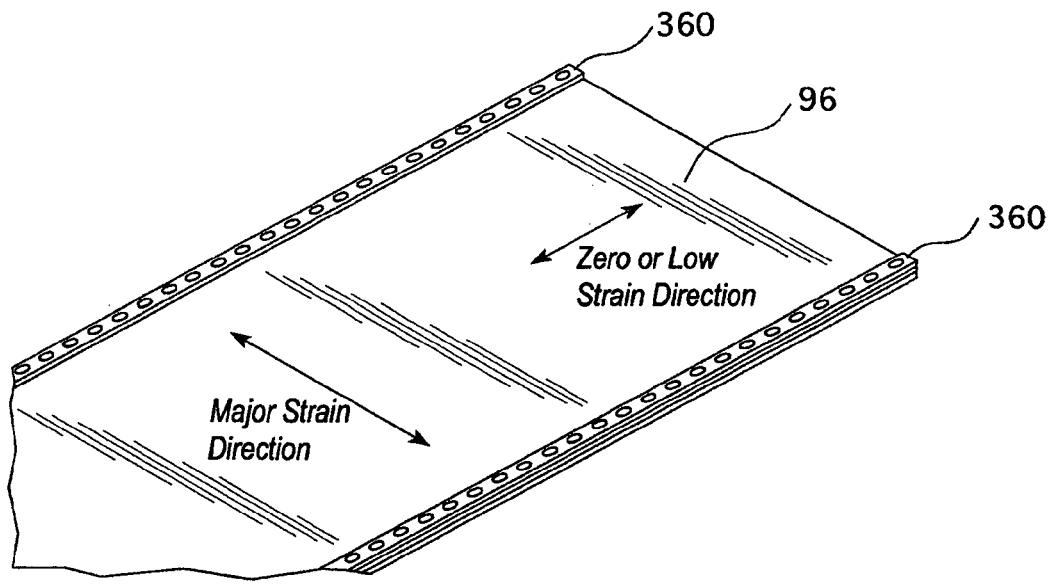
FIGS. 4A and 4B illustrate an example of using a stiff belt member to assist in controlling the desired strain on an elastomeric film in accordance with one embodiment of the present invention.
Figure 4B:
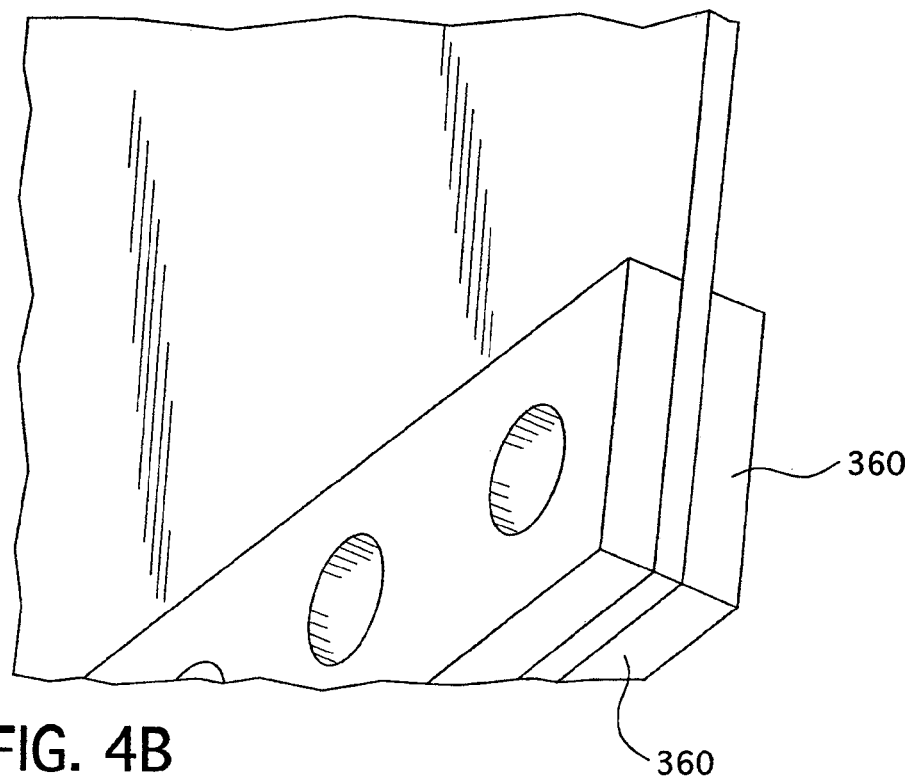

To achieve uni-axial pre-strain in a roll-to-roll system, perforated belts 360, as shown in FIGS. 4A and 4B, may be used to hold the two edges of the elastomeric film 96 in the web (longitudinal) direction. The uni-axial strain may be applied by stretching the film in lateral direction, while in the web direction there is zero or low pre-strain. The output bar of the electroactive polymer cartridge can be designed to be perpendicular to the web direction.

The lateral and longitude position of the belts 360 can be controlled precisely through the perforation rollers so the local strain will be consistent and stable. This allows for multiple printing and drying/curing steps as described herein. The major strain is defined by the distance between two belts 360 on the two long edges of elastomeric film 96.

The belts 360 may be constructed from a material that is much stiffer than the elastomeric film. For example, the belts 360 can comprise polyethylene terephthalate, which has a Young's Modulus between 2800-3100 MPa and tensile strength is 55-75 MPa. In contrast, silicone (a common material for the elastomeric film) generally has a Young's Modulus of 0.1-5 MPa and tensile strength is 5-8 MPa. Accordingly, polyethylene terephthalate is about 1000 times stiffer than silicone film.

When applying tension through the rollers 362, the majority of force will be applied to the polyethylene terephthalate belt 360 rather than the film 96. For example, assuming 5% elongation on the web, 400 out of 401 parts of force is applied on the polyethylene terephthalate belt while 1 part is applied on silicone film (assuming polyethylene terephthalate is 50 μm thick and 25 mm wide; while silicone film is 25 μm thick and 500 mm wide). This avoids the need to use tension rollers directly on the silicone film to control the strain of the film. If tension rollers were used, any small change in tension applied to the silicone film would lead to a great change in film elongation which would be difficult to control.

Biaxial stretching may be accomplished with perforated belts if the belts are constructed of stretchable material or are segmented, e.g. with perforated lines, so sections of the belt can separate upon stretching along the web direction while remaining engaged with the perforated rollers or guide chains along the edge of the web.

The exemplary electroactive polymer cartridges described hereinabove may comprise corrugated electrodes to improve continued operation and significantly extend the lifetime of the electroactive polymer cartridges. The high-volume roll-to-roll manufacturing processes described above also may be adapted to produce electroactive polymer cartridges comprising corrugated electrodes. A description of various embodiments of electroactive polymer cartridges comprising corrugated electrodes and high-volume roll-to-roll manufacturing processes for producing them are described hereinbelow. By way of context, a corrugated thin metal film is capable of stretching for many cycles without breaking, thus, making it suitable for use as an electrode deposited on a dielectric elastomer film diaphragm. The main advantage of corrugated electrodes is the ability to self-heal when a fault occurs, allowing continued operation of the electroactive polymer cartridge. High-volume roll-to-roll manufacturing processes for the producing electroactive polymer cartridges comprising dielectric elastomer films with corrugated electrodes formed thereon are described in connection with FIGS. 5-29.

There are two main approaches to producing corrugated electrodes on the surface of a dielectric elastomer film. The first approach is by a molding process and the second approach is by a stretched deposition process.

The molding approach, developed by the Danish Polymer Institute and Danfoss, involves casting a dielectric elastomer film on a corrugated carrier (the mold) so that the bottom surface is corrugated and the top surface is flat, and then laminating two such dielectric elastomer films back-to-back so that both outward facing surfaces are corrugated. This molding/lamination method has some drawbacks.

One drawback is the need for a mold. One technique employs a spin casting polydimethylsiloxane (PDMS) on an etched silicon wafer, however, this is not scalable to the production of thousands of square meters of dielectric per year. Volume production would require development of a release film for dielectric casting with 1×10 μm corrugations. Another drawback involves release stress. If a thin dielectric is desired (e.g., <30 μm total) then two 15 μm thick layers must be produced. It is difficult to peel a thin (15 μm), layer of soft elastomer from a flat carrier without tearing or deforming it. It would be more difficult still to get the elastomer off of a textured carrier. Yet another drawback with the molding/lamination approach is registration. A diaphragm actuator requires circular corrugations. Considerable time and cost might be required to correctly register other parts (e.g. frames, output disks) with corrugated areas of the dielectric, particularly once pre-strain is applied prior to placement of those parts.

Accordingly, although none of the drawbacks associated with the molding/casting process are insurmountable, the stretched deposition process may be more readily adapted to a roll-to-roll manufacturing process. Accordingly, the remainder of this disclosure will be primarily focused on the stretched deposition process. Nevertheless, other processes for forming corrugated electrodes, such as the molding process, are still contemplated as being within the scope of the present invention.

In a stretched deposition process for producing electrical interconnects, metal or any suitable electrically conductive material is deposited or applied on a flexible diaphragm while the diaphragm is stretched in a direction orthogonal to a plane defined by the flexible diaphragm. In electroactive polymer cartridges, the flexible diaphragms are made of dielectric elastomer film. Therefore, corrugated electrodes are formed on the dielectric elastomer film. After the stretched deposition process (e.g., metallization) the flexible diaphragm is (e.g., dielectric elastomer film) is relaxed to produce corrugations. No mold is required. Further, rigid components placed on the dielectric elastomer film diaphragm before the stretched deposition process enables stretching of the dielectric elastomer film. Subsequently, registration of the corrugations with the rigid components of the electroactive polymer cartridge actuator occurs automatically when the dielectric elastomer film is relaxed. The stretched deposition process can be scaled to high volume production using commercially available, roll-to-roll equipment such as sputtering equipment, for example. Non-conductive materials can be deposited in a similar fashion. This enables the incorporation of higher modulus materials such as silica or polycarbonate into the material layer stack which could serve the purpose of barrier layers, encapsulants, discharge suppression layers, and the like, without degrading the performance of the electroactive polymer device.

High-volume roll-to-roll manufacturing of electroactive polymer cartridges is facilitated when they are provided in the form of a web and the application equipment (e.g., sputtering, printing, spraying, depositing, etc.) holds the cartridges in a stretched state during the deposition process. Various structures and techniques for holding the cartridges in a stretched state during the deposition process are disclosed hereinbelow in connection with FIGS. 15, 16, and 21.

Figure 5:
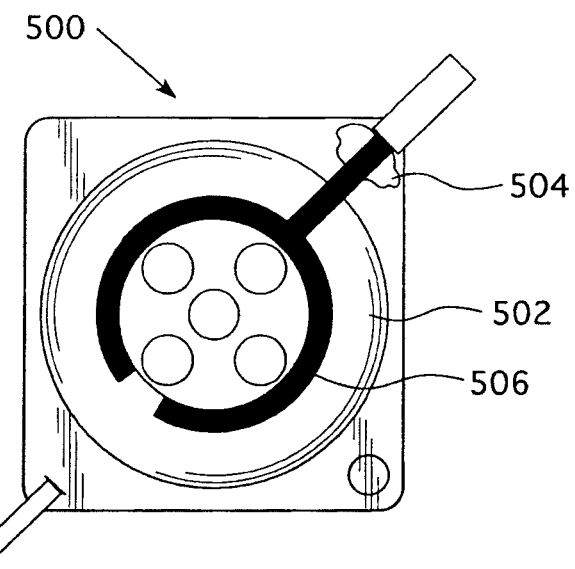
FIG. 5 illustrates a electroactive polymer cartridge with self-healing corrugated electrodes and a fatigue-resistant conductive bus in accordance with one embodiment of the present invention.

FIG. 5 illustrates an electroactive polymer cartridge 500 comprising a self-healing corrugated electrode 502 formed on the dielectric elastomer film by a stretched deposition process in accordance with one aspect of the present invention. A thin film connection 504 may be provided to connect the corrugated electrode 502 to a voltage power supply. As described in more detail hereinbelow, the corrugated electrode 502 may be formed by applying or depositing any suitable electrically conductive material onto a stretched dielectric elastomer film. In the illustrated embodiment, the self-healing corrugated electrode 502 is formed of a silver (Ag) electrically conductive material. Other electrically conductive materials include, for example, gold, copper, carbon, palladium silver, conductive polymers, conductive inks, among others.

The electroactive polymer cartridge 500 also includes a fatigue-resistant conductive bus 506, which will be described hereinbelow in connection with FIGS. 22-28. In one embodiment, the fatigue-resistant conductive bus 506 is formed of carbon, although any suitable conductive material may be employed provided that it is compliant to span and fill mechanical cracks that may develop on the corrugated electrodes 502. Conductive inks that include carbon or carbon compounds may be employed for this purpose, for example.

A high-volume roll-to-roll manufacturing process for producing electroactive polymer cartridges 500 comprising corrugated electrodes 502 by a stretched deposition process begins by laminating a pre-strained (stretched) dielectric elastomer film between two rigid polymer supports. The dielectric elastomer film is stretched in a direction that is orthogonal to a plane defined by the film and held in that position while the electrically conductive material is applied. Subsequently relaxing the dielectric elastomer film produces the corrugations in the electrode.

Figure 6:
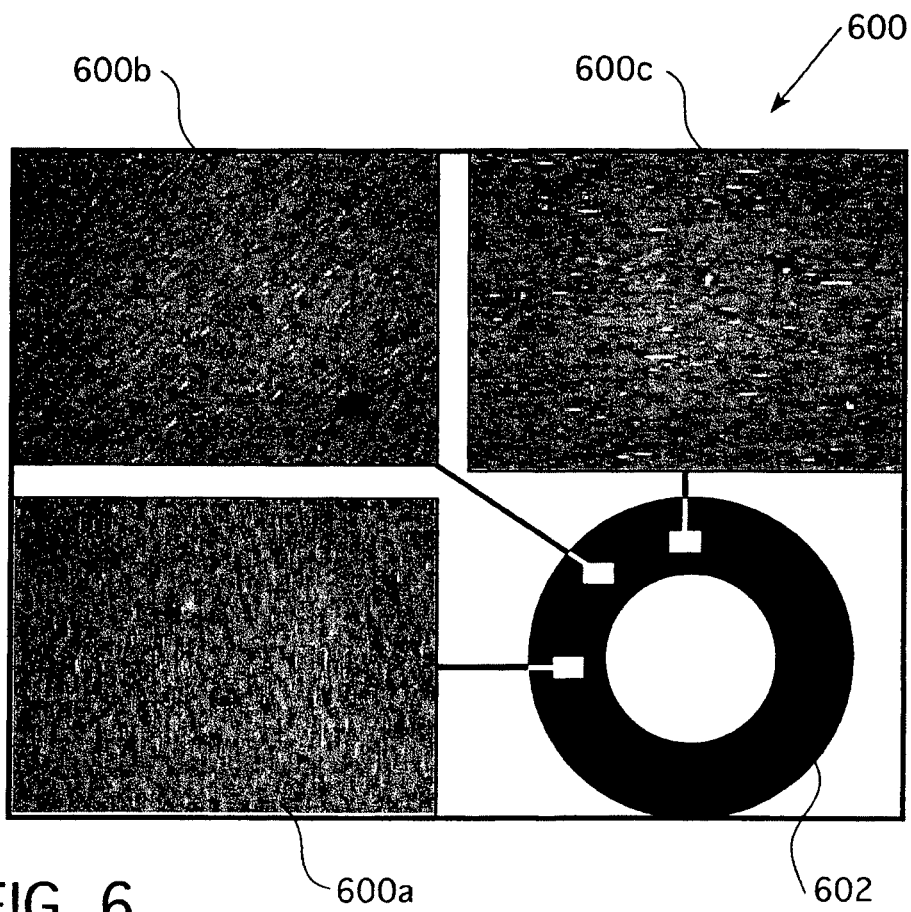
FIG. 6 illustrates a micrograph detail of circumferential corrugated electrodes produced in accordance with one embodiment of the present invention.

FIG. 6 illustrates a micrograph detail 600 of corrugated electrode 602 produced by a stretched deposition process in accordance with one aspect of the present invention. The three-sub details 600a-600c show that the corrugations form circumferentially in a circular direction.

Figure 7:
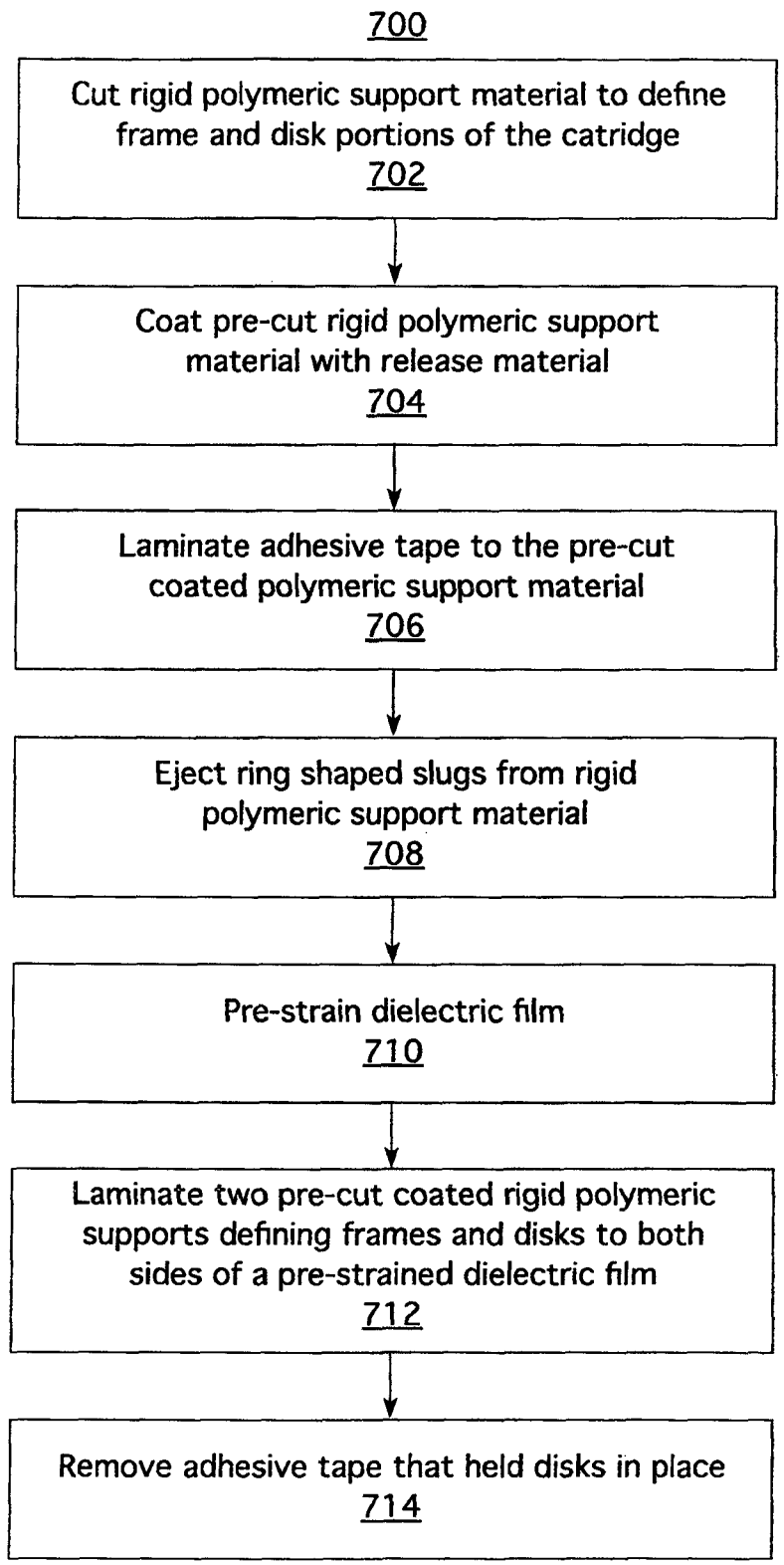
FIG. 7 is a flow diagram of a process for preparing a rigid polymer support web for producing corrugated electrodes on an electroactive polymer cartridge in accordance with one embodiment of the present invention.

FIG. 7 is a flow diagram 700 of a process for preparing a rigid polymer support web for producing corrugated electrodes on electroactive polymer cartridges in accordance with one embodiment of the present invention. Initially, a rigid polymer support material is cut 702 to define frame and disk portions of the electroactive polymer cartridge. The pre-cut rigid polymer support material is then coated 704 with a release material. An adhesive tape is subsequently laminated 706 to the pre-cut coated rigid polymer support material such that the disks are held in fixed relation with respect to the frames. Ring-shaped slugs are formed between the ring and frame elements are then ejected 708 from the support material. The ring-shaped slugs are lifted by pins on an underlying drum and scooped off by prongs into a collection box. The pre-cut coated rigid polymer support web is now ready to be wound on a stock roll for later lamination to a pre-stretched dielectric elastomer film or, in a continuous process, may be fed directly to a lamination station where the pre-cut coated rigid polymer support web is laminated with a pre-stretched dielectric elastomer film.

In a separate process, although it may be inline with the processes 702-708, a dielectric elastomer film is pre-strained 710 in a planar direction as described in connection with FIGS. 3A, 4A. Then, two webs pre-cut coated rigid polymer supports are laminated 712 to both sides of the pre-strained dielectric elastomer film. The adhesive tape that held the disks in place also is removed 714. The output of the process illustrated by flow diagram 700 is a laminated pre-strained dielectric elastomer film web 814 (FIG. 8F), referred to herein as a "laminated support/film web." The laminated support/film web is suitable for use in the stretched deposition process for producing corrugated electrodes. The laminated support/film web can be rolled in a stock roll to be later used in the stretched deposition electrode corrugation. In applications such as high-volume roll-to-roll manufacturing processes, however, the laminated support/film web is fed directly to the stretched deposition process. The process illustrated in flow diagram 700 is further explained below in connection with FIGS. 8A-8F FIG. 8A illustrates a rigid polymer support 800 for producing the frame and disk structures of the electroactive polymer cartridges in accordance with one aspect of the present invention. In one embodiment, the rigid polymer support 800 may comprise any number of polymeric materials, including PET, polyester, polycarbonate, among others. The rigid polymer support 800 may have thickness dimensions in the range of about 0.0025 inch (63.5 μm) to 0.05 inch (1.27 mm) and preferably about 0.005 inch (127 μm), for example.

Figure 8A:
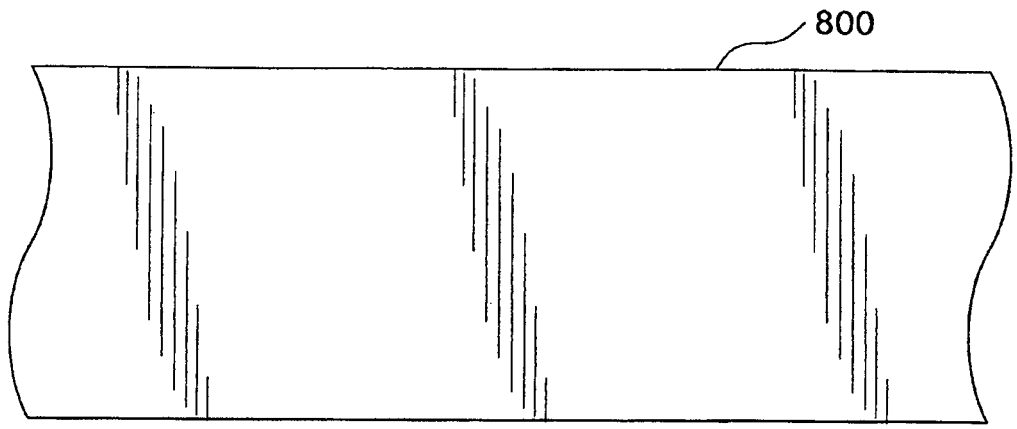
FIGS. 8A-8F illustrate a process for preparing a rigid polymer support for producing electroactive polymer cartridges comprising corrugated electrodes in accordance with one embodiment of the present invention, where.
Figure 8B:
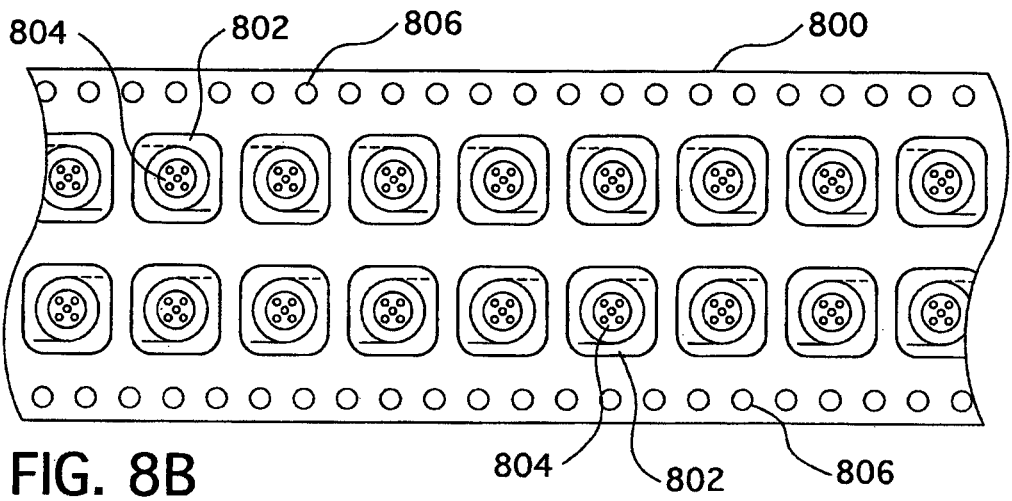

FIG. 8B illustrates the rigid polymer support 800 shown in FIG. 5A with frames 802, disks 804, and sprocket holes 806 cut into the rigid polymer support 800 for later lamination with a dielectric elastomer material. The frames 802 and disks 804 can be cut into the rigid polymer support 800 using any suitable technique, such as for example, laser cutting, die cutting, razor cutting, milling, among others. The sprocket holes 806 perforations also may be punched out by pins or sprockets on a perforation roller. Alternatively, the sprocket holes 806 may be drilled or cut as part of the overall manufacturing process. In one embodiment, the sprocket holes 806 may be formed by laser cutting or die cutting at the same time the frames 802 and disks 804 are cut into the rigid polymer support 800. The sprocket holes 806 are configured and spaced to align with sprocket teeth on a drum to ensure a tight <<0.002 inch (50.8 μm) error in registration during the lamination and/or the stretched deposition process in accordance with one embodiment of the present invention.

Figure 8C:
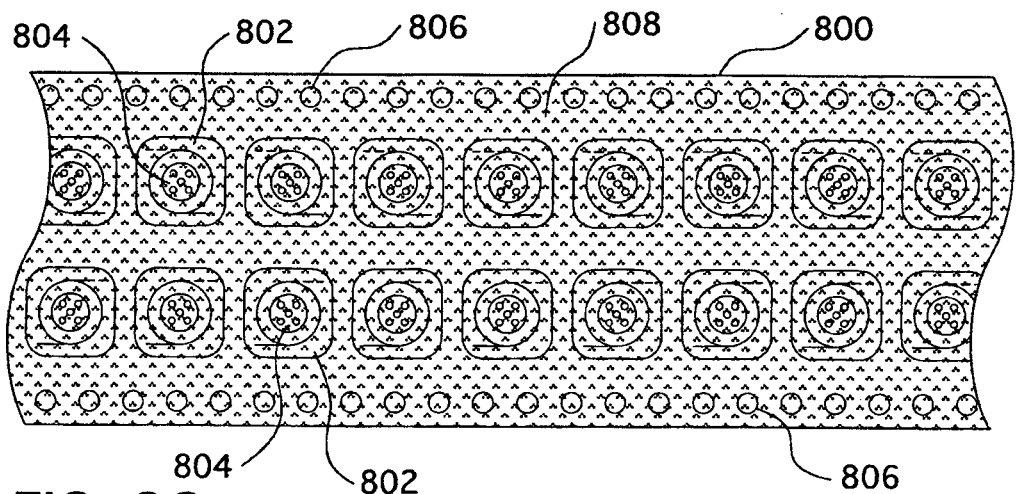

FIG. 8C illustrates the pre-cut rigid polymer support 800 shown in FIG. 8B with a release layer 808 applied on a top surface of the rigid polymer support 800. The release layer 808 may be any suitable layer that enables the electrically conductive material applied to the rigid polymer support 800 during the stretched deposition process to be stripped or removed. Without the release layer 808, the electrically conductive material applied during the stretched deposition process would be difficult to remove from the rigid polymer support 800. In one embodiment, the release layer 808 may be a water soluble material. In one embodiment, the release layer 808 may be formed of any suitable water-soluble polymer, such as, for example, PVP. In one embodiment, the water-soluble polymer may be applied to the PET support layer at a thickness of about 0.1 µm or less to 0.3 µm and preferably about 0.2 µm. After the water-soluble PVP polymer is applied to the PET support, it can be dried by any suitable heat source such as, for example, a heat lamp or an infrared heat lamp, among others. The PVP release layer 808 enables the electrically conductive layer applied to the PET support during the stretched deposition process to be stripped off or removed. In a roll-to-roll manufacturing process, the PVP release layer 808 may be stripped using multiple cylinders or rolls and the application of a water mist. Tacky rolls may also be used to remove the electrically conductive material from the support layer when the support layer has been treated to prevent the formation of a continuous film of electrically conductive material.

Figure 8D:
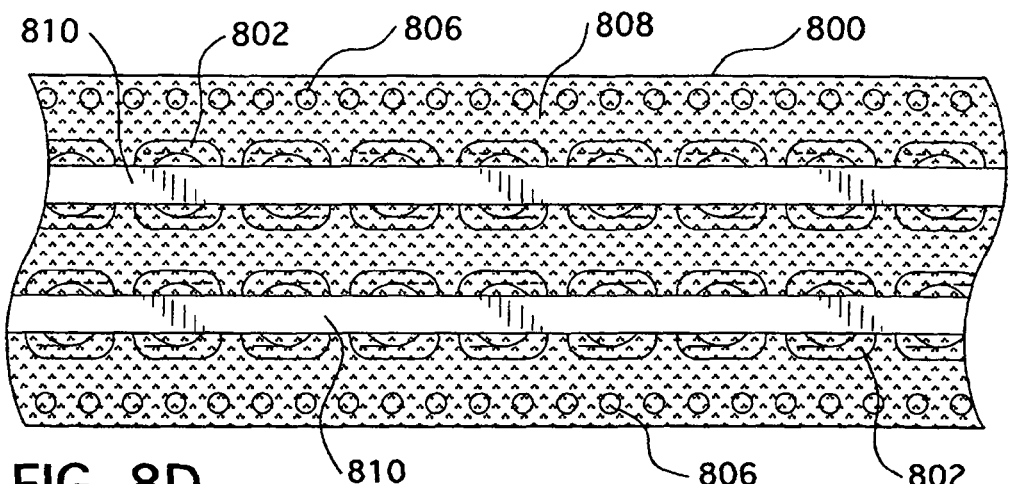

FIG. 8D illustrates the pre-cut coated rigid polymer support 800 shown in FIG. 8C with adhesive tape 810 laminated to the pre-cut frames 802 to hold the disks 804 in place with respect to the frames in accordance with one embodiment of the present invention. In one embodiment, the adhesive tape 810 may be a 3M 218 low profile adhesive tape. The adhesive tape 810 may be applied by a tape laminator station of a roll-to-roll manufacturing process, as described in more detail hereinbelow.

Figure 8E:
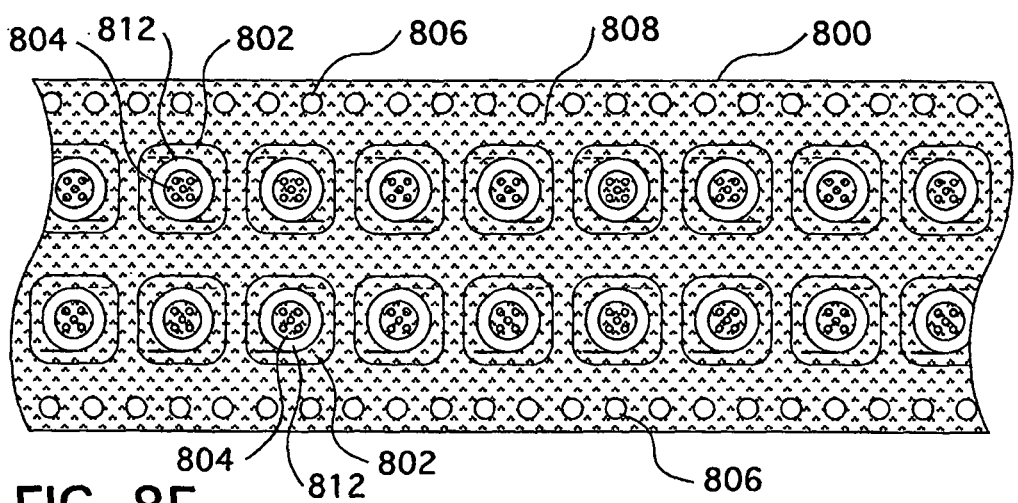

FIG. 8E illustrates the pre-cut coated rigid polymer support shown in FIG. 8D with ring shaped slugs defined between the ring 804 and frame 802 elements are ejected from the pre-cut frames 802 and disks 804 that would overlie the active area of the electroactive polymer cartridge in accordance with one embodiment of the present invention. After the ring shaped slug is ejected, a ring shaped opening 812 is left in the pre-cut coated rigid polymer support 800 that will expose a corresponding portion of dielectric polymeric film defined as the active area. This active area is coated with an electrically conductive material during the stretched deposition process to form a corrugated electrode.

Figure 8F:
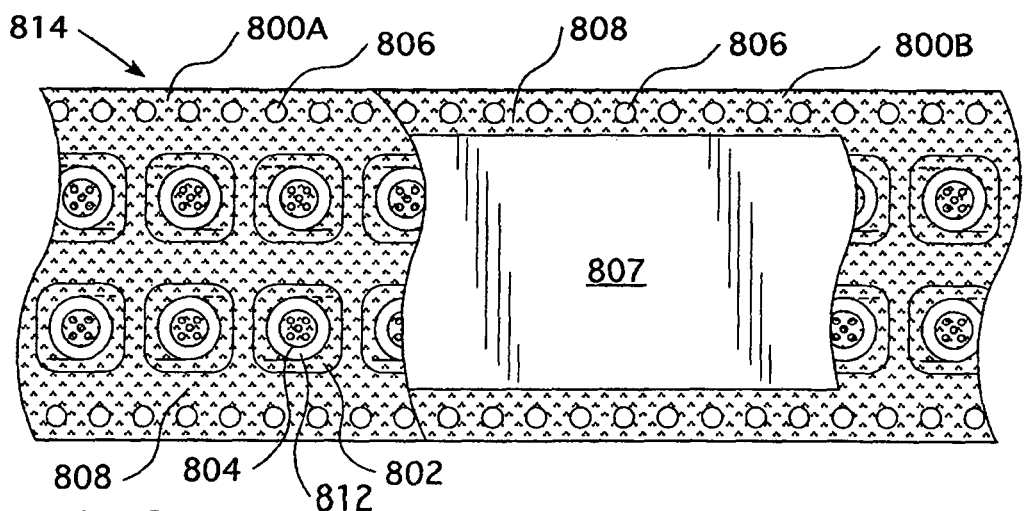

FIG. 8F illustrates a partial sectional view of a pre-strained dielectric elastomer film 807 laminated between two sheets of rigid polymer supports 800A, 800B processed in accordance with FIGS. 8A-8E in accordance with one embodiment of the present invention. After the ring shaped slugs are removed from the web, a dielectric elastomer film 807 is pre-strained and laminated between two pre-cut coated rigid polymer supports 800A, 800B to form a laminated support/film web 814 as shown in FIG. 8F, where the pre-strained dielectric elastomer film 807 is laminated between two sheets of the rigid polymer supports 800A, 800B, processed in accordance with FIG. 7, to form a laminated support/film web. The laminated support/film web is then ready to advance to the roll-to-roll stretched deposition process according to various aspects of the present invention.

Figure 9A:
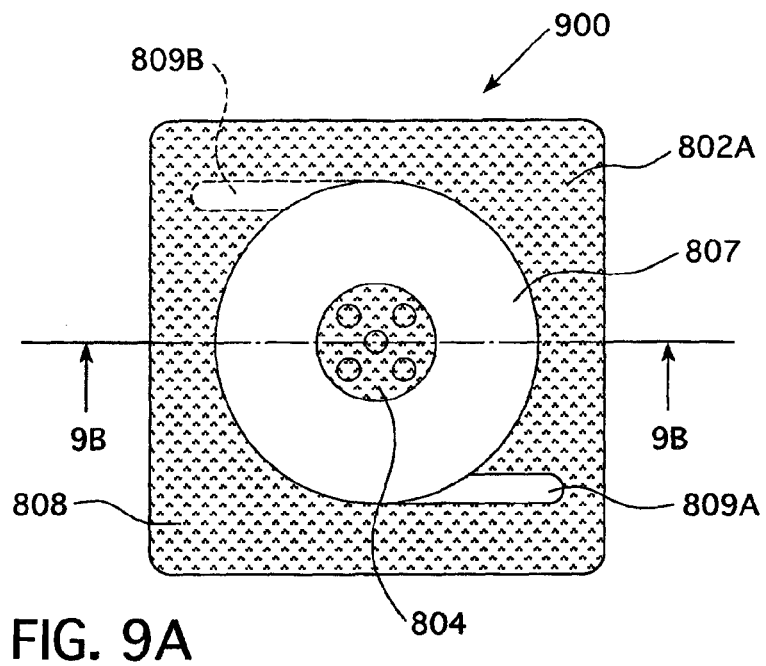
FIG. 9A is a top view of an electroactive polymer cartridge comprising a laminated frame, disk, and pre-strained dielectric elastomer film prior to applying an electrically conductive material to the active area of the electroactive polymer cartridge in accordance with one embodiment of the present invention.

FIG. 9A is a top view of an electroactive polymer cartridge 900 comprising a laminated frame 802, a disk 804, and a pre-strained dielectric elastomer film 807 prior to applying an electrically conductive material to the active area of the 818 electroactive polymer cartridge 900 in accordance with one embodiment of the present invention. Electrical connections 809A, 809B are used to couple the electrodes to a voltage power supply. Electrical connection 809A is located above the dielectric elastomer film 807 whereas electrical connection 809B is located below the dielectric elastomer film 807. The release layer 808 is also shown.

Figure 9B:
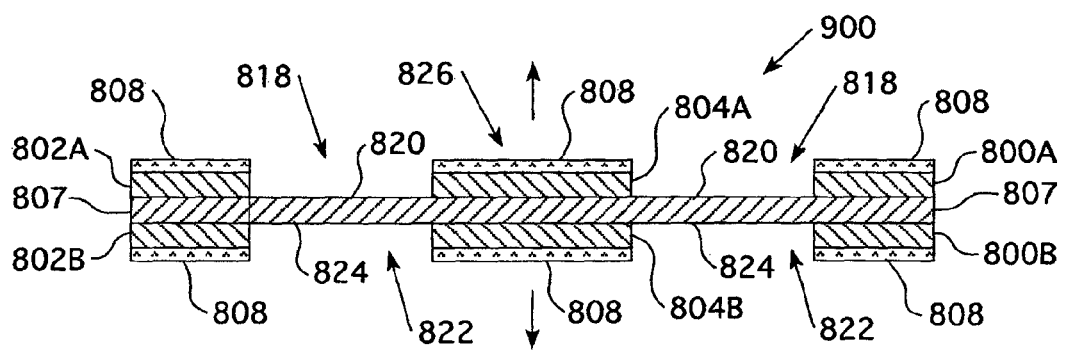
FIG. 9B is a sectional view of the cartridge shown in FIG. 9A taken along section 9B-9B.

FIG. 9B is a sectional view of the electroactive polymer cartridge 900 shown in FIG. 9A taken along section 9B-9B. The pre-stretched dielectric elastomer film 807 is laminated between first and second pre-cut rigid polymer supports 800A, 800B defining a top frame 802A, a bottom frame 802B, a top disk 804A, and a bottom disk 804B with ring slugs removed to expose the dielectric elastomer film 807. The release layer 808 is applied to the exposed surface of the first and second pre-cut rigid polymer supports 800A, 800B.

A top active area 818 is located on a top side 820 of the cartridge 900 and a bottom active area 822 is located on a bottom side 824 of the cartridge 900. Once the corrugated electrodes are formed on the top and bottom active areas 818, 822, a voltage potential can be applied to the top and bottom active areas 818, 822 of the pre-strained dielectric elastomer film 807 such that it behaves in the manner described in connection with FIGS. 1A, 1B. The center portion 826 of the cartridge 900 acts as a movable platform that can move in the directions indicated by the arrows.

Figure 10:
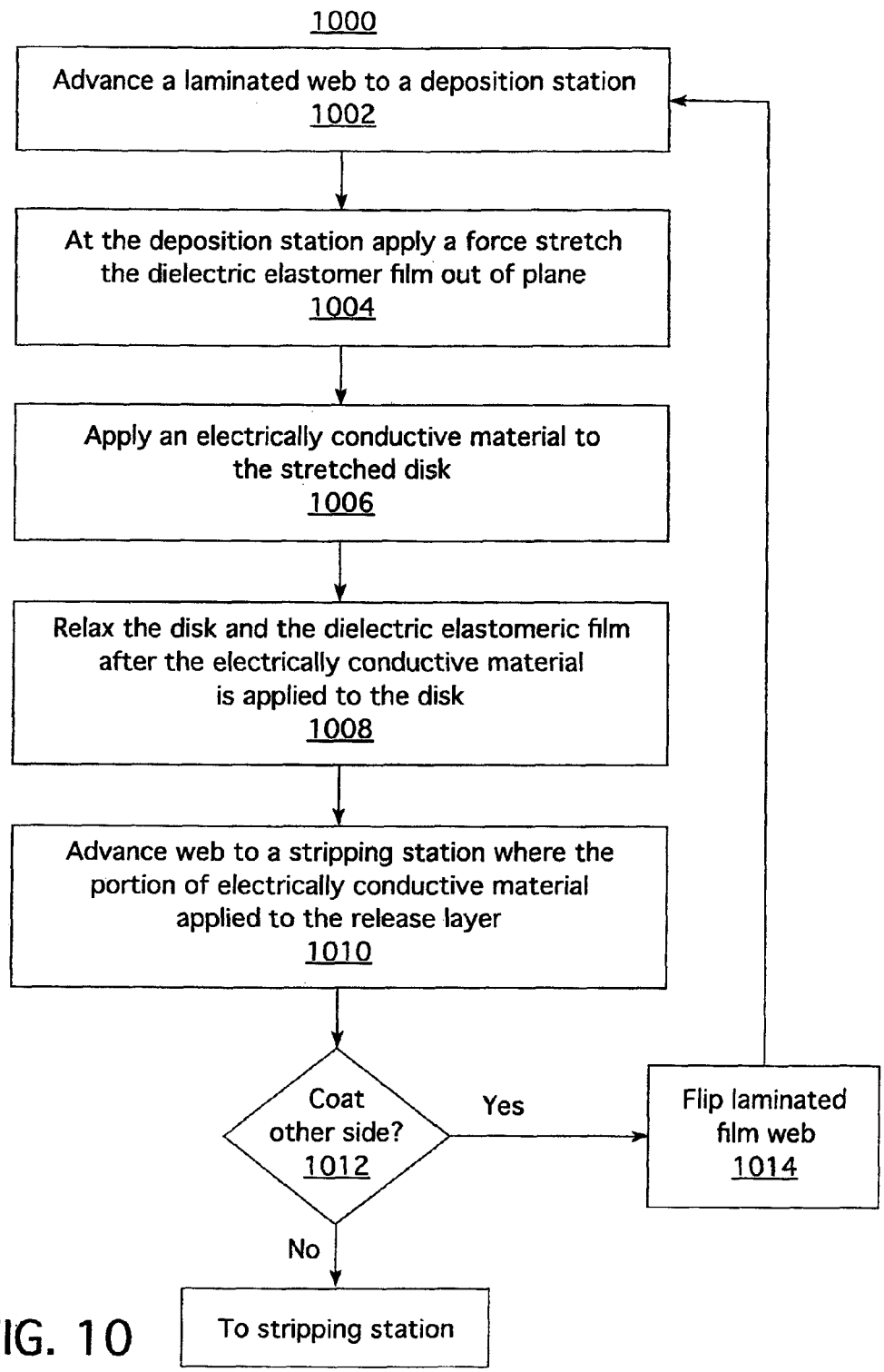
FIG. 10 is a flow diagram of a stretched deposition process of applying an electrically conductive material to an active area of an electroactive polymer cartridge for producing corrugated electrodes in accordance with one embodiment of the present invention.

FIG. 10 is a flow diagram 1000 of a stretched deposition process of applying an electrically conductive material to an active area of an electroactive polymer cartridge for producing corrugated electrodes in accordance with one embodiment of the present invention. The laminated support/film web described in connection with FIG. 8F is advanced 1002 and positioned in a deposition station. At the deposition station a force is applied to the center of the disk portion of an electroactive polymer cartridge to push out or stretch 1004 the dielectric elastomer film 807 in a direction that is orthogonal to a plane defined by the film 807 in a predetermined deformation. In essence, this deforms the flexible diaphragm of the electroactive polymer cartridge. In one embodiment, the stretched configuration of the dielectric elastomer film 807 is a frustum, although other geometric configurations are contemplated within the scope of this disclosure. The center of the laminated disk is displaced to a first predetermined distance h1 in the direction that the force is applied. An electrically conductive material is applied 1006 to the stretched dielectric elastomer film 807, including the frame and disk portions of the electroactive polymer cartridge. Once the electrically conductive material is applied, the flexible diaphragm is allowed to relax. Accordingly, the pre-strained dielectric elastomer film 807 is also relaxed 1008. The relaxation process enables the corrugated electrode to form on the dielectric elastomer film 807. The coated laminated disk is then advanced to a stripping station to strip 1010 away the portion of the electrically conductive material applied to the release layer above the frame and disk portion of the electroactive polymer cartridge. For example, a water-soluble release layer may be stripped from the rigid polymer support by applying water and scrubbing the surface of the laminated disk.

Optionally, the processes defined in steps 1002-1010 can be repeated to form a corrugated electrode on the other side of the electroactive polymer cartridge. Accordingly, when the process determines 1012 that the other side of the electroactive polymer cartridge should be coated with electrically conductive material, the process 1000 proceeds along the "yes" branch to laminated support/film web is turned over 1014 over and steps 1002-1010 are repeated. When both sides of the electroactive polymer cartridge are coated, the process 1000 proceeds along the "no" path to a stripping station. It should be noted that prior to applying the electrically conductive material to the other side of the electroactive polymer cartridge, the flexible diaphragm is stretched in a direction that is orthogonal to a plane defined by the cartridge to a second predetermined distance h2 in the direction that the force is applied. In one embodiment, the second predetermined distance h2 is less than the first predetermined distance h1. In other embodiments, the second predetermined distance h2 may be equal to or greater than the first predetermined distance h1.

FIGS. 11A-11F illustrate an electroactive polymer cartridge undergoing a stretched deposition process for producing a corrugated electrode on a stretched dielectric elastomer film 807 portion of the electroactive polymer cartridge 900 in accordance with one embodiment of the present invention.

Figure 11A:
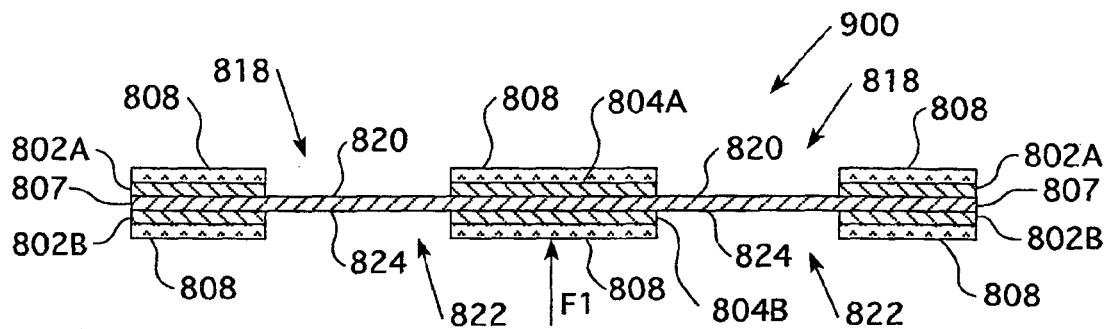
FIGS. 11A-11F illustrates an electroactive polymer cartridge undergoing a stretched deposition process for producing a corrugated electrode on a stretched dielectric film portion of an electroactive polymer cartridge in accordance with one embodiment of the present invention, where.

FIG. 11A is a cross-sectional view of an electroactive polymer cartridge 900 in a relaxed configuration prior to entering a deposition station (e.g., chamber). When the electroactive polymer cartridge 900 is advanced to the deposition station, a three F1 indicated by the arrow is applied to stretch the flexible diaphragm in a direction that is orthogonal to a plane defined by the diaphragm, thus displacing the disk 804 to a predetermined distance h1 as shown in FIG. 11B.

Figure 11B:
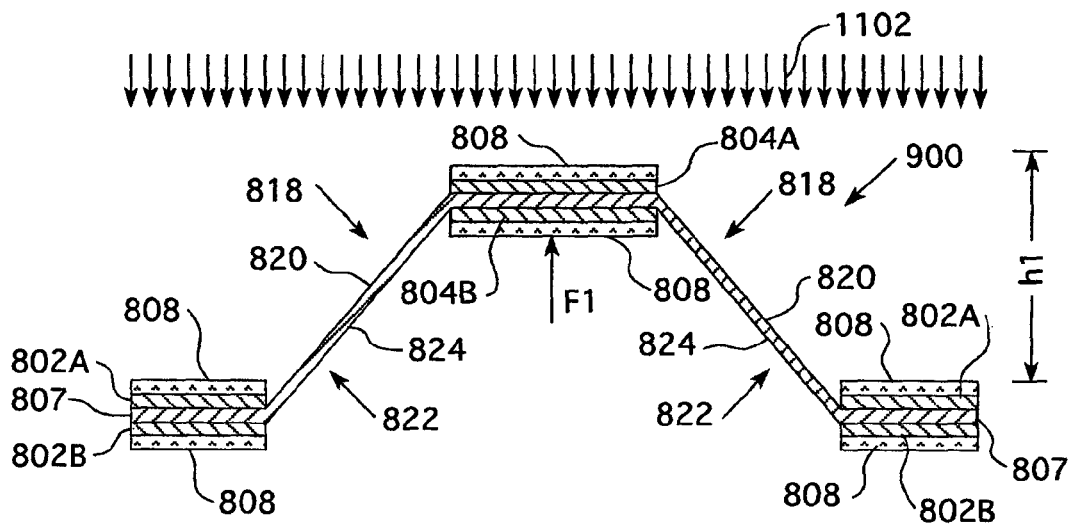

FIG. 11B is a cross-sectional view of the cartridge 900 in a stretched state during the stretched deposition process in accordance with one embodiment of the present invention. An electrically conductive material 1102 is applied to the top side 820 of the cartridge 900 by way of any suitable deposition technique as discussed in more detail hereinbelow. As shown in FIG. 11B, the diaphragm is displaced by distance of h1 under the applied force F1.

Figure 11C:
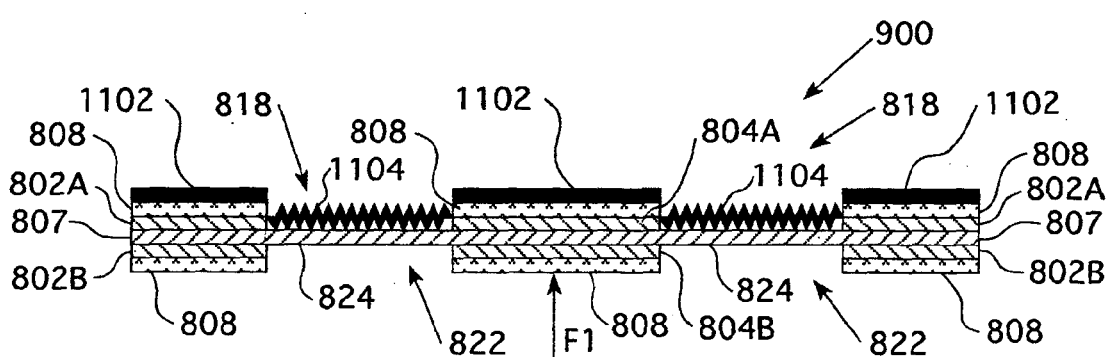

FIG. 11C is a cross-sectional view of the cartridge 900 in a relaxed state after the stretched deposition process in accordance with one embodiment of the present invention. The relaxed configuration enables the formation of a corrugated electrode 1104 in the top active area 818 on the top side 820 of the dielectric elastomer film 807. Note that during the deposition process, a layer 1106 of conductive material also is applied to the release layer 808 in the frame 802A and disk 804A portions of the cartridge 900.

Figure 11D:
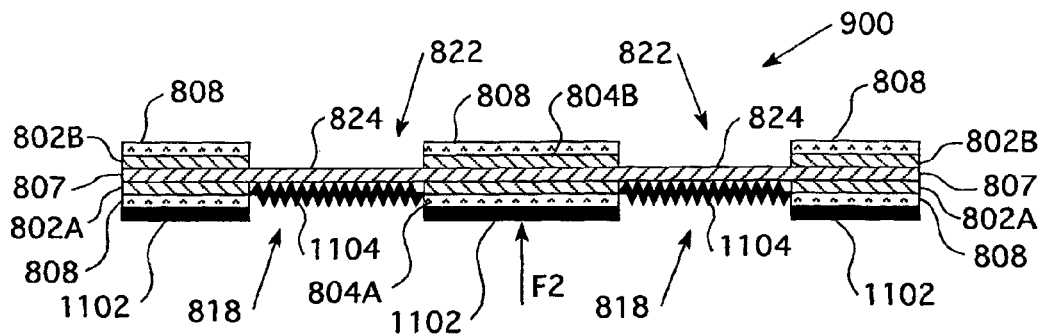

As previously discussed, optionally, a corrugated electrode 1110 (FIG. 11F) may be formed on the bottom side 824 of the cartridge 900. Accordingly, as shown in FIG. 11D, the cartridge 900 is turned over and is now prepared to receive an electrically conductive material on the bottom side.

Figure 11E:
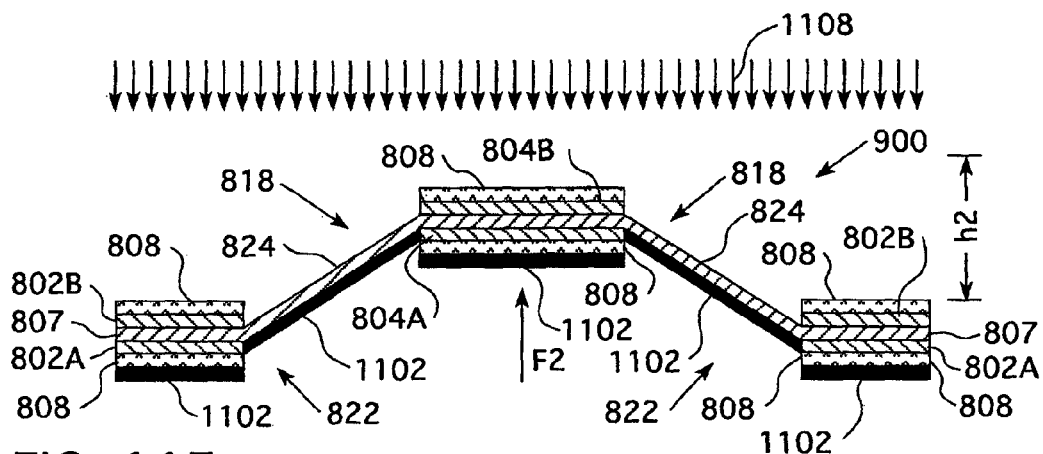

FIG. 11E is a cross-sectional view of the cartridge 900 in a stretched state during the stretched deposition process in accordance with one embodiment of the present invention. An electrically conductive material 1108 is applied to the bottom side 824 of the dielectric elastomer film 807. In one embodiment the electrically conductive material 1108 applied to the bottom side 824 may be the same as the electrically conductive material 1102 applied to the top side 820 of the dielectric elastomer film 807. In other embodiments, however, these materials 1102, 1108 may be different. As shown in FIG. 11B, the diaphragm is displaced by distance of h2 under the applied force F2.

Figure 11F:
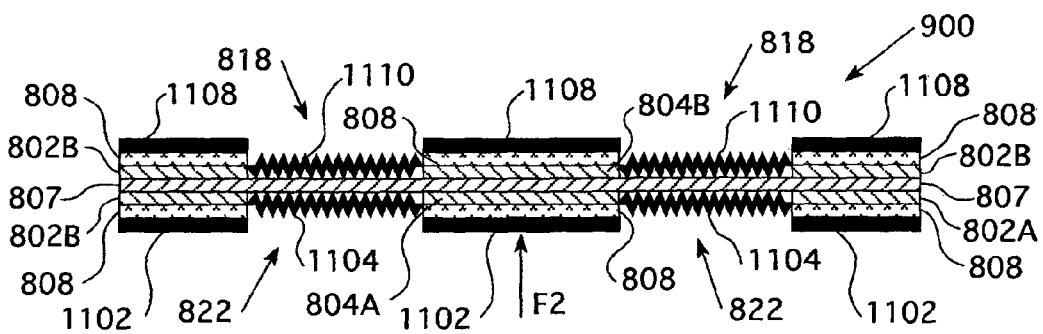

FIG. 11F is a cross-sectional view of the cartridge 900 in a relaxed state after the stretched deposition process in accordance with one embodiment of the present invention. The relaxed configuration enables the formation of a corrugated electrode 1110 in the bottom active area 822 on the bottom side 824 of the dielectric elastomer film 807. Note that during the deposition process, a layer 1112 of conductive material also is applied to the release layer 808 in the frame 802B and disk 804B portions of the cartridge 900.

Figure 12A:
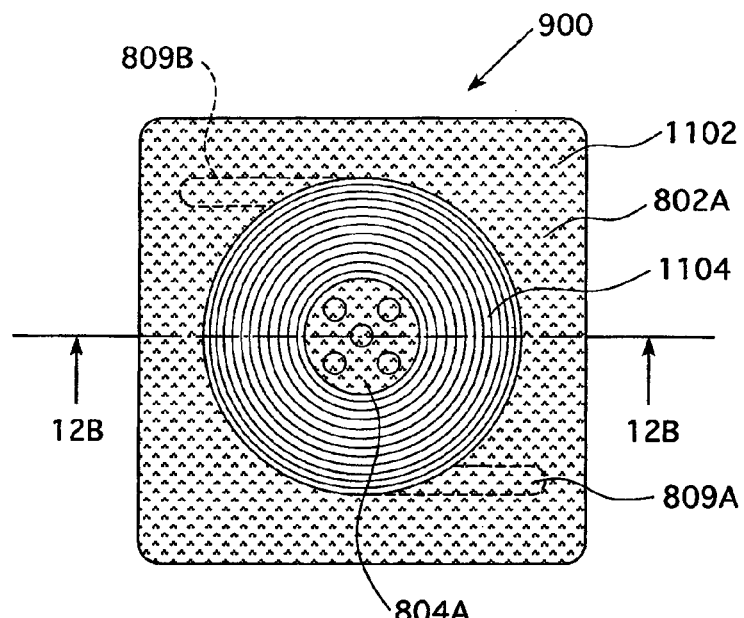
FIG. 12A is a top view of an electroactive polymer cartridge comprising a laminated frame, disk, and pre-strained dielectric elastomer film coated with an electrically conductive material by the stretched deposition process described in connection with FIGS. 11A-11F to form a corrugated electrode in accordance with one embodiment of the present invention.

FIG. 12A is a top view of the electroactive polymer cartridge 900 comprising a laminated frame 802, disk 804, and pre-strained dielectric elastomer film 807 coated with an electrically conductive material 1102 by the stretched deposition process described in connection with FIGS. 11A-11F to form a corrugated electrode 1104 in accordance with one embodiment of the present invention. Electrical connections 809A, 809B are used to couple the electrodes to a voltage power supply. Electrical connection 809A is located above the dielectric elastomer film 807 whereas electrical connection 809B is located below the dielectric elastomer film 807. The release layer 808 is also shown.

Figure 12B:
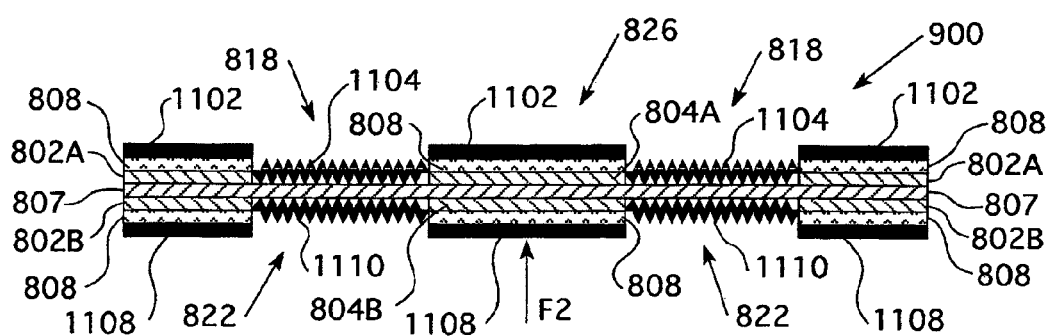
FIG. 12B is a sectional view of the cartridge shown in FIG. 12A taken along section 12B-12B.

FIG. 12B is a sectional view of the cartridge 900 shown in FIG. 12A taken along section 12B-12B. The dielectric elastomer film 807 laminated between first and second pre-cut rigid polymer supports 800A, 800B defining a top frame 802A, a bottom frame 802B, a top disk 804A, and a bottom disk 802B with ring slugs removed to expose the dielectric elastomer film 807. The release layer 808 has been applied to the surface of the first and second pre-cut rigid polymer supports 800A, 800B. The electrically conductive material 1102 is applied on top of the release layer 808.

Once the corrugated electrodes 1104, 1110 are formed on the top and bottom active areas 818, 822 of the pre-strained dielectric polymer film 807, a voltage potential can be applied to the top and bottom active areas 818, 822 of the pre-strained dielectric elastomer film 807 such that it behaves in the manner described in connection with FIGS. 1A, 1B. The center portion 826 of the cartridge 900 acts as a flexible diaphragm that is free to move.

In various embodiments, the deposition process for applying electrically conductive materials to the top and/or bottom of the electroactive polymer cartridge 900 may take many forms. For example, applying an electrically conductive material by sputtering, evaporation, chemical vapor deposition (CVD), offset printing, screen printing, spray printing, electrostatic spray printing, flexography, pad printing, gravure printing, ink jet printing, aerosol jet printing, curtain coating, extrusion coating, slot-die coating, among others, may prove useful in the present manufacturing process.

The electrically conductive materials 1102, 1108 also may be selected from a plurality of materials such as, for example, gold, silver, copper, carbon, palladium silver, conductive inks, conductive polymers, among others.

Figure 13:
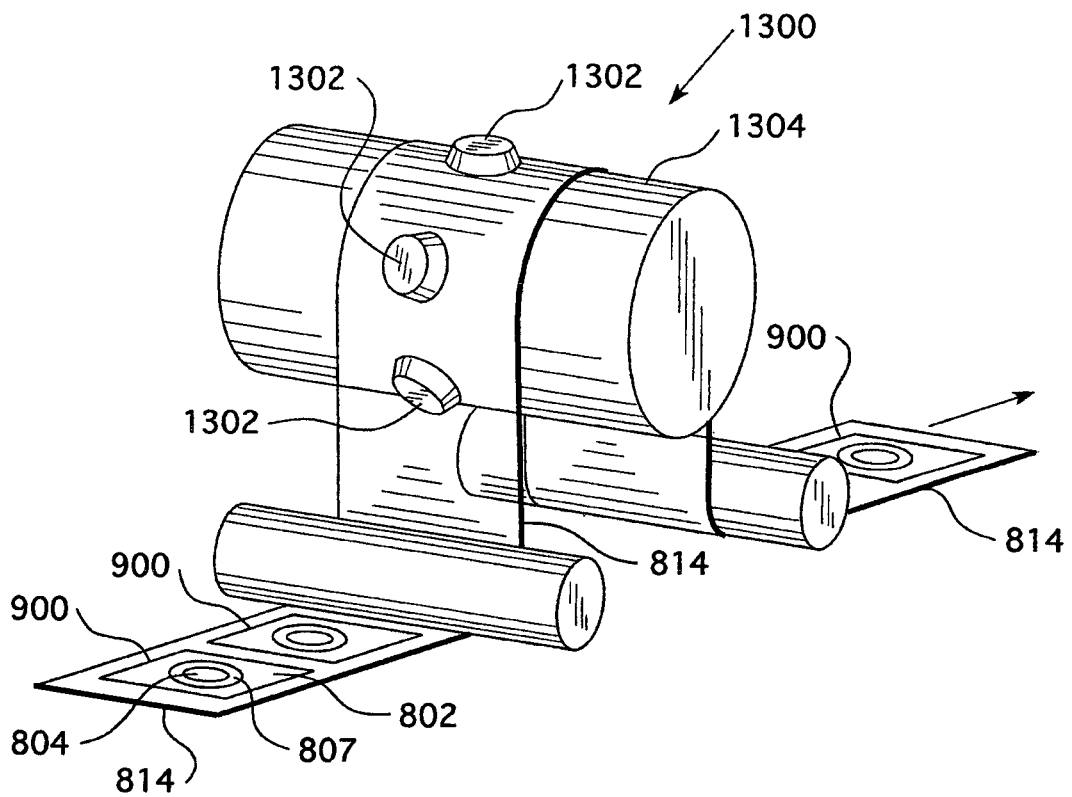
FIG. 13 illustrates a generalized process for stretching a dielectric elastomer film portion of an electroactive cartridge over frustoconical protrusions formed on a sputtering drum in accordance with one embodiment of the present invention.

FIG. 13 illustrates a generalized process 1300 for stretching the dielectric elastomer film 807 portion of an electroactive cartridge 900 over frustoconical protrusions 1302 formed on a sputtering drum 1304 in accordance with one embodiment of the present invention. The cartridges 900 are disposed on a laminated support/film web 814 that advances into a sputtering chamber (not shown) in the direction indicated by the arrow. The sputtering drum 1304 is located in the sputtering chamber. The sputtering drum 1304 comprises a plurality of convex frustoconical protrusions 1302 that stretch the dielectric elastomer film 807 during the stretched deposition process. A portion of the web 814 is shown transparent in order to show the underlying frustoconical protrusions 1302 on the surface of sputtering drum 1304. Although frustoconical protrusions 1302 are shown, other geometric features are contemplated.

Figure 14:
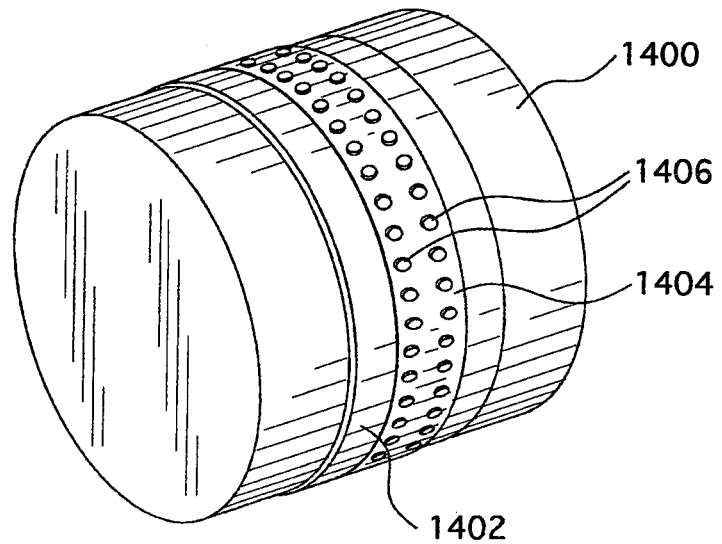
FIG. 14 illustrates one embodiment of a sputtering drum comprising a spacer and a belt comprising multiple rows of frustoconical protrusions for stretching a dielectric elastomer film portion of an electroactive polymer cartridge in accordance with one embodiment of the present invention.

FIG. 14 illustrates one embodiment of a sputtering drum 1400 comprising a spacer 1402 and a "button" belt 1404 comprising multiple rows of frustoconical protrusions 1406 for stretching the dielectric elastomer film 807 portion of an electroactive cartridge 900 in accordance with one embodiment of the present invention. FIG. 14 illustrates one embodiment of a sputtering drum 1400 comprising a spacer 1402 and a button belt 1404 for stretching a laminated disk. The spacer 1402 acts to adjust the degree of stretch, for example. The button belt 1404 is configured to retrofit onto existing sputtering drums 1400.

Figure 15:
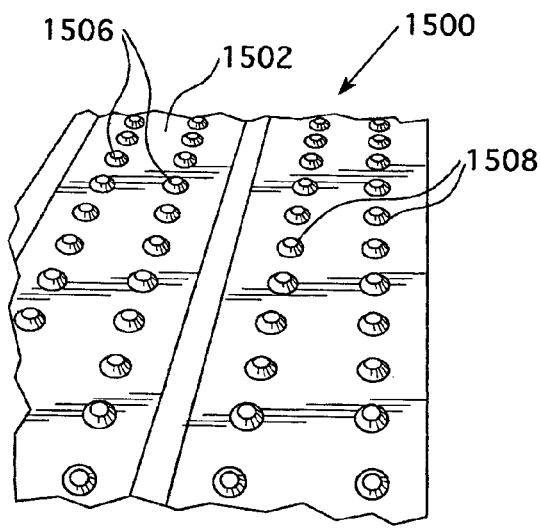
FIG. 15 illustrates a sputtering drum comprising multiple belts comprising a plurality of frustoconical protrusions for stretching a dielectric elastomer film in accordance with one embodiment of the present invention.

FIG. 15 illustrates a portion of a sputtering drum 1500 comprising a plurality of button belts 1502, 1504 holding the laminated disk diaphragms in a stretched state. Each of the button belts 1502, 1504 comprises a plurality of frustoconical convex features 1506, 1508 that hold the laminated disk diaphragms 1506 in a stretched state during the deposition process for producing a corrugated electrode thereon.

Figure 16:
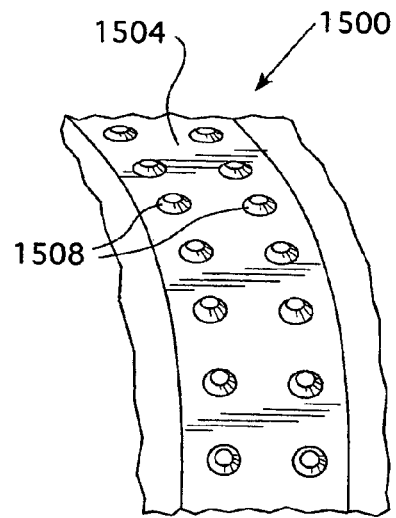
FIG. 16 is a detailed view of the button belt shown in FIG. 15 showing how the buttons hold the laminated disk diaphragms actuators in a stretched state during the deposition process according to one embodiment of the present invention.

FIG. 16 is a detailed view of the button belt 1500 shown in FIG. 15 showing how the frustoconical convex features 1508 hold the laminated disk diaphragms in a stretched state during the deposition process according to one embodiment of the present invention.

Figure 17:
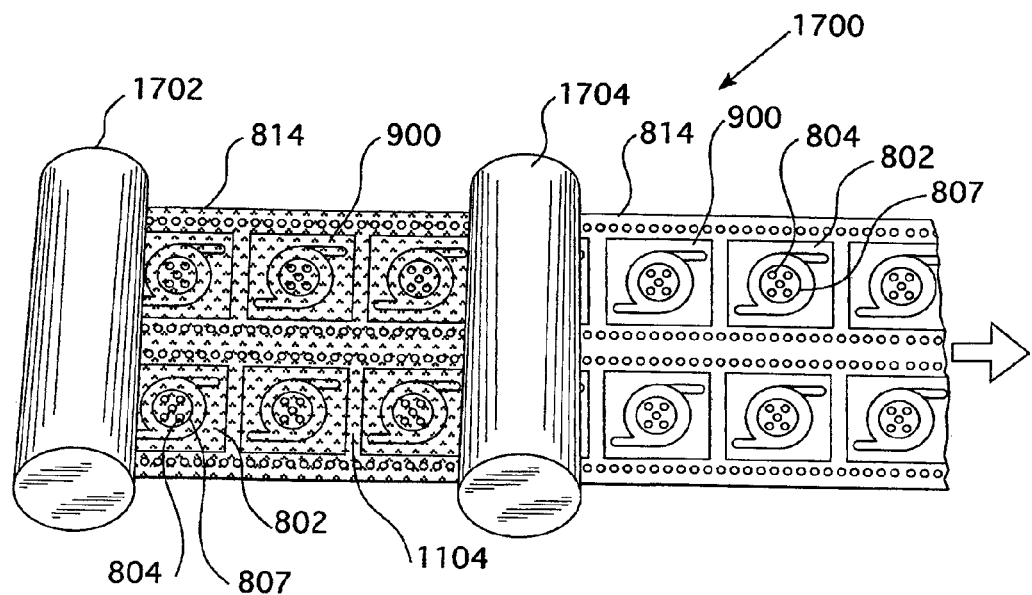
FIG. 17 illustrates a roll-to-roll process for stripping the release layer from an electroactive polymer cartridge in accordance with one embodiment of the present invention.

FIG. 17 illustrates a roll-to-roll process 1700 for stripping the release layer 808 from the electroactive polymer cartridge 900 in accordance with one embodiment of the present invention. As illustrated in FIG. 17, the release layer 808 is removed by rolls 1702, 1704. The laminated film web 814 moves in the direction indicated by the arrow. The electrically conductive material applied during the stretched deposition process must be removed from the frame 802 and disk 804 portions of the electroactive polymer cartridges 900. A first roll 1702 may be a passive nip roll with a slightly rough surface. For example, the surface roughness of the first roll 1702 may be between 5 µm and 50 µm. In between the first roll 1702 and a second roll 1704, a water or isopropyl alcohol (IPA) mist is applied to the laminated support/film web 814. The second roll 1704 has a fixed shaft plus a clean room wipe that is periodically rotated and replaced. As previously discussed, the release layer may be formed of a material that soluble in water or solvents. Accordingly, the release layer is dissolved and wiped away from the rigid polymer support and the dielectric elastomer cartridges having electrodes formed therein are produced.

Figure 18:
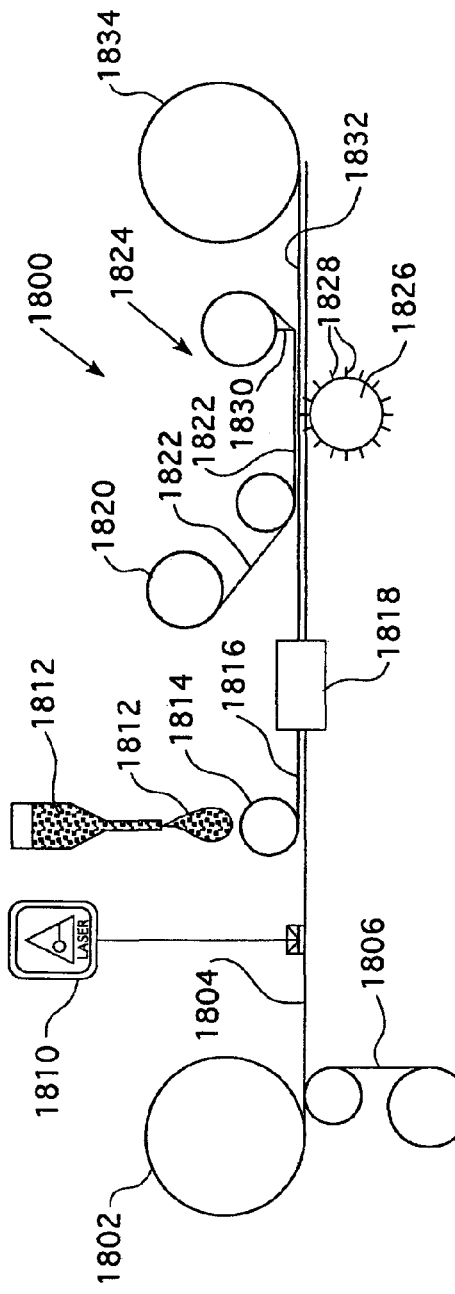
FIGS. 18-20 illustrate one aspect of a roll-to-roll stretched deposition manufacturing process for producing dielectric elastomer electrodes for electroactive polymer cartridges, where.

FIG. 18 illustrates one aspect of a roll-to-roll manufacturing process 1800 for producing a rigid polymer support for an electroactive polymer cartridge in accordance with one embodiment of the present invention. In one variation the process includes separating a stock roll 1802 comprising a rigid polymer support material 1804, typically a rigid polymer support material such as PET from a release liner (i.e., a liner of material that prevents the film from sticking together). The stock support material 1804 may comprise any material used for fabrication of electroactive polymer devices such as disclosed in the references incorporated by reference herein. The roll-to-roll process can include rollers treated to release the support material 1804 as it passes through the various manufacturing processes. For example, such treatment can include TEFLON coatings or other release (or non-stick) coatings that prevents the film from adhering to the roller. The rollers may also be covered with an intermediary layer such as an engineered surface, a removable liner, a compliant layer, or a deformable layer. Examples of engineered surfaces include, but are not limited to, parchment paper, textured surfaces, screen mesh, non-stick surfaces, and polymer sheets. Examples of deformable layers include, but are not limited to, foams and soft network materials such those made from ethylene vinyl acetate, silicone, olefin, and polyurethanes. In an alternate variation, the process can include replacing the roll of the stock support material 1804 with a feed direct from an extrusion or other manufacturing process.

As the support material 1804 unwinds from the stock roll 1802, a release liner 1806 that separates layers of the support material 1804 can be rewound 1808. As the unwound support material 1804 is fed, a laser 1810 cuts out frame and disk portions of electroactive polymer cartridges, and optionally sprocket holes, into the support material 1804. A release material 1812 is then applied to a roll 1814 to form a release layer 1816 above the pre-cut support material 1804. A trimming station 1818 trims the pre-cut coated support material 1804 to a suitable width. A tape laminator 1820 laminates an adhesive tape 1822 on the pre-cut coated support material 1804 in order to hold the disk portion fixed relative to the frame portion of the electroactive polymer cartridge. A slug ejector station 1824 comprises a drum 1826 with pins 1828 to eject ring shaped slugs. The ring-shaped slugs are lifted by the pins 1828 on the underlying drum 1826 and are scooped off by prongs 1830 on a collection box. Once the rings shaped slugs are ejected, the web 1832 can be re-wound in web stock roll 1834. Alternatively, the web 1832 can continue for additional processing to assemble the electroactive polymer frame and support structures as described herein.

Figure 19:
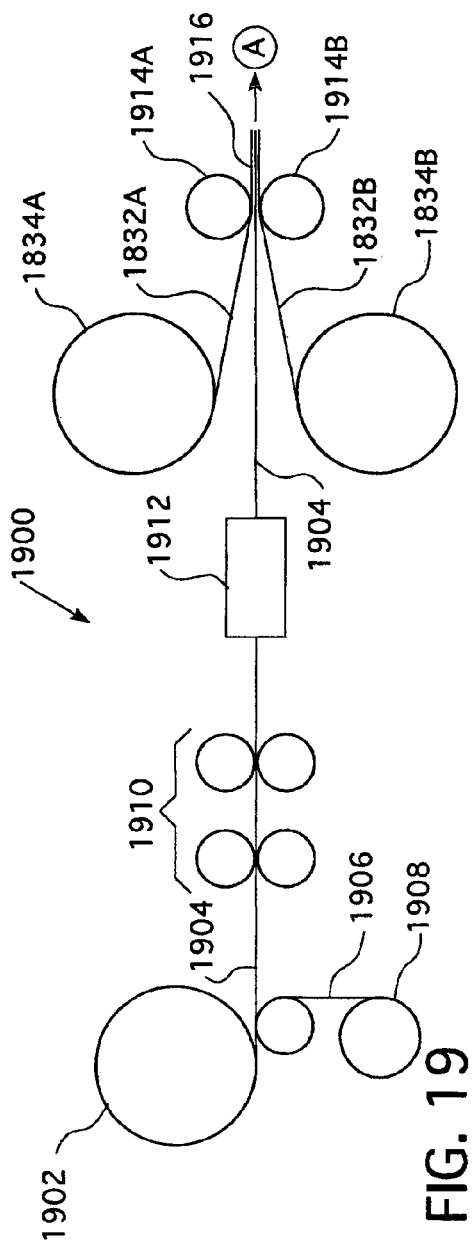

FIG. 19 illustrates one aspect of a roll-to-roll manufacturing process 1900 for laminating a pre-strained dielectric elastomer film between two rigid polymer supports in accordance with one embodiment of the present invention. As a dielectric elastomer film 1904 unwinds from a stock roll 1902, a release liner 1906 that separates layers of the dielectric elastomer film 1904 can be rewound 1908. The dielectric elastomer film 1904 may be pre-strained. In the illustrated variation the dielectric elastomer film 1904 is stretched in a machine direction (direction parallel to the travel of the film 1904) using, for example rollers 1910 traveling at different speeds. The film 1904 is then stretched in a transverse direction using a separate mechanism 1912. Variations include simultaneously stretching the film 1904 in a machine and transverse direction (i.e., bi-axial stretchers). The desired stretch will depend upon the application as well as the desired performance of the electroactive polymer device. For example, the material can be stretched 30% in either or both the machine and transverse direction.

Once the dielectric elastomer film 1904 is pre-strained, it is laminated between two sheets of rigid polymer supports 1832A, 1832B unwound from web stock rolls 1834A, 1834B by lamination rolls 1914A, 1914B. A laminated support/film web 1916 exits at A and is ready to enter the roll-to-roll stretched deposition process illustrated in FIG. 21.

Figure 20:
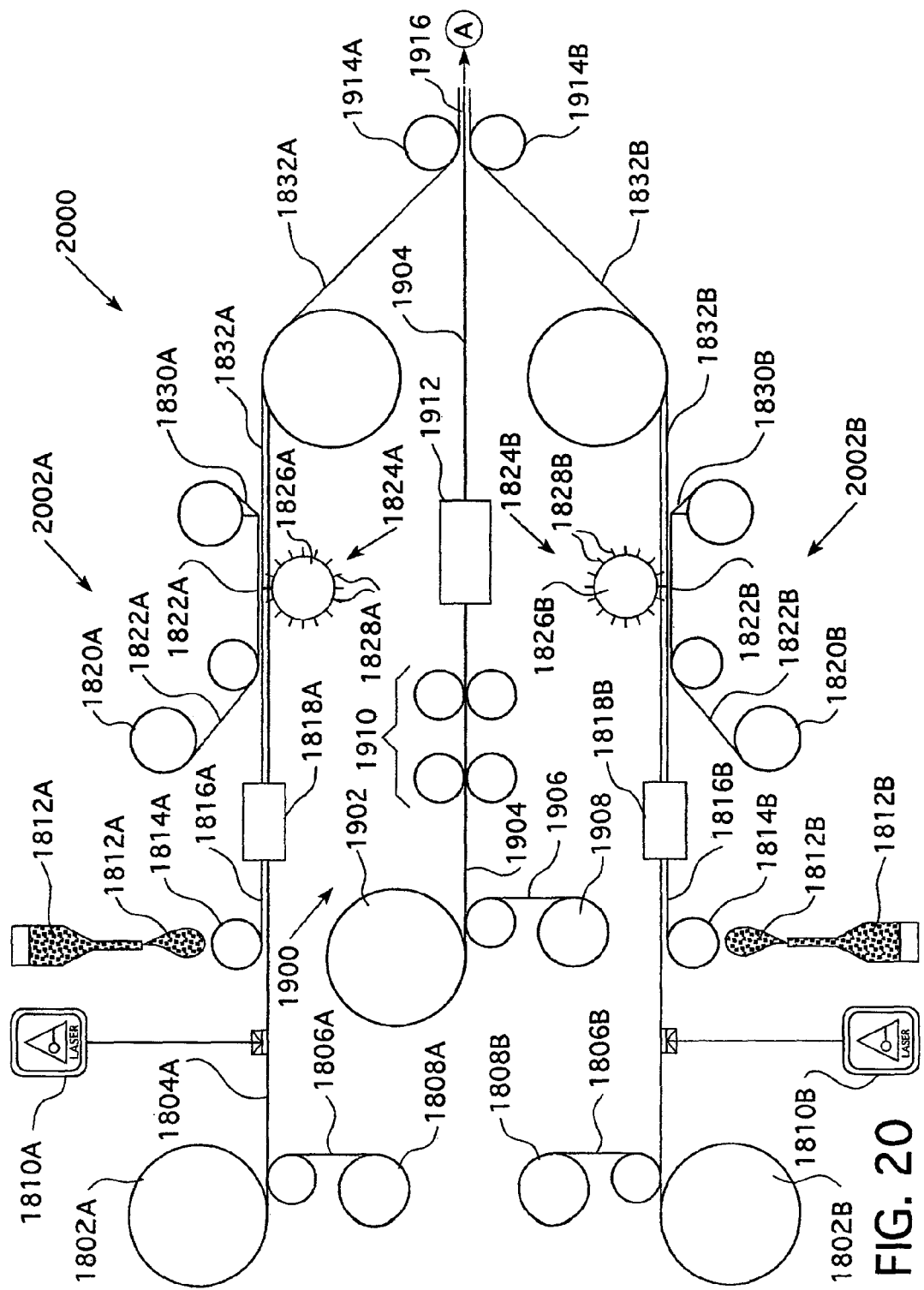

FIG. 20 is a continuous high-volume manufacturing process 2000 for producing electroactive polymer cartridges with self-healing corrugated electrodes in accordance with one embodiment of the present invention. The process 2000 is a combination of the processes 1800 and 1900 performed simultaneously. The top and bottom process lines 2002A, 2002B simultaneously produce the rigid polymer supports 1832A, 1832B, which are laminated to a pre-strained dielectric elastomer film 1904 to produce a laminated support/film web 1916 by lamination rolls 1914A, 1914B. Accordingly, the web does not have to be turned over in order to process the other side. The laminated support/film web 1916 exits at A and is ready to enter the roll-to-roll stretched deposition process illustrated in FIG. 21.

For conciseness and brevity, steps in the process 2000 which are identical to the processes 1800, 1900 described in connection with FIGS. 18 and 19 will not be repeated as the processes are the same and similar reference numbers have been used to indicate similar process steps, with the exception being that in FIG. 20, reference numerals referencing elements of the top process line 2002A have an "A" suffix, whereas reference numerals referencing elements of the top process line 2002B have a "B" suffix. Otherwise, the processes depicted in top process lines 2002A, 2002B are the same of the process 1800 shown in FIG. 18. The process 1900 in FIG. 21 is the same of the process 1900 in FIG. 19.

Figure 21:
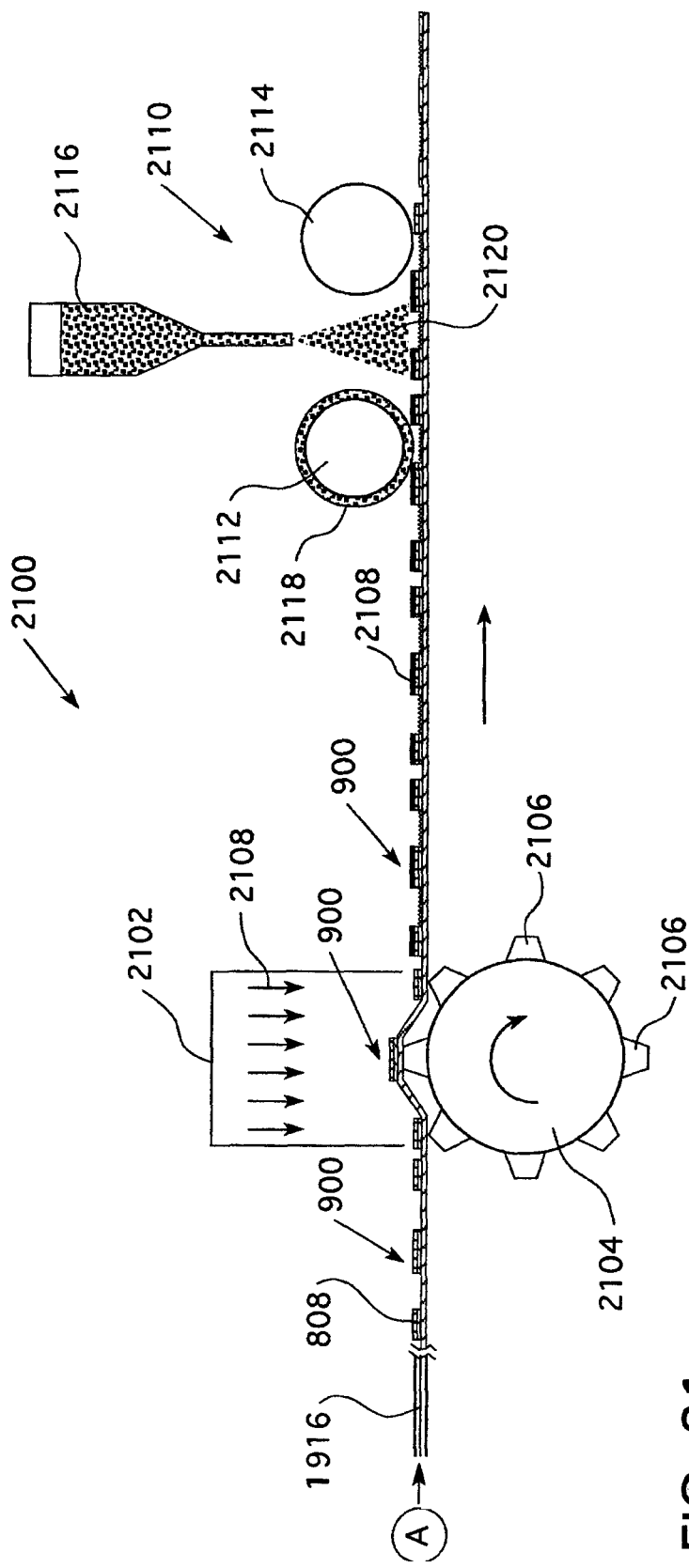
FIG. 21 illustrates one aspect of a roll-to-roll stretched deposition manufacturing process for applying an electrically conductive material to a stretched dielectric elastomer film in accordance with one embodiment of the present invention.

FIG. 21 illustrates one aspect of a roll-to-roll stretched deposition manufacturing process 2100 for applying an electrically conductive material to a stretched dielectric elastomer film in accordance with one embodiment of the present invention. The laminated support/film web 1916 includes electroactive polymer cartridges 900 as previously described. The laminated support/film web 1916 enters at A either from process 1900 or 2000. The laminated support/film web 1916 enters a deposition chamber 2102 where an underlying drum 2104 comprising frustoconical projections 2106 stretches the laminated support/film web 1916 as the drum rotates in a clockwise direction. Once the laminated support/film web 1916 is stretched, an electrically conductive material 2108 is applied to the electroactive polymer cartridges 900.

After the application of the electrically conductive material 2108, the process advances to a stripping station 2110 comprising first and second rolls 2112, 2114 and a fluid dispensing station 2116 to remove the release layer 808. The first roll 2112 may comprise a surface roughness 2118 to further assist the release layer removal process. If the release layer is water soluble, the fluid dispensing station 2116 applies a water based solution 2120 to assist in the stripping process. In other aspects, the fluid dispensing station 2116 may apply an ISA solution to assist in the stripping process.

Figure 22:
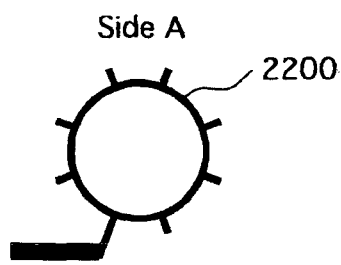
FIGS. 22-24 illustrate a fatigue-resistant conductive bus for an electroactive polymer cartridge in accordance with one embodiment of the present invention, where.
Figure 23:
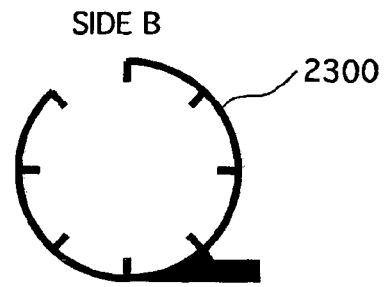
Figure 24:
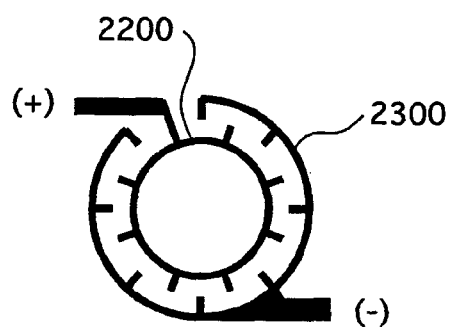

FIGS. 22-24 illustrate a fatigue-resistant conductive bus for an electroactive polymer cartridge in accordance with one embodiment of the present invention. FIG. 22 illustrates a fatigue-resistant conductive bus 2200 to be applied on a corrugated electrode formed on one side of an electroactive polymer cartridge in accordance with one embodiment of the present invention. FIG. 23 illustrates a fatigue-resistant conductive bus 2300 to be applied on a corrugated electrode formed on an opposite side of the electroactive polymer cartridge in accordance with one embodiment of the present invention. FIG. 24 illustrates the fatigue-resistant conductive buses 2200, 2300 shown in FIGS. 22, 23 applied, to both sides of the electroactive polymer cartridge in accordance with one embodiment of the present invention.

With reference now to FIGS. 22-24, the fatigue-resistant conductive buses 2200, 2300 may be applied to the corrugated electrode portions of electroactive polymer cartridges to extent the operable life of the cartridge. In one embodiment, the fatigue-resistant conductive buses 2200, 2300 is formed of carbon, although any suitable conductive material may be employed provided that it is compliant to span and fill mechanical cracks that develop on the corrugated electrodes. Conductive inks, for example, may be employed for this purpose. In one embodiment, the fatigue-resistant buses 2200, 2300 may be pad printed onto the active areas of the electroactive polymer cartridge where the corrugated electrodes are formed. In other embodiments, the fatigue-resistant buses 2200, 2300 may be applied to active areas of the active areas of the electroactive polymer cartridge where the corrugated electrodes are formed by any suitable technique, including, without limitation, screen printing, spray printing, electrostatic spray printing, flexography, pad printing, gravure printing, ink jet printing, aerosol jet printing, among others.

Figure 25:
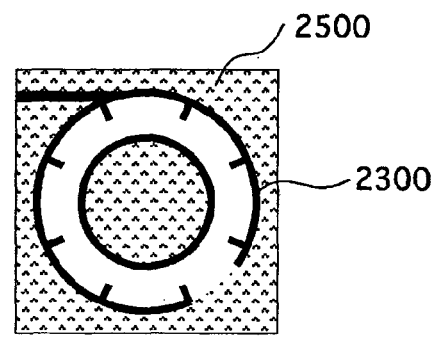
FIG. 25 illustrates forming an encapsulation layer over the active area of an electroactive polymer cartridge comprising the fatigue-resistant conductive buses shown in FIGS. 22-24 applied to both sides of the cartridge in accordance with one embodiment of the present invention.
Figure 26:
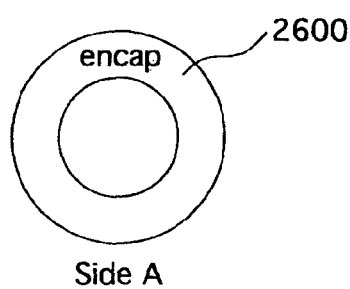
FIG. 26 illustrates one form of encapsulation layer over a first side of the electroactive polymer cartridge in accordance with one embodiment of the present invention.
Figure 27:
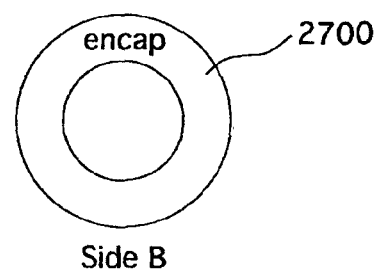
FIG. 27 illustrates one form of encapsulation layer over a second side of the electroactive polymer cartridge in accordance with one embodiment of the present invention.

FIG. 25 illustrates an electroactive polymer cartridge 2500 comprising the fatigue-resistant conductive buses shown 2200, 2300 in FIGS. 22-24 applied to both sides of the cartridge (only top side shown) in accordance with one embodiment of the present invention. Both sides of the electroactive polymer cartridge 2500 can be encapsulated with the encapsulations 2600, 2700 shown in FIGS. 26 and 27, where FIG. 26 illustrates the encapsulation 2600 for a first side of the electroactive polymer cartridge 2500 in accordance with one embodiment of the present invention, and FIG. 27 illustrates the encapsulation 2700 for a second side of the electroactive polymer cartridge 2500 in accordance with one embodiment of the present invention.

Figure 28A:
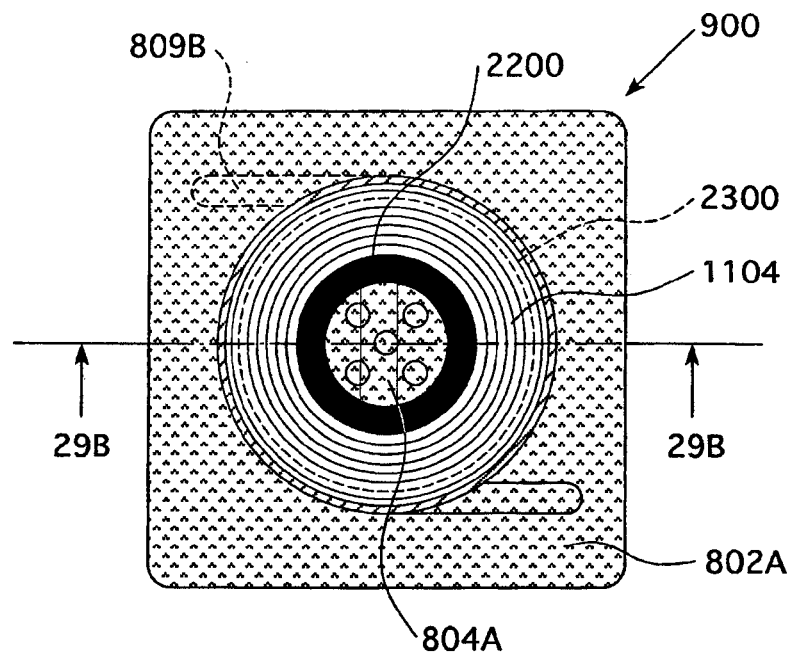
FIG. 28A is a top view of an electroactive polymer cartridge with self-healing corrugated electrodes produced by the a roll-to-roll stretched deposition process and fatigue resistant conductive buses applied thereon in accordance with one embodiment of the present invention.
Figure 28B:
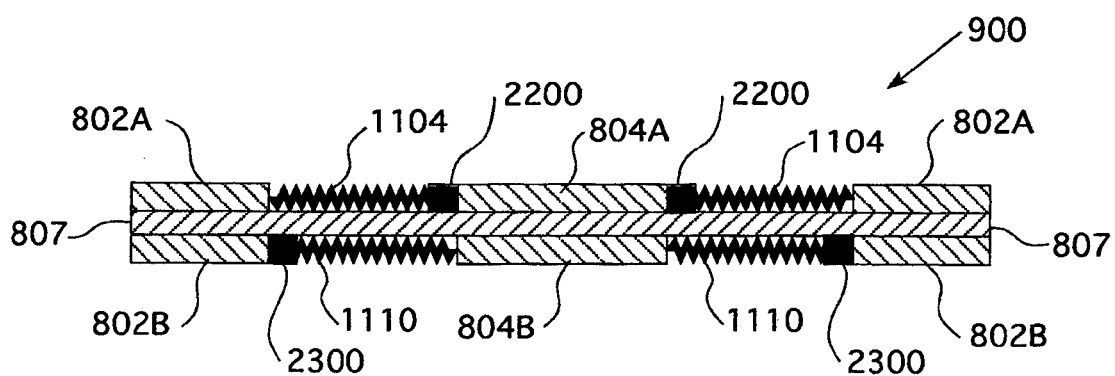
FIG. 28B is a cross-sectional view of the electroactive polymer cartridge shown in FIG. 28A with self-healing corrugated electrodes and fatigue resistant conductive buses applied thereon in accordance with one embodiment of the present invention.

FIGS. 28A and 28B are top and cross-sectional views of an electroactive polymer cartridge 900 with self-healing corrugated electrodes 1104, 1110 produced by the a roll-to-roll stretched deposition process 1000, 2100 (FIGS. 10, 21) and fatigue resistant conductive buses 2200, 2300 applied thereon in accordance with one embodiment of the present invention.

Figure 29:
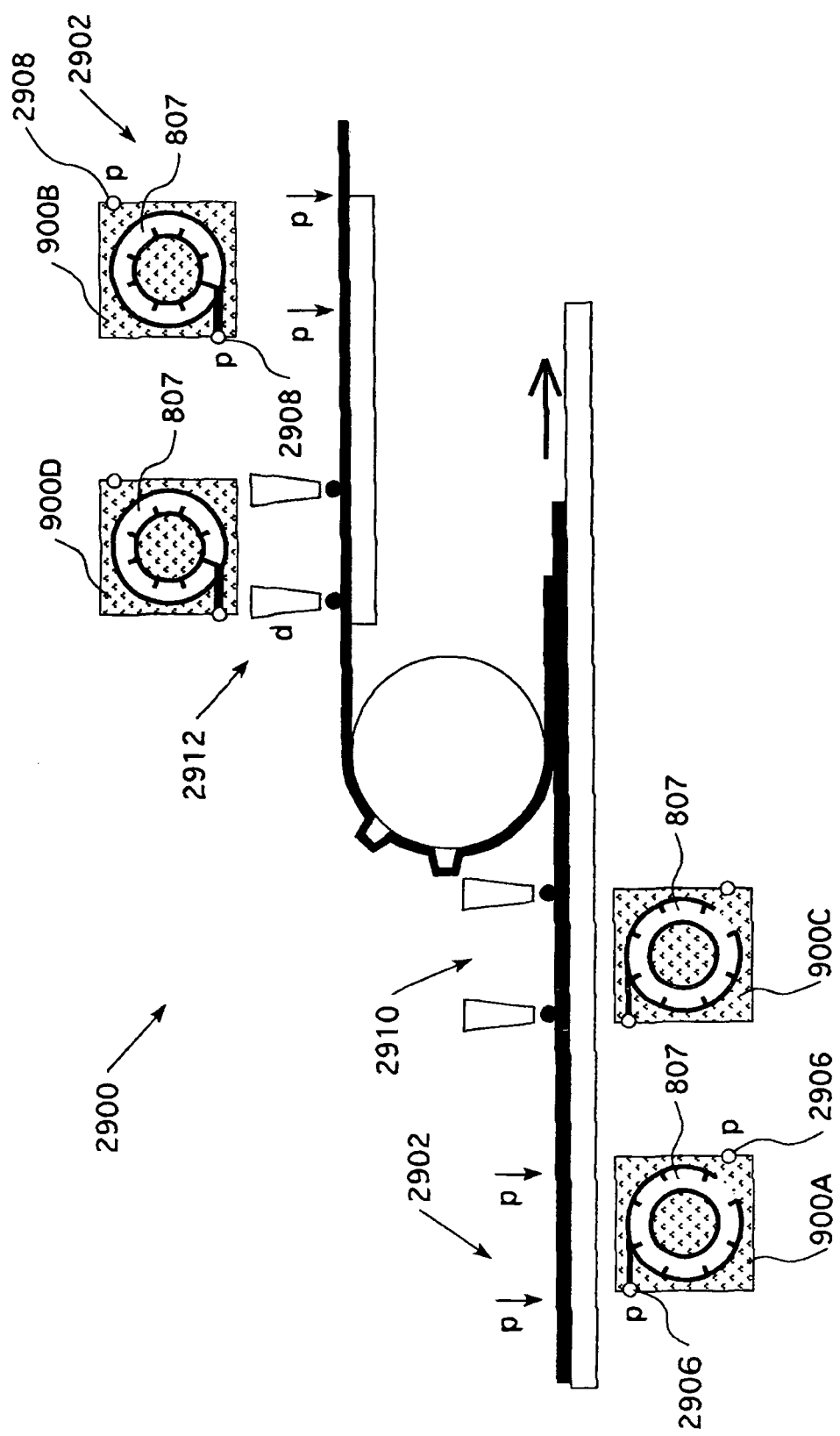
FIG. 29 illustrates a process for producing electrical connections for stacked layers of electroactive polymer cartridges in accordance with one embodiment of the present invention.

FIG. 29 illustrates a process 2900 for producing electrical connections for stacked layers of electroactive polymer cartridges 900 in accordance with one embodiment of the present invention. Initially, the dielectric elastomer film 807 is pierced "p" at piercing stations 2902, 2904 to form vias 2906, 2908 in at least two electroactive polymer cartridges 900A, 900B. Electrically conductive RTV silicone (room temperature vulcanizing silicone) is dispensed "d" into the vias 2906, 2908 of corresponding electroactive polymer cartridges 900C, 900D at dispensing stations 2910, 2912. The electroactive polymer cartridges 900C, 900D having received the electrically conductive RTV silicone are then laminated to form a two layer electroactive polymer cartridge. The process of piercing vias, dispensing electrically conductive RTV silicone, and laminating may be repeated to stack additional layers of electroactive polymer cartridges.

Finally, finished electroactive polymer cartridges 900 of single or multiple layers may be segmented into individual components suitable for tape and reel delivery to customers or further processing. In one aspect, the electroactive polymer cartridges 900 may be surface mounted technology (SMT) compatible.

As for other details of the present invention, materials and alternate related configurations may be employed as within the level of those with skill in the relevant art. The same may hold true with respect to process-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

What is claimed is:

1. A process for producing an electroactive polymer cartridge with a corrugated surface, the process comprising:
   positioning a web comprising a support material attached to a dielectric elastomer film, the support material defining areas exposing portions of the dielectric elastomer film;
   applying a force to stretch the positioned web in a direction that is orthogonal to a plane defined by the web;
   applying a second material to the web while the web is in a stretched state; and
   relaxing the web to form a corrugated layer on the dielectric elastomer film portion of the web.

2. The process according to claim 1, wherein the second material is electrically conductive.

3. The process according to claim 1, wherein the second material is electrically non-conductive.

4. The process according to claim 1, wherein the support material is a support sheet laminated to the dielectric elastomer film.

5. The process according to claim 1, wherein the support material is printed.

6. The process according to claim 1, further comprising defining elements of the electroactive polymer cartridge in the support material.

7. The process according to claim 1, further comprising applying a release layer on the support material.

8. The process according to claim 7, further comprising:
   laminating an adhesive tape to the support sheet to hold cut-out elements fixed relative to a frame portion of the electroactive polymer cartridge;
   ejecting slugs of the support sheet material defined between the elements and the frame portion of the electroactive polymer cartridge; and
   removing the laminated adhesive tape.

9. The process according to claim 7, further comprising stripping the release layer.

10. The process according to claim 1 further comprising applying a fatigue resistant conductive bus on the corrugated area.

11. The process according to claim 10 further comprising applying an encapsulation layer over the fatigue resistant conductive bus.

12. The process according to claim 10, wherein the fatigue resistant conductive bus is made of a conductive ink comprising carbon.

13. The process according to claim 1 further comprising laminating the dielectric elastomer film between a first and second support sheet.

14. The process according to claim 2, wherein applying an electrically conductive material is selected from the group consisting of sputtering, evaporating, printing, spraying, depositing, chemical vapor deposition, offset printing, screen printing, spray printing, electrostatic spray printing, flexography, pad printing, gravure printing, ink jet printing, curtain coating, extrusion coating, slot-die coating, kiss coating, roller coating, and aerosol jet printing, and/or combinations thereof.

15. The process according to claim 2, wherein the electrically conductive material is selected from the group consisting of gold, silver, copper, carbon, palladium silver, aluminum, conductive inks, conductive polymer and/or combinations thereof.

16. The process according to claim 4, wherein positioning further comprises positioning the support sheet laminated to the dielectric elastomer film in a deposition chamber.

17. The process according to claim 16, wherein applying the force to stretch the film web in the direction that is orthogonal to the plane defined by the web further comprises rotatably contacting a frustoconical projection on a drum with the web.

18. A process for producing a corrugated electrode for use in an electroactive polymer cartridge, the process comprising:
   positioning a laminated web comprising first and second sides, the laminated web further comprising a dielectric elastomer film laminated between first and second support sheets, the first and second support sheets defining areas exposing portions of the dielectric elastomer film;
   applying a first force to stretch the positioned laminated web in a direction that is orthogonal to a plane defined by the laminated web to a first predetermined distance in the direction of the applied first force;
   applying a first electrically conductive material to the first side of the laminated web while the laminated web is in a stretched state; and
   relaxing the laminated web to form a first corrugated electrode on a first side of the dielectric elastomer film portion of the laminated web.

19. The process according to claim 18 further comprising:
   turning over the laminated web;
   positioning the laminated web;
   applying a second force to stretch the positioned laminated web in a direction that is orthogonal to a plane defined by the laminated web to a second predetermined distance in the direction of the applied second force;
   applying a second electrically conductive material to the second side of the laminated web while the laminated web is in a stretched state; and
   relaxing the laminated web to form a second corrugated electrode on a second side of the dielectric elastomer film portion of the laminated web.

20. The process according to claim 18, wherein the first predetermined distance is greater than the second predetermined distance.

21. The process according to claim 18, wherein the first and second electrically conductive materials are similar materials.

22. The process according to claim 18, further comprising stripping a release layer from the first and second sides of the laminated web.

23. The process according to claim 18, further comprising:
- applying a first fatigue resistant conductive bus on the first corrugated electrode;
- applying a second fatigue resistant conductive bus on a second corrugated electrode; and
- applying a first encapsulation layer over the first fatigue resistant conductive bus;
- applying a second encapsulation layer over the second fatigue resistant conductive bus;
- wherein the fatigue resistant conductive bus is made of a conductive ink comprising carbon.

* * * * *